(12) United States Patent
Tran

(10) Patent No.: US 7,393,699 B2
(45) Date of Patent: Jul. 1, 2008

(54) NANO-ELECTRONICS

(76) Inventor: Bao Q. Tran, 6768 Meadow Vista Ct., San Jose, CA (US) 95135

( * ) Notice: Subject to any disclaimer, the term of this patent is extended or adjusted under 35 U.S.C. 154(b) by 262 days.

(21) Appl. No.: 11/451,161

(22) Filed: Jun. 12, 2006

(65) Prior Publication Data

US 2007/0285843 A1 Dec. 13, 2007

(51) Int. Cl.
H01L 21/00 (2006.01)

(52) U.S. Cl. .......................... 438/1; 977/894

(58) Field of Classification Search .................. 438/1; 977/882, 894, 963
See application file for complete search history.

(56) References Cited

U.S. PATENT DOCUMENTS

| | | | |
|---|---|---|---|
| 4,541,908 A | 9/1985 | Niki et al. |
| 4,663,230 A | 5/1987 | Tennent |
| 4,668,932 A | 5/1987 | Drori et al. |
| 5,063,521 A | 11/1991 | Peterson et al. |
| 5,084,365 A | 1/1992 | Gratzel et al. |
| 5,084,667 A | 1/1992 | Drori et al. |
| 5,093,664 A | 3/1992 | Senn et al. |
| 5,109,204 A | 4/1992 | Keefer |
| 5,161,157 A | 11/1992 | Owen et al. |
| 5,165,909 A | 11/1992 | Tennent et al. |
| 5,171,560 A | 12/1992 | Tennent |
| 5,223,409 A | 6/1993 | Ladner et al. |
| 5,296,858 A | 3/1994 | Moyal |
| 5,403,484 A | 4/1995 | Ladner et al. |
| 5,571,698 A | 11/1996 | Ladner et al. |
| 5,581,198 A | 12/1996 | Trimberger |
| 5,766,905 A | 6/1998 | Studier et al. |
| 5,885,808 A | 3/1999 | Spooner et al. |
| 5,946,034 A | 8/1999 | Cortiula |
| 5,977,565 A | 11/1999 | Ishikawa et al. |
| 6,031,711 A | 2/2000 | Tennent et al. |
| 6,099,965 A | 8/2000 | Tennent et al. |
| 6,203,814 B1 | 3/2001 | Fisher et al. |
| 6,261,554 B1 | 7/2001 | Valerio et al. |
| 6,270,369 B1 | 8/2001 | Kato et al. |
| 6,331,768 B1 | 12/2001 | Drori et al. |
| 6,366,318 B1 | 4/2002 | Smith et al. |
| 6,405,160 B1 | 6/2002 | Djaja et al. |
| 6,500,571 B2 | 12/2002 | Liberatore et al. |
| 6,570,523 B1 | 5/2003 | Bacrania et al. |

(Continued)

OTHER PUBLICATIONS

U.S. Appl. No. 10/665,721.

(Continued)

Primary Examiner—Scott B. Geyer
(74) Attorney, Agent, or Firm—Tran & Associates

(57) ABSTRACT

Systems and methods are disclosed to fabricate an electronic device on a substrate by genetically engineering first, second, third, and fourth viruses each having a plurality of selective binding sites; forming first, second, third, and fourth viral biotemplates by immersing the first, second, third, and fourth viruses in one or more solutions with nano materials coupleable to the binding sites of the viruses; self-assembling a gate with the first viral biotemplate having one site attachable to the substrate; self-assembling a source above the gate with the second viral biotemplate; self-assembling a channel with the third viral biotemplate having one site attachable to the second viral biotemplate; and self-assembling a drain with the fourth viral biotemplate having one site attachable to the third viral biotemplate.

20 Claims, 15 Drawing Sheets

| |
|---|
| genetically engineer first, second, third, fourth and fifth viruses each having a plurality of selective binding sites (850) |
| form first, second, third, fourth and fifth viral biotemplates by immersing the first, second, third, fourth and fifth viruses in a solution with nano materials coupleable to the binding sites of the viruses (852) |
| self-assemble a source with the first viral biotemplate having one site attachable to the substrate (854) |
| self-assemble a channel with the second viral biotemplate having one site attachable to the substrate and one site attacheable to the first viral biotemplate (856) |
| self-assemble a drain with the third viral biotemplate having one site attachable to the substrate and one site attacheable to the second viral biotemplate (858) |
| self-assemble an isolation layer above the first, second and third viral biotemplates with the fourth viral biotemplate (860) |
| self-assemble a gate with the fifth viral biotemplate having one site attachable to the isolation layer (862) |

U.S. PATENT DOCUMENTS

| | | |
|---|---|---|
| 6,576,938 B1 | 6/2003 | Hirama et al. |
| 6,605,836 B2 | 8/2003 | Kishi et al. |
| 6,671,166 B1 | 12/2003 | Penneau et al. |
| 6,690,599 B2 | 2/2004 | Hasegawa et al. |
| 6,927,108 B2 | 8/2005 | Weng et al. |
| 2001/0019820 A1 | 9/2001 | Li |
| 2001/0023986 A1 | 9/2001 | Mancevski |
| 2001/0044114 A1 | 11/2001 | Connolly |
| 2002/0027124 A1 | 3/2002 | Bashir et al. |
| 2002/0036452 A1 | 3/2002 | Muroyama et al. |
| 2002/0079802 A1 | 6/2002 | Inoue et al. |
| 2002/0094515 A1 | 7/2002 | Erlach et al. |
| 2002/0096633 A1 | 7/2002 | Gimzewski et al. |
| 2002/0098472 A1 | 7/2002 | Erlach et al. |
| 2002/0114557 A1 | 8/2002 | Zhang et al. |
| 2002/0139961 A1 | 10/2002 | Kinoshita et al. |
| 2002/0150524 A1 | 10/2002 | Smalley et al. |
| 2002/0154535 A1 | 10/2002 | Bocian et al. |
| 2002/0158374 A1 | 10/2002 | Billiet et al. |
| 2002/0163414 A1 | 11/2002 | Mayer et al. |
| 2002/0174660 A1 | 11/2002 | Venkatasubramanian |
| 2002/0182970 A1 | 12/2002 | Liu et al. |
| 2002/0185948 A1 | 12/2002 | Dunfield et al. |
| 2003/0001490 A1 | 1/2003 | Yamamoto et al. |
| 2003/0003300 A1 | 1/2003 | Korgel et al. |
| 2003/0064532 A1 | 4/2003 | Chen |
| 2003/0068900 A1 | 4/2003 | Belcher et al. |
| 2003/0071560 A1 | 4/2003 | Komatsu et al. |
| 2003/0073104 A1 | 4/2003 | Belcher et al. |
| 2003/0081463 A1 | 5/2003 | Bocian et al. |
| 2003/0082444 A1 | 5/2003 | Kuhr et al. |
| 2003/0089899 A1 | 5/2003 | Lieber et al. |
| 2003/0090190 A1 | 5/2003 | Takai et al. |
| 2003/0111670 A1 | 6/2003 | Misra et al. |
| 2003/0113714 A1 | 6/2003 | Belcher et al. |
| 2003/0136943 A1 | 7/2003 | Alivisatos et al. |
| 2003/0138777 A1 | 7/2003 | Evans |
| 2003/0139907 A1 | 7/2003 | McCarthy |
| 2003/0141189 A1 | 7/2003 | Lee et al. |
| 2003/0145779 A1 | 8/2003 | Alivisatos et al. |
| 2003/0146095 A1 | 8/2003 | Edman et al. |
| 2003/0148380 A1 | 8/2003 | Belcher |
| 2003/0151344 A1 | 8/2003 | Cheng et al. |
| 2003/0169618 A1 | 9/2003 | Lindsey et al. |
| 2003/0171257 A1 | 9/2003 | Stirbl et al. |
| 2003/0174384 A1 | 9/2003 | Halas et al. |
| 2003/0177450 A1 | 9/2003 | Nugent |
| 2003/0178617 A1 | 9/2003 | Appenzeller et al. |
| 2003/0180472 A1 | 9/2003 | Zhou et al. |
| 2003/0186522 A1 | 10/2003 | Duan et al. |
| 2003/0189402 A1 | 10/2003 | Gaudiana et al. |
| 2003/0200521 A1 | 10/2003 | DeHon et al. |
| 2003/0203139 A1 | 10/2003 | Ren et al. |
| 2003/0207978 A1 | 11/2003 | Yadav et al. |
| 2003/0209810 A1 | 11/2003 | Moon et al. |
| 2003/0215903 A1 | 11/2003 | Hyman et al. |
| 2003/0230746 A1 | 12/2003 | Stasiak |
| 2004/0002064 A1 | 1/2004 | Fang et al. |
| 2004/0007956 A1 | 1/2004 | Chen |
| 2004/0007962 A1 | 1/2004 | Chen |
| 2004/0007963 A1 | 1/2004 | Chen |
| 2004/0007964 A1 | 1/2004 | Chen |
| 2004/0007966 A1 | 1/2004 | Chen |
| 2004/0007967 A1 | 1/2004 | Chen |
| 2004/0013982 A1 | 1/2004 | Jacobson et al. |
| 2004/0016318 A1 | 1/2004 | Angeliu |
| 2004/0029706 A1 | 2/2004 | Barrera et al. |
| 2004/0036400 A1 | 2/2004 | Simon et al. |
| 2004/0036403 A1 | 2/2004 | Ono et al. |
| 2004/0038614 A1 | 2/2004 | Chang et al. |
| 2004/0066132 A1 | 4/2004 | Cho et al. |
| 2004/0070326 A1 | 4/2004 | Mao et al. |
| 2004/0075464 A1 | 4/2004 | Samuelson et al. |
| 2004/0104668 A1 | 6/2004 | Lee et al. |
| 2004/0108515 A1 | 6/2004 | Muroyama et al. |
| 2004/0127640 A1 | 7/2004 | Belcher et al. |
| 2004/0130510 A1 | 7/2004 | Konishi et al. |
| 2004/0134429 A1 | 7/2004 | Yamanaka et al. |
| 2004/0135493 A1 | 7/2004 | Park et al. |
| 2004/0150311 A1 | 8/2004 | Jin |
| 2004/0155927 A1 | 8/2004 | Nakao et al. |
| 2004/0169151 A1 | 9/2004 | Yagi et al. |
| 2004/0171139 A1 | 9/2004 | Belcher et al. |
| 2004/0189183 A1 | 9/2004 | Hu et al. |
| 2004/0191698 A1 | 9/2004 | Yagi et al. |
| 2004/0192152 A1 | 9/2004 | Liu et al. |
| 2004/0192153 A1 | 9/2004 | Liu et al. |
| 2004/0195957 A1 | 10/2004 | Hu et al. |
| 2005/0067935 A1 | 3/2005 | Lee et al. |
| 2005/0067938 A1 | 3/2005 | Sheu et al. |
| 2005/0088072 A1 | 4/2005 | Yang et al. |
| 2005/0090176 A1 | 4/2005 | Dean et al. |
| 2005/0093424 A1 | 5/2005 | Moon |
| 2005/0099112 A1 | 5/2005 | Chiou et al. |
| 2005/0110392 A1 | 5/2005 | Moon |
| 2005/0110393 A1 | 5/2005 | Han et al. |
| 2005/0116612 A1 | 6/2005 | Oh |
| 2005/0136787 A1 | 6/2005 | Lee et al. |
| 2005/0145803 A1 | 7/2005 | Hakey et al. |
| 2005/0168898 A1 | 8/2005 | Wo et al. |
| 2005/0170336 A1 | 8/2005 | Belcher et al. |
| 2005/0179396 A1 | 8/2005 | Moon |
| 2005/0184642 A1 | 8/2005 | Oh et al. |
| 2005/0184644 A1 | 8/2005 | Moon |
| 2005/0190435 A1 | 9/2005 | Shafer et al. |
| 2005/0194880 A1 | 9/2005 | Moon |
| 2005/0194886 A1 | 9/2005 | Hsiao et al. |
| 2005/0194911 A1 | 9/2005 | Moon |
| 2005/0197032 A1 | 9/2005 | Lee et al. |
| 2005/0221083 A1 * | 10/2005 | Belcher et al. .............. 428/364 |
| 2005/0231088 A1 | 10/2005 | Chen et al. |
| 2005/0231089 A1 | 10/2005 | Chen et al. |
| 2005/0231090 A1 | 10/2005 | Chen et al. |
| 2005/0231098 A1 | 10/2005 | Chen et al. |
| 2005/0231099 A1 | 10/2005 | Hsu et al. |
| 2005/0233670 A1 | 10/2005 | Lee et al. |
| 2005/0258729 A1 | 11/2005 | Han et al. |
| 2005/0258738 A1 | 11/2005 | Oh |
| 2005/0258739 A1 | 11/2005 | Park et al. |
| 2005/0264170 A1 | 12/2005 | Oh |
| 2005/0269286 A1 | 12/2005 | Sharma et al. |
| 2005/0275331 A1 | 12/2005 | Takai et al. |
| 2005/0280351 A1 | 12/2005 | Song et al. |
| 2005/0287896 A1 | 12/2005 | Wei et al. |
| 2006/0012885 A1 | 1/2006 | Beder et al. |
| 2006/0052947 A1 * | 3/2006 | Hu .............................. 702/20 |
| 2006/0057388 A1 | 3/2006 | Jin et al. |
| 2006/0091780 A1 | 5/2006 | Minami |
| 2006/0092533 A1 | 5/2006 | Sogard |

OTHER PUBLICATIONS

DeHon, Andre, "Design of Programmable Interconnect for Sublithographic Programmable Logic Arrays", FPGA'05, Feb. 20-22, 2005, Monterrey California.

* cited by examiner

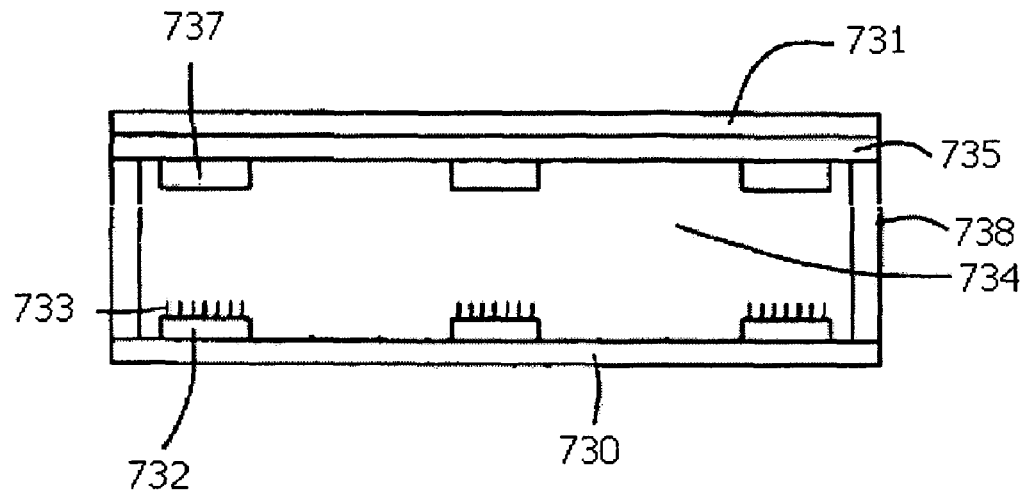

FIG. 11

| Genetically engineer a virus having a plurality of selective binding or nucleating sites (750) |
|---|
| Use the virus as biotemplate to self-assemble a chain of material with a total chain length that is a multiple of the viral length (752) |
| Bind one genetically engineered end of the viral chain to a preselected binding site to form an electronic structure or component (754) |
| Optionally open one end of the electronic structure or component by cutting one end of the viral chain (756). |

FIG. 12

| |
|---|
| genetically engineer first, second, third, fourth and fifth viruses each having a plurality of selective binding sites (850) |
| form first, second, third, fourth and fifth viral biotemplates by immersing the first, second, third, fourth and fifth viruses in a solution with nano materials coupleable to the binding sites of the viruses (852) |
| self-assemble a source with the first viral biotemplate having one site attachable to the substrate (854) |
| self-assemble a channel with the second viral biotemplate having one site attachable to the substrate and one site attacheable to the first viral biotemplate (856) |
| self-assemble a drain with the third viral biotemplate having one site attachable to the substrate and one site attacheable to the second viral biotemplate (858) |
| self-assemble an isolation layer above the first, second and third viral biotemplates with the fourth viral biotemplate (860) |
| self-assemble a gate with the fifth viral biotemplate having one site attachable to the isolation layer (862) |

FIG. 14A

| |
|---|
| genetically engineer first, second, third, fourth and fifth viruses each having a plurality of selective binding sites (870); |
| form first, second, third, fourth and fifth viral biotemplates by immersing the first, second, third, fourth and fifth viruses in a solution with nano materials coupleable to the binding sites of the viruses (872); |
| self-assemble a gate with the first viral biotemplate having one site attachable to the substrate (874) |
| self-assemble an isolation layer above the first viral biotemplate with the second viral biotemplate (876) |
| self-assemble a source with the third viral biotemplate having one site attachable to the isolation layer (878) |
| self-assemble a channel with the fourth viral biotemplate having one site attachable to the isolation layer and one site attachable to the third viral biotemplate (880) |
| self-assemble a drain with the fifth viral biotemplate having one site attachable to the isolation layer and one site attacheable to the fourth viral biotemplate (882) |

FIG. 14B

| |
|---|
| genetically engineer first, second, third, and fourth viruses each having a plurality of selective binding sites (890); |
| form first, second, third, and fourth viral biotemplates by immersing the first, second, third, and fourth viruses in a solution with nano materials coupleable to the binding sites of the viruses (892); |
| self-assemble a gate with the first viral biotemplate having one site attachable to the substrate (894) |
| self-assemble a source above the gate with the second viral biotemplate (896) |
| self-assemble a channel with the third viral biotemplate having one site attachable to the second viral biotemplate (898) |
| self-assemble a drain with the fourth viral biotemplate having one site attachable to the third viral biotemplate (899) |

NANO-ELECTRONICS

This application claims priority to Provisional Application 60/560,053 filed Apr. 6, 2004, the content of which is incorporated by reference.

BACKGROUND

The present invention relates to arrays of NANO-electronic devices.

The success of the PC, networking, and communications-product markets has been driven largely by Moore's Law, which says that IC density doubles every 18 months. Experts predict that CMOS scaling will continue to follow Moore's Law for at least another decade, but potential bottlenecks could derail market success if not solved by new design or device technology. One of these bottlenecks is integrating precision analog and wideband RF circuitry in standard digital CMOS.

Applying Moore's Law to mixed-signal (analog and digital) chips is a significant challenge. Higher transistor density and lower silicon cost allow more complex digital circuitry, but most wireless or wireline communications products require integrating RF, analog, and memory with the digital logic. Advancements in submicron CMOS processing greatly benefit digital logic and memory, but result in poor analog and RF performance. Transistor matching, noise, resistors, capacitors, and inductors drive the density of analog circuits, and these parameters do not necessarily benefit from transistor scaling.

To compound the problem, digital-circuit design continues to benefit from advances in logic synthesis, accelerating the time-to-market of digital products. Analog circuit design has not historically benefited significantly from CAD-tool advances, and remains a hand-crafted art. Consequently, analog circuits will be a limiting factor for mixed-signal SoC, both in terms of the increasingly larger percentage of the die these circuits occupy, and in terms of their design time.

SUMMARY

Systems and methods are disclosed to process a semiconductor substrate by fabricating a first layer on the substrate using macroscale semiconductor fabrication techniques; fabricating a second layer above the first layer having one or more NANO-bonding areas; self-assemblying one or more NANO-elements; and bonding the NANO-elements to the NANO-bonding areas.

In one aspect, the present application discloses a hybrid electronic device, comprising: a substrate; a first layer fabricated using semiconductor fabrication techniques; a second layer formed above the first layer, the second layer having one or more NANO-bonding areas; one or more NANO-elements self-assembled to the second layer molecular bonding areas.

In another aspect, the present application discloses a reconfigurable electronic device, comprising: a substrate; a first layer fabricated using semiconductor fabrication techniques; a second layer formed above the first layer, the second layer having one or more NANO-bonding areas; one or more reconfigurable NANO-elements self-assembled to the second layer molecular bonding areas.

In another aspect, the present application discloses a memory device, comprising an array of memory cells disposed in rows and columns and constructed over a substrate, each memory cell comprising a first signal electrode, a second signal electrode, and a NANO-layer disposed in the intersecting region between the first signal electrode and the second signal electrode; a plurality of word lines each connecting the first signal electrodes of a row of memory cells; and a plurality of bit lines each connecting the second signal electrodes of a column of memory cells.

In another aspect, the present application discloses a data storage device, comprising a platter having a layer of NANO-material; and a head capable of reading or writing to the NANO-material in the layer of NANO material.

In still another aspect, the present application discloses an optical data storage device, comprising a first light source; and a substrate disposed with a layer of NANO particles, wherein the energy structure of the NANO particles is changed after the NANO particles are illuminated by the light source.

In yet another aspect, the present application discloses an optical interconnection system, comprising a substrate; an input optical signal; an output optical signal; and an optical circuit disposed over the substrate, wherein the optical circuit is formed by NANO elements in a self-assemble process.

In another aspect, the present application relates to a photon sensing device, comprising: a semiconductor layer comprising charge readout circuit; and a photon sensitive layer disposed over the semiconductor layer comprising one or more of photon sensing elements formed by NANO elements, such photo sensitive elements being capable of converting photons to electric charges, wherein photon induced charges are adapted to be transferred to the readout circuit in the semiconductor layer.

In still another aspect, the present application relates to a photon sensing device comprising: a semiconductor layer comprising a plurality of transistors; and a photon sensitive layer disposed over the semiconductor layer comprising one or more of photon sensing elements formed by NANO elements, such photo sensitive elements being capable of converting photons to electric charges, wherein each photo sensitive element is electrically connected with one or more transistors in the semiconductor layer.

In still another aspect, the present application relates to a NANO display device, comprising an array of light-emitting cells disposed in rows and columns and constructed over a substrate, each light emitting cell comprising a first electrode, a second electrode, and a light-emitting NANO material disposed in the intersecting region between the first electrode and the second electrode, wherein the light-emitting NANO material is capable of emitting light when a voltage is applied between the first electrode and the second electrode.

In another aspect, the present application provides a wireless communication device, comprising: a) a NANO antenna having an NANO element providing electrical resonance to transmit and receive wireless signals; b) a transceivers coupled to the NANO antenna; and c) a processor core coupled to the NANO antenna and the transceivers for controlling the NANO antenna and processing the wireless signals transmitted and received.

In another aspect, the present application provides a package for integrated circuit, comprising a chip having a plurality of chip pads adapted to receive the variety of signals from or to output the same to an external circuit; a lead frame having a plurality of contact points each corresponding to a chip pad; and bonding wires electrically connecting the chip pads and the respective contact points on the lead frame, wherein the bonding wires comprise a nano material.

Advantages may include one or more of the following. The system is compact, power efficient, and dense. The molecular electronics in the above system extend the miniaturization that has driven the density and speed advantages of the integrated circuit in accordance with Moore's Law.

The present disclosure will show in detail NOR arrays. Collections of NOR gates are universal, so this substrate is sufficient to perform any computation. Upon reading of the present disclosure, the person skilled in the art will be able to realize arrays based on a different kind of logic, e.g. NAND logic.

An advantage of the present invention, is it provides a universal, programmable structure using conventional semiconductor elements and NANO elements which integrates device from nanoscale to microscale. The disclosed architecture also supports micro-to nanoscale interfacing for communication with conventional integrated circuits.

A further advantage of the present invention is that the architecture disclosed logic functionality, minimalism, defect tolerance, and compatibility with emerging, bottom-up, nanoscale fabrication techniques.

An additional advantage of the present invention is that the integrated NANO-semiconductor architecture can utilize a wide range of NANO elements such as NANO particles, NANO tubes, NANO wires, NANO bridges, etc. which is greatly beneficial to system optimization and minimization.

Another advantage of the present invention is that the integrated NANO-semiconductor architecture provides conversion and processing of electronic, optical, wireless signals, as well as data memory, communication, photo and chemical sensing, power generation, and display capabilities. The invention architecture is ideally suited for applications having a plurality of functionalities provided by system-on-chip or system in one module. Device cost and sizes can therefore be significantly reduced.

BRIEF DESCRIPTION OF THE DRAWINGS

FIG. 11 shows an exemplary field emission device.

FIG. 12 shows an exemplary process to make a nano electronic structure.

FIGS. 14A-14C show exemplary processes to fabricate viral templated transistors.

DESCRIPTION

Programmable Analog NANO-Array and NANO-Cells

Figure 1:
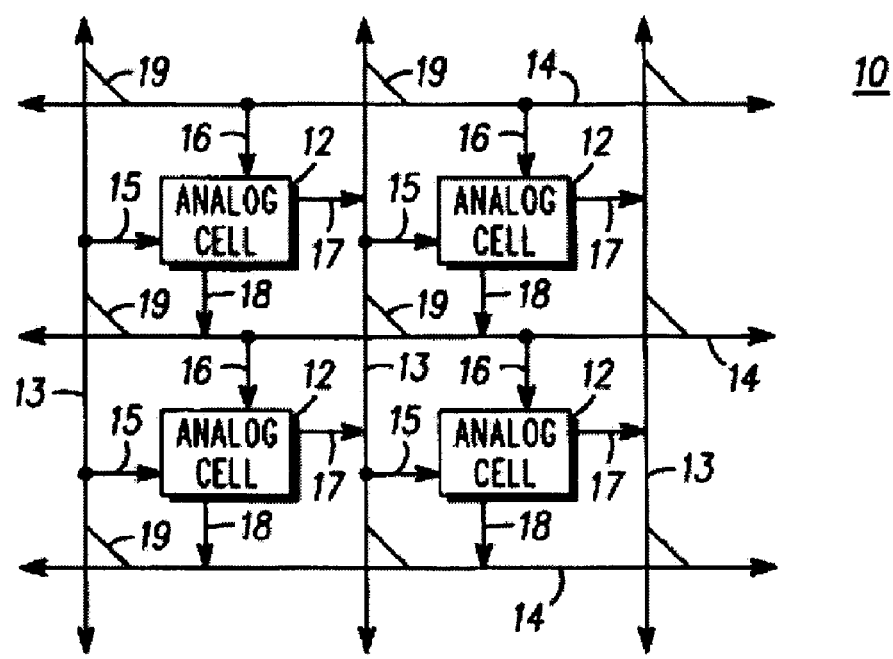
FIG. 1 is a block diagram of a programmable analog NANO-array in accordance with the present invention.

FIG. 1 is a block diagram of a programmable array using NANO-analog electronics in an integrated circuit configuration. NANO-analog array 10 includes a plurality of programmable analog cells 12 arranged along a plurality of interconnect channels that form a switching network which includes bus lines 13 and 14 for routing analog signals. Input and output signals are transferred between analog cells 12 and buses 13 and 14 by means of analog switching devices such as transmission gates through which analog signals can be transferred with little or no distortion. Control over the switching devices is provided by digital signals that may be stored in a memory such as random access memory (RAM) or read-only memory included in the cell. Alternatively, a centralized memory array can be used to control the switching devices in all of the analog cells 12. As a further alternative, external memory can be used if provision is made for routing the binary control signals to individual analog cells 12. As yet a further alternative, control over the switching devices may be directly provided by other digital circuitry instead of a memory array. Signal routing between bus 13 and bus 14 is provided by switching devices 19.

Figure 2:
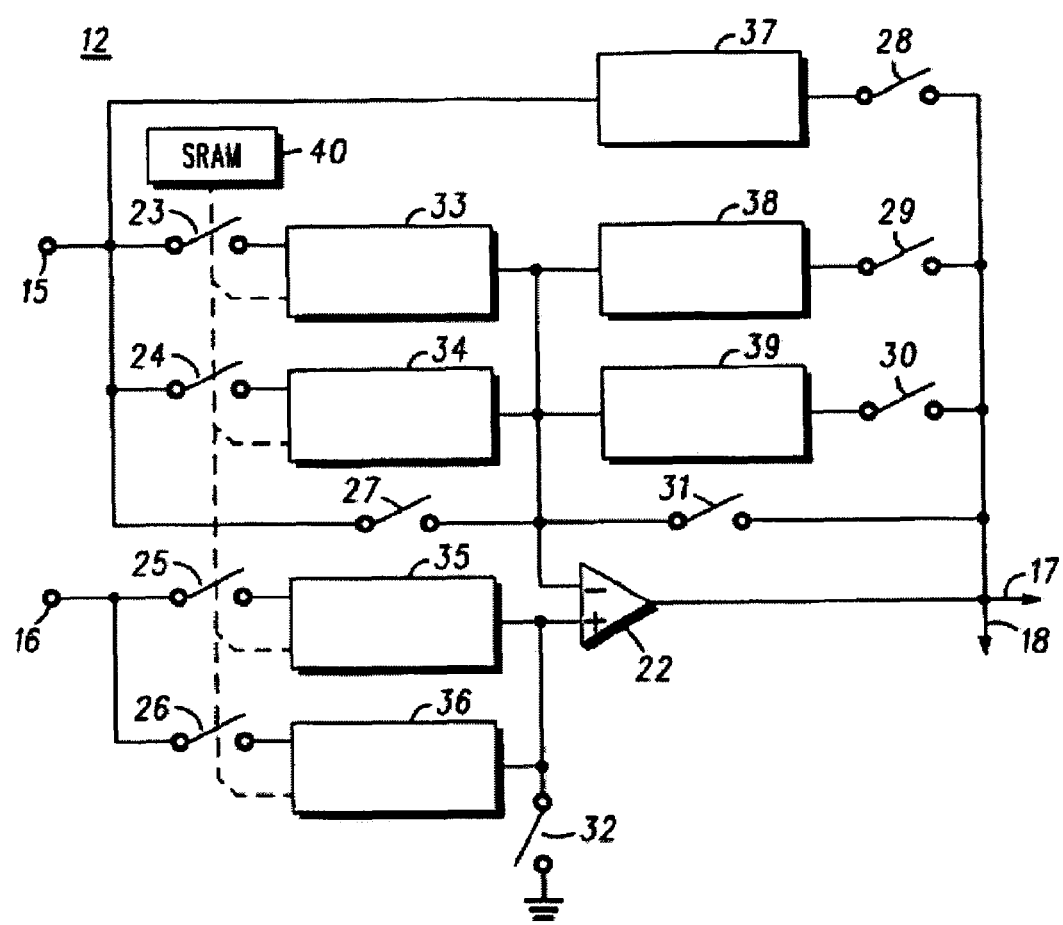
FIG. 2 is a schematic diagram of a first embodiment of a programmable NANO-cell in accordance with the present invention.

FIG. 2 is a schematic diagram of a programmable analog cell 12 including an active circuit 22, switches 23-32, programmable NANO-elements 33-39, and a static random access memory (SRAM) 40. Input signals are received on input terminals 15 and 16 and output signals are produced on output terminals 17 and 18. Output terminals 17 and 18 are shown as connected together to drive horizontal and vertical conductors 13 and 14. In an alternative embodiment, output terminals 17 and 18 could be isolated such that active circuit 22 drives output terminal 17 and another active circuit included in programmable analog cell 12 drives output terminal 18.

Fabrication of NANO Electronic Components and Systems

As described below, the NANO-elements can be formed last in the fabrication sequence in one embodiment. Conventional semiconductor structures are formed as is conventional, which for example includes semiconductor devices produced by photolithography or E-beam lithography. During the next to the last conventional step, gold electrodes are formed. Then a resist layer is formed over the last layer, and selective etching is performed to expose the gold electrodes. A solution containing the NANO-elements are spin-coated on top, where the NANO-elements self-assemble to form one or more devices such as resistors, capacitors, inductors, antennas, emitters and sensors, among others. Other coating techniques compatible with the present invention include hopper coating, curtain coating. The NANO-elements bond to preselected spots on the gold electrodes and self-assemble to form a regular array of resistors, capacitors, inductors, acoustic emitters, acoustic sensors, light emitters, light sensors, among others. In one embodiment, the NANO-elements do not need patterning. In another embodiment, patterning of the NANO-elements is accomplished by any of the generally available photolithographic techniques utilized in semiconductor processing. However, depending on the particular material chosen, other techniques such as laser ablation or inkjet deposition or electrostatic deposition may also be utilized to pattern the NANO-elements. In particular nanoimprint lithography can be used to pattern the NANO-elements.

In another embodiment, the substrate may be formed from silicon, gallium arsenide, indium phosphide, and silicon carbide to name a few. Active devices will be formed utilizing conventional semiconductor processing equipment. Other substrate materials can also be utilized, depending on the particular application in which the array will be used. For example various glasses, aluminum oxide and other inorganic dielectrics can be utilized. In addition, metals such as aluminum and tantalum that electrochemically form oxides, such as anodized aluminum or tantalum, can be utilized. Those applications utilizing non-semiconductor substrates, active devices can also be formed on these materials utilizing techniques such as amorphous silicon or polysilicon thin film transistor (TFT) processes or processes used to produce organic or polymer based active devices. Accordingly, the present system is not intended to be limited to those devices fabricated in silicon semiconductor materials, but will include those devices fabricated in one or more of the available semiconductor materials and technologies known in the art.

The process of creating the first layer of electrical conductors may consist of sputter deposition, electron beam evaporation, thermal evaporation, or chemical vapor deposition of either metals or alloys and will depend on the particular material chosen for the electrical conductors. Conductive materials such as polyaniline, polypyrrole, pentacene, thiophene compounds, or conductive inks, may utilize any of the techniques used to create thin organic films. For example, screen printing, spin coating, dip coating, spray coating, ink jet deposition and in some cases, as with PEDOT, thermal evaporation are techniques that may be used.

Depending on the particular memory device being fabricated, the electrical contacts may be created either on a substrate or directly on the semiconducting polymer film. Patterning of the electrical conductors is accomplished by any of the generally available photolithographic techniques utilized in semiconductor processing. However, depending on the particular material chosen, other techniques such as laser ablation or inkjet deposition may also be utilized. In particular one my utilized nanoimprint lithography or techniques for forming nanowires. For additional information on nanoimprint lithography see for example, U.S. Application No. 20030230746, the content of which is incorporated by reference. Combinations of different conductive materials may also be utilized that might result in very different processes being utilized. For example it may be desirable to utilize PEDOT as the material for the lower electrical traces and indium tin oxide for the upper electrical traces if erasure via light is desired. Another embodiment may use a typical metal such as tantalum, tungsten, or even highly doped polysilicon for electrical conductors deposited on the substrate and an organic conductor such as PEDOT for electrical conductors deposited on the semiconducting polymer film. The process of creating a third layer of electrical conductors on a second semiconducting polymer film, for the applications utilizing such a layer, can be the same or similar to that used for the first layer, depending on whether the electrical conductor is the same as that used for the first layer electrical conductors. The process of creating a semiconducting polymer film will depend on the particular binder and organic dopant chosen. The particular binder and organic dopant chosen will depend, for example, on the particular electronic properties desired, the environment in which the device will be used, and whether a thin dielectric film will be utilized. Depending on the particular binder chosen the appropriate solvents are utilized that provide sufficient solubility for both the binder and the organic dopant as well as providing appropriate viscosity for the particular coating or casting process chosen. An exemplary process for creating a semiconducting polymer layer uses HPLC grade tetrahydrofuran as a solvent to dissolve the binder bisphenol-A-polycarbonate and a mono-substituted diphenylhydrazone compound (DPH) in appropriate concentrations to obtain the desired electrical properties. If a substrate is utilized, the composition and properties of the substrate are also taken into consideration, in order to obtain good adhesion between the substrate and the semiconductor polymer layer, as well as the electrical conductors and the semiconductor polymer layer. Adhesion promoters or surface modification may also be utilized. In addition, a planarizing layer may also be utilized, for example, when electrical conductors are formed on rather than in the substrate. The process of creating a multilayer semiconductor polymer film, for those applications utilizing such a structure, can be the same or similar as the process used to create the first layer, depending on whether the binder or organic dopant is the same as that used for the first layer. The process of forming a dielectric thin film, will depend on the particular material chosen, and may consist of, for example, sputter deposition, chemical vapor deposition, spin coating, or electrochemical oxidation. For example, tantalum electrical conductors may be deposited using conventional sputtering or electron beam deposition techniques. After the tantalum is deposited a thin tantalum oxide layer may be formed electrochemically. This process may be performed prior to or after photolithographic processing to define the electrical conductors. Another embodiment may utilized a thin silicon oxide layer deposited on the electrical conductors or on the semiconducting polymer film depending on which electrical conductor is chosen to have the thin dielectric film. A thin silicon oxide film may be deposited by any of a wide range of techniques, such as sputter deposition, chemical vapor deposition, or spin coating of a spin on glass material, to name a few. Still another embodiment may utilize a thin non-conducting polymer layer, such as the binder polymer, deposited on the appropriate electrical conductors. Other embodiments may utilize self assembled monolayers or silane coupling agents to produce a thin dielectric film. The process of creating a second or multilayer dielectric thin film, for those applications utilizing such a structure, can be the same or similar as the process used to create the first layer, depending on whether the thin dielectric film is the same as that used for the first layer. The process of creating the second layer of electrical conductors will depend, for example, on the particular binder and organic materials chosen as well as the presence or absence of the thin dielectric film and its chemical composition. For example, a polyimide binder will typically sustain higher temperatures than a polyethylene binder will. Thus, thermal or electron beam deposition of tungsten or platinum electrical conductors may be used on a polyimide binder whereas chemical vapor deposition, spin coating or thermal evaporation of an organic conductor may be desirable for a polyethylene binder. The particular deposition process utilized will also depend on the degree of defects generated in either the thin dielectric film if used or the semiconducting polymer film. In addition, the particular process as well as the process parameters will also be chosen to optimize adhesion between the film or films to which the electrical conductor material is deposited on. The process of creating a fourth layer of electrical conductors, for those applications utilizing such a structure, can be the same or similar as the processes used to create the first through third layers, depending on whether the fourth layer is the same as that used for the first layer. A passivation layer can be used to protect the semiconducting polymer film from damage and environmental degradation when appropriate. For example, a passivation layer providing a barrier to oxygen permeation can be desirable when utilizing a memory device having an acceptor organic dopant or functional group because oxygen is a potential electron trap. In addition, depending on the particular organic dopant and electrical conductors utilized it may also be desirable to utilize a passivation layer providing a moisture barrier to reduce corrosion. Further depending on whether active devices are present an electrostatically dissipating or shielding film may also be desirable.

Due to the NANO-structure, the absolute capacitance values of programmable NANO-elements 33-39 are well controlled using self-assembly processes. Additional degree of matching accuracy can be attained if programmable elements 33-39 are carefully laid out on the die. Such matching accuracy results in a given binary control chemical structure producing substantially equal capacitances when applied to each of the programmable elements 33-39. For this reason, operations of active circuit 22 can be controlled using ratios of programmable resistance, capacitance, or inductance whenever possible. For example, in one embodiment where the NANO-elements 33-39 are capacitors, if it is desired to operate amplifier 22 with a closed loop gain of 35/32, a binary control chemical structure "35" is applied to control programmable capacitor 39 and a binary control chemical structure "32" is applied to control programmable capacitor 33. The resulting capacitance ratio is 35/32.

Active circuit 22 is shown as an amplifier having inverting and non-inverting inputs and an output. Analog cell 12 can also include comparators and other types of active circuits, and can include more than one active circuits of the same type. For example, a single cell can incorporate several amplifiers controlled by programmable NANO-elements 33-39 that act as capacitors to operate as an active filter. Active circuit 22 typically includes an output buffer stage (not shown) for driving the capacitances and the load capacitances of terminals 17 and 18.

SRAM 40 comprises memory storage for controlling the operation of switches 23-32 and switches included in programmable capacitors 33-39. To simplify the figure, such control is indicated by the dotted line from SRAM 40 to switches 23-26 and programmable capacitors 33-36. Switches 23-26 and programmable capacitors 33-36 can alternatively be controlled by other types of memory, such as read only memory, or with combinational logic.

It should be noted that programmable analog cell 12 can alternatively be implemented with programmable NANO-elements that include passive elements other than switchable capacitors, such as programmable NANO-resistors or programmable NANO-inductors.

Dynamically Reconfigurable Logic-Analog Devices

In one embodiment, a field programmable array includes a matrix of configurable logic and/or analog blocks embedded in a programmable routing mesh. Each configurable logic/analog block (CLAB) can provide one or more of the functions provided by an AND gate, flip-flop, latch, inverter, NOR gate, exclusive OR gate, resistor, capacitor, inductor, LED, light sensor, as well as combinations of these functions to form more complex functions. The particular function performed by the CLAB is determined by control signals that are applied to the CLAB from a control logic circuit. The control logic circuit is formed integrally with, and as part of, the integrated circuit on which the CLAB is formed. If desired, control information can be stored and/or generated outside of this integrated circuit and transmitted to the CLAB. The actual set of control bits provided to each CLAB on the integrated circuit depends upon the functions that the CLAB and, more globally, the integrated circuit are to perform. Each CLAB typically has a plurality of input and output pins, and a set of programmable interconnect points (PIPs) for each input and output pin. The general interconnect structure of the field programmable array includes a plurality of interconnect segments and a plurality of PIPs, wherein each interconnect segment is connected to one or more other interconnect segments by programing an associated PIP. A field programmable array also includes an access PIP that either connects an interconnect segment to an input pin or an output pin of the CLAB. Because the PIPs are programmable, any given output pin of a CLAB is connectable to any given input pin of any other desired CLB. Thus, a specific field programmable array configuration having a desired function is created by selected generation of control signals to configure the specific function of each CLAB, together with selected generation of control signals to configure the various PIPs that interconnect the CLABs. Each PIP typically includes a switch such as a single pass transistor. The state of conduction, i.e. whether the switch is opened or closed, is controlled by application of the control signals discussed above to a transistor control terminal, e.g. a gate. The state of the control signal stored in a latch determines whether a pass transistor (PIP) is turned on or off, thereby opening or closing a path in the field programanble interconnect, as described in U.S. Pat. No. 5,581,198, the contents of which is incorporated by reference. In various embodiments, single molecule magnet (SMM) cells or single molecule optical storage cells as described in this application are used to implement PIPs to increase number of PIPs that can be fit onto an integrated circuit. In one embodiment, the SMMs replace RAMs coupled to switches or pass transistors as described in the '198 patent. In another embodiment, the SMMs operate both as storage and switch, namely that as programmed, the SMMs are positioned in predetermined positions that link various interconnected segments to program the field programmable array. In yet another embodiment, the PIP can be a nanobridge. The nanobridge includes a thin layer of copper sulfide that separates a copper electrode from a titanium electrode. The copper whisker is grown and dissolved across a metal-copper sulphide-metal sandwich. When a sufficient voltage is applied, copper ions migrate up through the copper sulfide dielectric, forming a nanoscale whisker that eventually connects the two electrodes part of the interconnect structure described above. Applying a programming voltage to the nanobridge structure causes a low-resistance conduction path to form through a dielectric material, shorting together two electrodes. Applying a reverse bias causes the ions to migrate away from the titanium, in effect taking down the bridge. In one embodiment, the nano-bridge is used as a dynamically reconfigurable device where programming voltages are used to establish links between elements of the reconfigurable device. Alternatively, a solid, silver atomic-laden chalcogenide electrolyte can be used as the sandwiched layer with silver being deposited on the electrode to form the bridge when in the on-state.

Alternatively, in place of SMMs, electric field activated switches can be used. For example, U.S. Patent Application 20020114557 provides a molecular system for nanometer-scale reversible electronic and optical switches, specifically, electric field-activated molecular switches that have an electric field induced band gap change that occurs via a molecular conformation change or a tautomerization. Changing of extended conjugation via chemical bonding change to change the band gap is accomplished by providing the molecular system with one rotating portion (rotor) and two or more stationary portions (stators), between which the rotor is attached. The molecular system of the present invention has three branches (first, second, and third branches) with one end of each branch connected to a junction unit to form a "Y" configuration. The first and second branches are on one side of the junction unit and the third branch is on the opposite side of the junction unit. The first branch contains a first stator unit in its backbone, the junction unit comprises a second stator unit, and the first branch further contains a rotor unit in its backbone between the first stator unit and the second stator unit. The second branch includes an insulating supporting group in its backbone for providing a length of the second branch substantially equal to that of the first branch, wherein the rotor unit rotates between two states as a function of an externally-applied field. In other embodiments, a molecule called a rotaxane or a catenane trapped between two metal electrodes can be switched from an ON state to an OFF state by the application of a positive bias across the molecule. The ON and OFF states differed in resistivity by about a factor of 100 and 5, respectively, for the rotaxane and catenane.

In one embodiment, the nano-elements include nanobridge. The nanobridge includes a thin layer of copper sulfide that separates a copper electrode from a titanium electrode. The copper whisker is grown and dissolved across a metal-copper sulphide-metal sandwich. When a sufficient voltage is applied, copper ions migrate up through the copper sulfide dielectric, forming a nanoscale whisker that eventually connects the two electrodes. Applying a programming voltage between the two electrodes in the nanobridge structure causes a low-resistance conduction path to form through a dielectric material, shorting together two electrodes. Applying a reverse bias voltage between the two electrodes causes the ions to migrate away from the titanium, in effect taking down the bridge, that is, the configuration of the nanobridge structure is removed. In one embodiment, the nano-bridge is used as a dynamically reconfigurable device where programming voltages are used to establish links between elements of the reconfigurable device. Applications include Field Programmable Gate Array (FPGA). The semiconductor elements in the first layer or the spin-coated NANO-elements in the second layer form a Field Programmable Gate Array. At least one of the semiconductor elements in the first layer or the NANO-elements are reconfigurable.

Alternatively, a solid, silver atomic-laden chalcogenide electrolyte can be used as the sandwiched layer with silver being deposited on the electrode to form the bridge when in the on-state.

Figure 3:
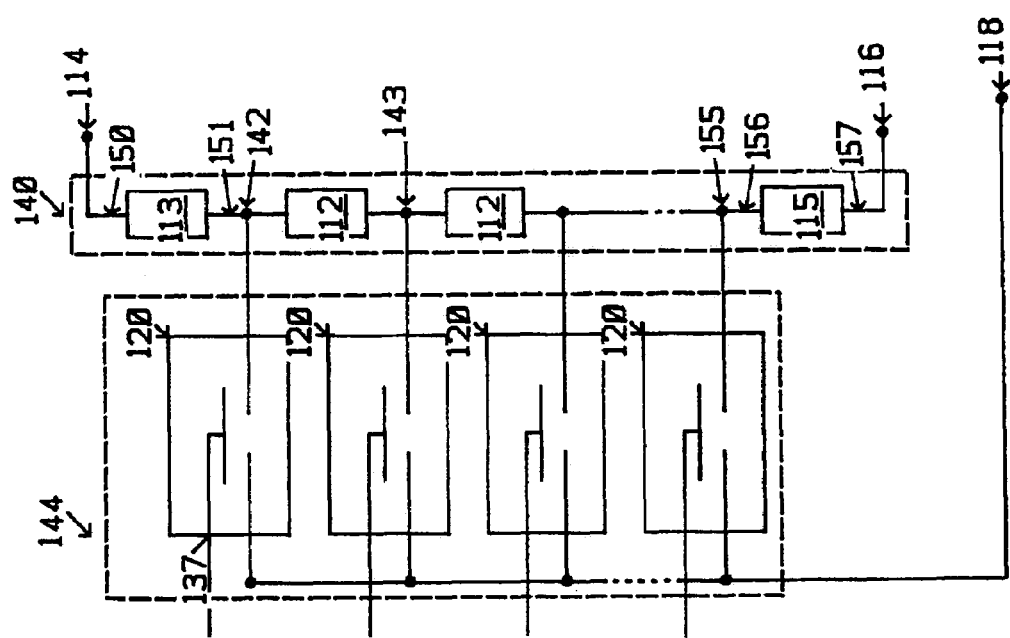
FIG. 3 is a schematic diagram of a second embodiment of a programmable NANO-cell in accordance with the present invention.

FIG. 3 shows another embodiment having a series chain of molecular or NANO-elements 140 and a means for accessing the chain. In the embodiment shown in FIG. 3, the NANO-elements 140 are resistors. The series chain 140 has a plurality of two terminal molecular elements connected in series. The series chain 140 has a first element 113, a last element 115, and one or more intermediate molecular elements 112. Each of the intermediate molecular elements 112 is connected to the molecular element adjacent to it at a node, of which node 143 is typical. One terminal 150 of the first molecular element is connected to a first terminal 114. The other terminal 151 of the first molecular element 113 is connected to the first intermediate molecular element at node 142. Similarly, the last molecular element 115 has one of its terminals 156 connected to the adjacent intermediate molecular element at node 155. The other terminal 157 of the last element 115 is connected by the accessing means to a second terminal 116. At least one of the terminals 150 and 157 is accessible to an external circuit connected to the apparatus of the present invention. The accessing means connects a selected one of the nodes to a third terminal 118.

In one embodiment, the NANO-elements are resistors. Other embodiments, however, in which the NANO-elements are capacitors, inductors, or a combination of one or more of these three types of molecular elements or NANO-elements will be obvious to those skilled in the art. In one version, each of the molecular elements provides the same impedance (for the resistor embodiment), capacitance (for the capacitor embodiment), or inductance (for the inductor embodiment). Embodiments in which the molecular elements are of different values will also be obvious to those skilled in the art.

In the resistor embodiment, each element in the series chain 140 has a series combination of two resistive elements. In one embodiment, the first such element is chosen to have a positive temperature coefficient, and the second such element is chosen to have a negative temperature coefficient. The temperature coefficients in question are selected such that the series or parallel combination of the two elements is a resistive element having an essentially zero temperature coefficient.

A switch 144 is provided for connecting a selected node to the terminal 118. The switch 144 in turn includes a selector (not shown) to select which node is to be connected, and a memory device (not shown) for storing the identity of the selected node connected to the third terminal 118 and for causing the node to be reconnected to the third terminal 118 when power is reapplied or restored to the apparatus.

The switch 144 has a plurality of electrically controllable switches, one tied to each node in the chain 140 of which switch 120 is typical. The switch 120 can be a transistor fabricated in accordance with semiconductor technique or a NANO-transistor as discussed in this case. One terminal of each electrically controllable switch is connected to a respective one of the nodes. The other terminal of each switch is connected in common with all other corresponding switch terminals to the third terminal 118. Each electrically controllable switch may be closed by applying a signal to a control terminal of which terminal 137 is typical. When an electrically controllable switch is closed, the node to which it is connected is connected to the third terminal 118. Only one of the electrically controllable switches is closed at a given time. In the one embodiment, each electrically controllable switch is a conventional MOSFET.

A selecting means can be a binary shift register in which all of the bits are set to "0" except for one bit which contains a "1" could also be used. Each bit in the shift register would be connected to a corresponding electrically controllable switch control terminal. In this embodiment, the choice of which node is connected to the third terminal 118 would be made by shifting the contents of the register either up or down by signals on appropriate control lines. The state of the shift register could be stored in an electrically reprogrammable memory which has one bit corresponding to each of the bits in the shift register.

In another embodiment, the NANO-elements are transistors or diode. As discussed in U.S. Patent Publication 20030178617, the disclosure of which is incorporated hereof by reference, a self-aligned carbon-NANOtube field effect transistor semiconductor device is fabricated. The device comprises a carbon-NANOtube deposited on a substrate, a source and a drain formed at a first end and a second end of the carbon-NANOtube, respectively, and a gate formed substantially over a portion of the carbon-NANOtube, separated from the carbon-NANOtube by a dielectric film. Alternatively, a carbon-NANOtube field effect transistor semiconductor device is provided. The device comprises a vertical carbon-NANOtube wrapped in a dielectric material, a source and a drain formed on a first side and a second side of the carbon-NANOtube, respectively, a bilayer nitride complex through which a band strap of each of the source and the drain is formed connecting the carbon-NANOtube wrapped in the dielectric material to the source and the drain, and a gate formed substantially over a portion of the carbon-NANOtube.

In accordance with another embodiment of the present invention, the NANO-elements such as transistors, capacitors, inductors and diodes, can be provided using DNA molecules as a support structure. DNA binding proteins are used to mask regions of the DNA as a material, such as a metal is coated onto the DNA. The present invention also provides methods of making integrated circuits using DNA molecules as a support structure. Methods for making DNA based transistors, capacitors, inductors and diodes are discussed in U.S. Patent Publication 20010044114, the disclosure of which is incorporated hereof by reference.

In one embodiment, the NANO-elements can be a substantially two-dimensional array made up of single-walled NANOtubes aggregating (e.g., by van der Waals forces) in substantially parallel orientation to form a monolayer extending in directions substantially perpendicular to the orientation of the individual NANOtubes. Such monolayer arrays can be formed by conventional techniques employing "self-assembled monolayers" (SAM) or Langmiur-Blodgett films. NANOtubes are bound to a substrate having a reactive coating (e.g., gold). Typically, SAMs are created on a substrate which can be a metal (such as gold, mercury or ITO (indium-tin-oxide)). The molecules of interest, here the SWNT molecules, are linked (usually covalently) to the substrate through a linker moiety. The linker moiety may be bound first to the substrate layer or first to single-wall NANOtubes ("SWNT") molecule (at an open or closed end) to provide for reactive self-assembly. Langmiur-Blodgett films are formed at the interface between two phases, e.g., a hydrocarbon (e.g., benzene or toluene) and water. Orientation in the film is achieved by employing molecules or linkers that have hydrophilic and lipophilic moieties at opposite ends.

In one embodiment the SAM, or two-dimensional monolayer, described above may be the starting template for preparing a three dimensional self-assembling structures. Where the end caps of the component SWNT molecules have monofunctional derivatives the three-dimensional structure will tend to assemble in linear head-to-tail fashion. By employing multi-functional derivatives or multiple derivatives at separate locations it is possible to create both symmetrical and non symmetrical structures that are truly three-dimensional.

Carbon NANOtubes in material obtained according to the foregoing methods may be modified by ionically or covalently bonding functionally-specific agents (FSAs) to the NANOtube. The FSAs may be attached at any point or set of points on the fullerene molecule. The FSA enables self-assembly of groups of NANOtubes into geometric structures. The groups may contain tubes of differing lengths and use different FSAs. Self-assembly can also occur as a result of van der waals attractions between derivitized or underivitized or a combination of derivitized and underivitized fullerene molecules. The bond selectivity of FSAs allow selected NANOtubes of a particular size or kind to assemble together and inhibit the assembling of unselected NANOtubes that may also be present. Thus, in one embodiment, the choice of FSA may be according to tube length. Further, these FSAs can allow the assembling of two or more carbon NANOtubes in a specific orientation with respect to each other.

By using FSAs on the carbon NANOtubes and/or deriv-itized carbon NANOtubes to control the orientation and sizes of NANOtubes which are assembled together, a specific three-dimensional structure can be built up from the NANOtube units. The control provided by the FSAs over the three-dimensional geometry of the self assembled NANOtube structure can allow the synthesis of unique three-dimensional NANOtube materials having useful mechanical, electrical, chemical and optical properties. The properties are selectively determined by the FSA and the interaction of and among FSAs.

Properties of the self-assembled structure can also be affected by chemical or physical alteration of the structure after assembly or by mechanical, chemical, electrical, optical, and/or biological treatment of the self-assembled fullerene structure. For example, other molecules can be ionically or covalently attached to the fullerene structure or FSAs could be removed after assembly or the structure could be rearranged by, for example, biological or optical treatment. Such alterations and/or modifications could alter or enable electrical, mechanical, electromagnetic or chemical function of the structure, or the structure's communication or interaction with other devices and structures.

In yet another embodiment, a nanotube wired OR logic can be implemented. The upper nanotubes or nanowires IN0, IN1, IN2, IN3 contact lower nanotube, thus forming a plurality of low resistance PN-type junctions discussed in U.S. Application Serial No. 20030200521, the content is incorporated by reference. Alternatively, a programmable diode OR array with nanotubes can be used. The OR devices do not produce gain. Therefore, restoring logic performing signal restoration is needed to provide gain, either at the microscale or at the nanoscale level. Signal restoration allows high signals to be driven higher and low signals to be driven lower, in order to allow an arbitrary number of devices to be cascaded together and a logical distinction between a low logical value and a high logical value to be maintained. Therefore, signal restoration helps protecting the circuit against noise and allows arbitrary circuit composition. Restoring logic is provided at the nanoscale level in order to allow the output of a first stage to be used as input for a second stage, making it possible to compute through an arbitrary number of logic stages without routing the signal to non-nanoscale (e.g., microscale) wires. Using the FET junctions, NMOS-like inverters, NAND, AND, NOR, or OR logic can be built. In a first scenario (pull-up), all inputs IN0, . . . , INM-1 of the FETs are low. As a consequence, there is conduction through all the FETs formed at the wire crossings (no evacuation of charge). Since there is conduction through all the FETs and the top end of the series of FETs is connected to a power supply driven to a high voltage, the wire can be pulled up to the high voltage of the power supply. The output is now high. In a second scenario (pull-down), one of the inputs IN0, . . . , INM-1 is high. Ideally, there is no conduction through the portion of the wire under this FET. This breaks the path from the high voltage supply to the output region of the wire. In absence of current flow, the output cannot be pulled up to the high voltage. The static pulldown is always weakly enabled. If it is not pulling against a strong connection to the high voltage supply, as in the previous scenario, the weak static pulldown will be able to pull the output down to a low voltage level. The output of the FET is now low. Alternatively, restoration at the nanoscale level could also be obtained by means of precharge logic structures. In the simplest case, the static pull-down in the NOR is replaced with a precharge gate. Alternatively, the single pull-down line could be microscale instead of nanoscale. Additionally, an additional microscale input to disable the pull-up could be added. Operation is started by driving the new pull-up line (the additional input) to a high value (disabling current flow to the power supply), and enabling the pull-down precharge line by driving it to a low value. This will allow the output to charge to a low value. After the output is charged to a low value, the pull-down is disabled. The output will remain at the low value for which it is now precharged. Subsequent to this, the new pull-up line is enabled. If all of the inputs are low, conduction is allowed to the power supply and the output can be pulled up. If one or more of the inputs are high, there is no such path and the output remains at a low voltage level. Thus, the device continues to perform its NOR function. Alternate stages will use complementary precharge phases, in order not to release the pull-up enable line while the inputs to a stage are still precharging and have not been allowed to evaluate.

NANO Antenna

Examples of useful electric properties of the above described self-assembled geometric structure include: operation as an electrical circuit, a specific conductivity tensor, a specific response to electromagnetic radiation, a diode junction, a 3-terminal memory device that provides controllable flow of current, a capacitor forming a memory element, a capacitor, an inductor, a pass element, or a switch.

The geometric structure may also have electromagnetic properties that include converting electromagnetic energy to electrical current, an antenna, an array of antennae, an array that produces coherent interference of electromagnetic waves to disperse those of different wavelength, an array that selectively modifies the propagation of electromagnetic waves, or an element that interacts with optical fiber.

Figure 4:
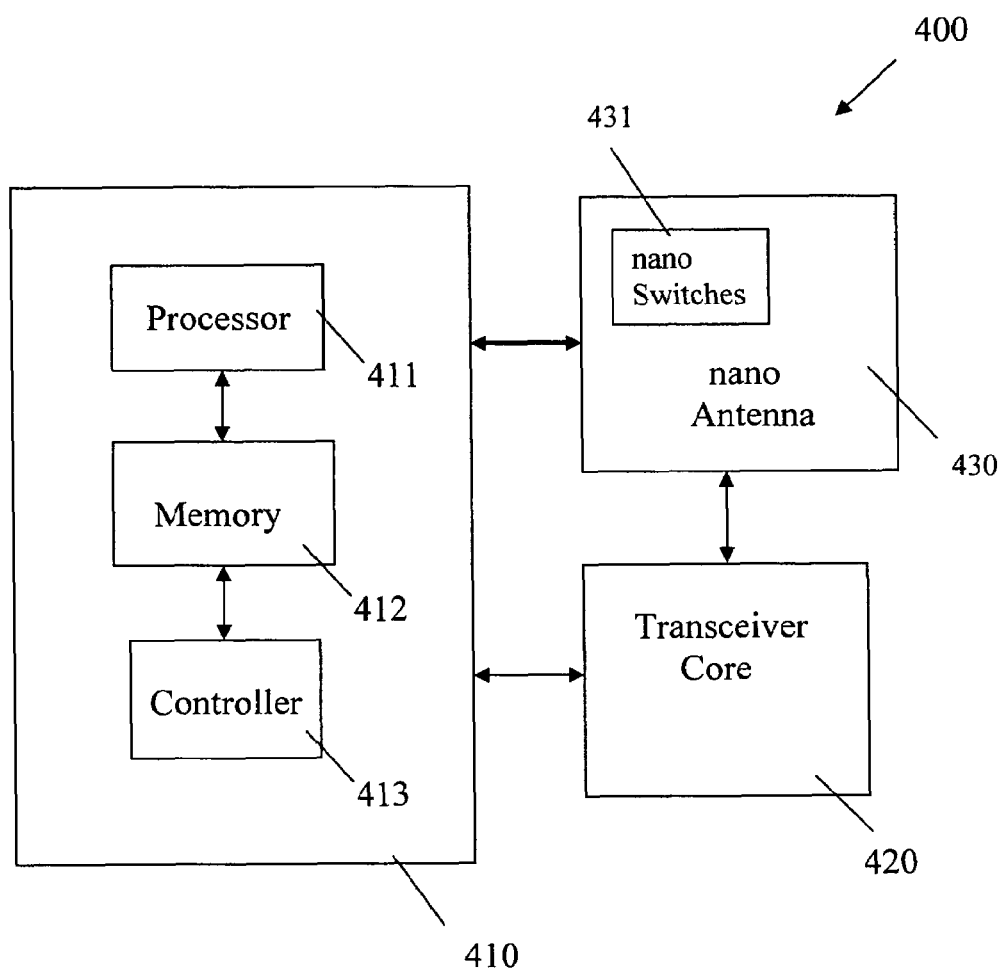
FIG. 4 is a block diagram of a wireless communication device comprising NANO antenna in accordance with the present invention.

In the present invention, such antenna is referred as NANO antenna. A wireless communication device 400 including such an NANO antenna 430 is shown in FIG. 4. The wireless communication device 400 include a processor core 410 that is fabricated using conventional semiconductor processes such as CMOS. The processor core 410 more or more processors 411, one or more memories 412, and one or more controllers 413. The processor 411 can include one or more central processor units (CPUs), one or more digital signal processors (DSPs), and Application Specific Integrated Circuits (ASICs). The memories 412 can include dynamic random access memory (DRAM), Read Only memory (ROM), and flash memory. The controller 413 controls the transceiver 420 and the NANO antenna 430 to enable it to transmit and receive wireless signals at different frequencies.

The processor core 410 can be fabricated using NANO elements such as transistors, diodes, capacitors, resistors, as described above or using coverntional semiconductor processes on a semiconductor substrate.

In accordance with the present invention, the electromagnetic properties of the NANO 440 antenna can be selectively determined by the FSA and the interaction of and among FSAs. For example, the lengths, location, and orientation of the molecules can be determined by FSAs so that an electromagnetic field in the vicinity of the molecules induces electrical currents with some known phase relationship within two or more molecules. The spatial, angular and frequency distribution of the electromagnetic field determines the response of the currents within the molecules. The currents induced within the molecules bear a phase relationship determined by the geometry of the array. In addition, application of the FSAs could be used to facilitate interaction between individual tubes or groups of tubes and other entities, which interaction provides any form of communication of stress, strain, electrical signals, electrical currents, or electromagnetic interaction. This interaction provides an "interface" between the self-assembled NANOstructure and other known useful devices.

Choice of FSAs can also enable self-assembly of compositions whose geometry imparts useful chemical or electrochemical properties including operation as a catalyst for chemical or electrochemical reactions, sorption of specific chemicals, or resistance to attack by specific chemicals, energy storage or resistance to corrosion.

Examples of biological properties of FSA self-assembled geometric compositions include operation as a catalyst for biochemical reactions; sorption or reaction site specific biological chemicals, agents or structures; service as a pharmaceutical or therapeutic substance; interaction with living tissue or lack of interaction with living tissue; or as an agent for enabling any form of growth of biological systems as an agent for interaction with electrical, chemical, physical or optical functions of any known biological systems.

FSA assembled geometric structures can also have useful mechanical properties which include but are not limited to a high elastic to modulus weight ratio or a specific elastic stress tensor. Optical properties of geometric structures can include a specific optical absorption spectrum, a specific optical transmission spectrum, a specific optical reflection characteristic, or a capability for modifying the polarization of light.

Self-assembled structures, or fullerene molecules, alone or in cooperation with one another (the collective set of alternatives will be referred to as "molecule/structure") can be used to create devices with useful properties. For example, the molecule/structure can be attached by physical, chemical, electrostatic, or magnetic means to another structure causing a communication of information by physical, chemical, electrical, optical or biological means between the molecule/ structure and other structure to which the molecule/structure is attached or between entities in the vicinity of the molecule/ structure. Examples include, but are not limited to, physical communication via magnetic interaction, chemical communication via action of electrolytes or transmission of chemical agents through a solution, electrical communication via transfer of electronic charge, optical communication via interaction with and passage of any form with biological agents between the molecule/structure and another entity with which those agents interact.

Fullerene NANOtubes can be used to replace the more traditional conductive elements of an antenna. For example, an (n,n) tube in conjunction with other materials can be used to form a Schottky barrier which would act as a light harvesting antenna. In one embodiment, a (10,10) tube can be connected via sulfur linkages to gold at one end of the tube and lithium at the other end of the tube forming a natural Schottky barrier. Current is generated through photo conductivity. As the (10,10) tube acts like an antenna, it pumps electrons into one electrode, but back flow of electrons is prevented by the intrinsic rectifying diode nature of the NANOtube/metal contact.

In forming an antenna, the length of the NANOtube can be varied to achieve any desired resultant electrical length. The length of the molecule is chosen so that the current flowing within the molecule interacts with an electromagnetic field within the vicinity of the molecule, transferring energy from that electromagnetic field to electrical current in the molecule to energy in the electromagnetic field. This electrical length can be chosen to maximize the current induced in the antenna circuit for any desired frequency range. Or, the electrical length of an antenna element can be chosen to maximize the voltage in the antenna circuit for a desired frequency range. Additionally, a compromise between maximum current and maximum voltage can be designed. A Fullerene NANOtube antenna can also serve as the load for a circuit. The current to the antenna can be varied to produce desired electric and magnetic fields. The length of the NANOtube can be varied to provide desired propagation characteristics. Also, the diameter of the antenna elements can be varied by combining strands of NANOtubes. Further, these individual NANOtube antenna elements can be combined to form an antenna array. The lengths, location, and orientation of the molecules are chosen so that electrical currents within two or more of the molecules act coherently with some known phase relationship, producing or altering an electromagnetic field in the vicinity of the molecules. This coherent interaction of the currents within the molecules acts to define, alter, control, or select the spatial, angular and frequency distributions of the electromagnetic field intensity produced by the action of these currents flowing in the molecules. In another embodiment, the currents induced within the molecules bear a phase relationship determined by the geometry of the array, and these currents themselves produce a secondary electromagnetic field, which is radiated from the array, having a spatial, angular and frequency distribution that is determined by the geometry of the array and its elements. One method of forming antenna arrays is the self-assembly monolayer techniques discussed above.

In another embodiment of the present invention, NANO wires can be formed to provide the resonant circuit in the NANO antenna 430. The orientation of the NANO wires can be controlled to maximize the reception signal strengths of the wireless communication device 400. Methods of orienting nanowires include the use of mask based processes alone or in combination with flow based alignment of the nanowires to provide oriented and positioned nanowires on surfaces. The populations of nanowires can also be controlled. Details of the control of nanowire orientation and population are discussed in U.S. Patent Publication 20030186522, the disclosure of which is incorporated hereof by reference.

In accordance with the present invention, a plurality of equivalent NANO circuits at different orientations are provided in the NANO antenna 430. The orientation of the NANO circuits are disposed such that wireless signals can be received at high strength at any orientation of the wireless communication device 400 relative to the field propagation direction of the incoming wireless wave.

In another embodiment, a plurality of NANO tubes can be connected by NANO switches 431 in a serial circuit to provide the NANO antenna 430. The electrical lengths of the circuit and thus the resonant frequencies can be configured by turning on and off different combinations of the NANO switches 431, depending on the required frequencies of various telecommunication protocols. Communications standards and protocols supported by the processor core 410, the transceiver core 420, and NANO antenna 430 include for example Global System for Mobile Communications (GSM), General Packet Radio Service (GPRS), Bluetooth. IEEE802.11 etc.

Fullerene molecules can be used to replace traditional electrically conducting elements. Thus fullerene molecules or self-assembled fullerene groups can be the basis of electrical circuits in which the molecule transfers electrical charge between functional elements of the circuit which alter or control the flow of that charge or objects in which the flow of electrical current within the object performs some useful function such as the redistribution of the electric field around the object or the electric contact in a switch or a response of the object to electromagnetic waves. As an example, NANOtubes can also be self-assembled to form a bridge circuit to provide full wave rectification. This device can include four NANOtubes, each forming an edge of a square, and four buckyballs, one buckyball would be located at each corner of the square. The buckyballs and NANOtubes can be derivitized to include functionally specific agents. The functionally specific agents form linkages connecting the buckyballs to the NANOtubes and imparting the required geometry of the bridge. A fullerene diode can be constructed through the self-assembly techniques described above. The diode can be composed of two bucky tubes and a bucky capsule. The bucky capsule can also be derivitized to form a zwiterrion. For example, the bucky capsule can include two positive groups, such as the triethyl amine cation and two negative groups, such as $CO_2$— anion. In one embodiment, each end of the bucky capsule is connected to a (10, 10) bucky tube by a disulfide bridge. Thus, sulfur serves as the functionally-specific agent.

Various molecules or NANO-elements can be coupled to one or more electrodes in a layer of an IC substrate using standard methods well known to those of skill in the art. The coupling can be a direct attachment of the molecule to the electrode, or an indirect attachment (e.g. via a linker). The attachment can be a covalent linkage, an ionic linkage, a linkage driven by hydrogen bonding or can involve no actual chemical attachment, but simply a juxtaposition of the electrode to the molecule. In some one embodiments, a "linker" is used to attach the molecule(s) to the electrode. The linker can be electrically conductive or it can be short enough that electrons can pass directly or indirectly between the electrode and a molecule of the storage medium. The manner of linking a wide variety of compounds to various surfaces is well known and is amply illustrated in the literature. Means of coupling the molecules will be recognized by those of skill in the art. The linkage of the storage medium to a surface can be covalent, or by ionic or other non-covalent interactions. The surface and/or the molecule(s) may be specifically derivatized to provide convenient linking groups (e.g. sulfur, hydroxyl, amino, etc.). In one embodiment, the molecules or NANO-elements self-assemble on the desired electrode. Thus, for example, where the working electrode is gold, molecules bearing thiol groups or bearing linkers having thiol groups will self-assemble on the gold surface. Where there is more than one gold electrode, the molecules can be drawn to the desired surface by placing an appropriate (e.g. attractive) charge on the electrode to which they are to be attached and/or placing a "repellant" charge on the electrode that is not to be so coupled.

NANO Memory Devices

Figure 5:
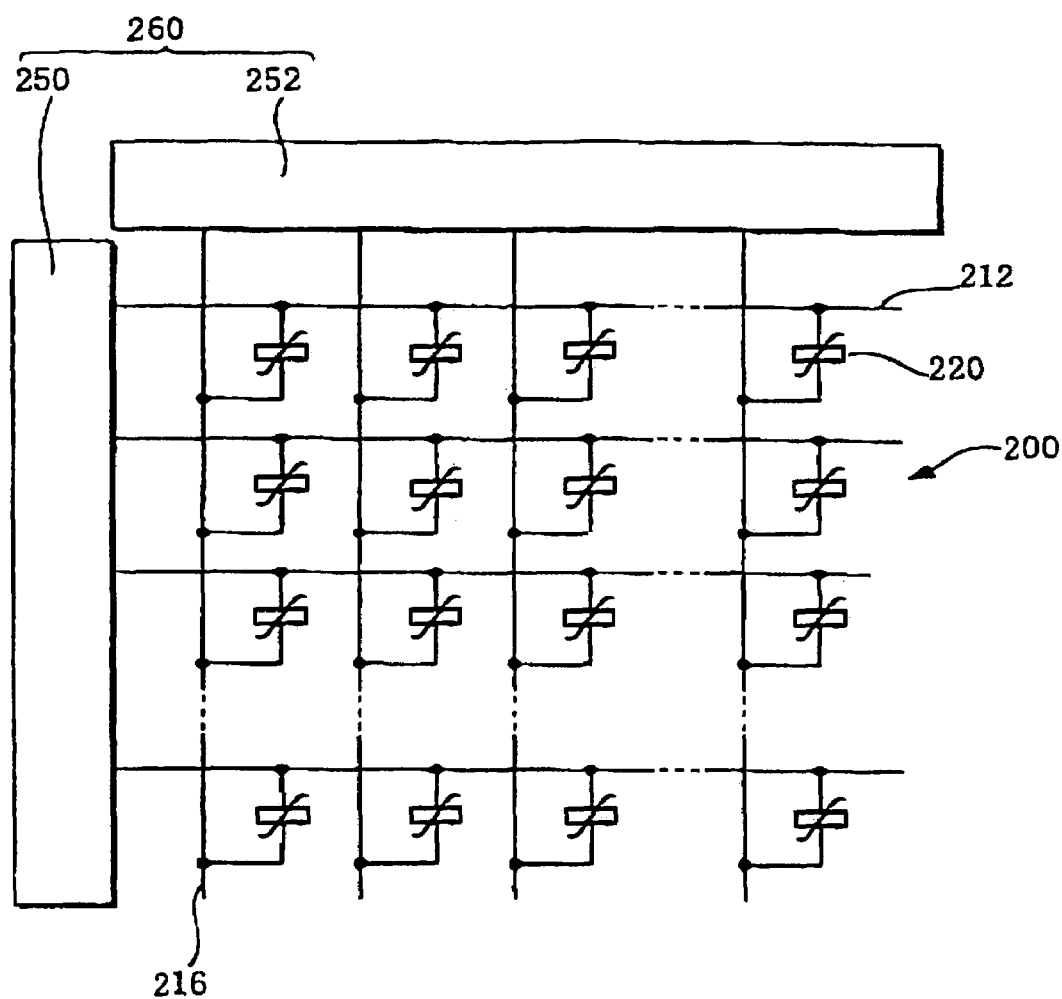
FIG. 5 is a schematic diagram of the architecture of memory devices comprising NANO elements in accordance with the present invention.

In yet another embodiment shown in FIG. 5, the NANO-elements can be an array of single-molecule magnets (SMMs). In one embodiment, arrays of SMMs can be used in combination with semiconductor structures to replace solid state memory systems or alternatively the SMMs can be deposited on a disk platter to achieve high density disk drive. The SMM molecules can be used for spin-based molecular electronics devices as well.

Single molecule magnets (SMMs) are NANOmagnets that consist of a core of strongly exchange-coupled transition metal ions with a large magnetic moment per molecule. SMM form crystals that are monodisperse—every molecule in a crystal has the same spin, orientation, magnetic anisotropy and atomic structure. Hence magnetic measurements of a crystal can be used to characterize the properties of individual magnetic molecules. SMMs have magnetic anisotropy that favors the magnetic moment to be either up or down with respect to the easy axis. The energy barrier between up and down states (the anisotropy barrier) leads to magnetic hysteresis and to magnetic bistability for magnetic data storage. Transitions between up and down magnetic states can occur by thermal activation and quantum tunneling. Due to the discrete energy spectrum, transitions are favored when up and down energy levels are in resonance, or, more precisely, have an anticrossing. These resonances only occur at certain magnetic fields. Each SMM has a fixed molecular size and shape, and unlike normal magnets, the properties of the SMM are due to intrinsic molecular properties. The SMM gains its properties from the large potential energy barrier between the spin "up" and spin "down" states. One exemplary SMM is $Mn_{12}O_{12}(O_2CMe)_{16}(H_2O).2MeCO_2H.4H_2O$, with S=10, and its related Mn complexes. Other classes of in the Mn family of molecules, $Mn_4O_3$ complexes, can also be used as SMMs.

The SMMs are made from transition metal clusters exhibiting magnetic bistability. The SMMs possess a high-spin ground state (S), which, when combined with a negative axial zero-field splitting (D<0), leads to an energy barrier for spin reversal. The SMMs incorporate oxo-based bridging ligands that mediate the magnetic exchange coupling between metal centers. In another embodiment having clusters with larger spin reversal barriers, cluster systems formed by replacing $Cr^{III}$ with $Mo^{III}$ in the linear cluster $[(Me_3tacn)_2-(cyclam)NiCr_2(CN)_6]_2+(Me_3tacn)$ N,N',N''-trimethyl-1,4,7-triazacyclononane; cyclam=1,4,8,11-tetraazacyclotetradecane) or an analogous substitution in the trigonal prismatic cluster $[(Me^3tacn)_6MnCr_6(CN)_{18}]^{2+,3c}$ bearing a higher spin ground state of S=3/2 can be used as a cyano-bridged single-molecule magnet.

As shown in FIG. 5, an SMM memory device includes a memory cell array 200 constructed over a substrate such as the substrate includes a silicon-on-insulator (SOI) wafer. In the memory cell array 200, first signal electrodes (chemical structure lines or word lines) 212 for selecting rows and second signal electrodes (bit lines) 216 for selecting columns are arranged to intersect at right angles. The first signal electrodes may be the bit lines and the second signal electrodes may be the chemical structure lines, differing from this example. An SMM layer 214 is disposed at least between the first signal electrodes 212 and the second signal electrodes 216. Therefore, memory cells 220, each of which includes an SMM, are formed at intersections between the first signal electrodes 212 and the second signal electrodes 216. A peripheral circuit section 260 including a peripheral driver circuit for selectively allowing information to be written into or read from the memory cells and an amplifier circuit which for reading the information is also formed. The peripheral circuit section 260 includes a first driver circuit 250 for selectively controlling the first signal electrodes 212, a second driver circuit 252 for selectively controlling the second signal electrodes 216, and a signal detecting circuit (not shown) such as a sense amplifier, for example.

As specific examples of the peripheral circuit section 260, a Y gate, a sense amplifier, an input-output buffer, an X address decoder, a Y address decoder, and an address buffer can be given. A write line is formed near the SMM cell 220 and the write line is used for writing and inverting magnetization of NANO-magnetic material layer of the SMM cell 220 by a current flow, as the magnetization is magnetic information.

The peripheral circuit section 260 may be formed by MOS transistors formed on a substrate (single crystal silicon substrate, for example). In the case where the substrate is formed of a single crystal silicon substrate, the peripheral circuit section 260 can be integrated on the same substrate as the memory cell array 200. The SMMs are formed last by spin-coating a solution containing self-assembled SMMs on a wafer after the wafer has been processed and devices are formed using conventional semiconductor fabrication techniques. Conventional semiconductor structures are formed as is conventional. During the next to the last conventional step, gold electrodes are formed. Then a resist layer is formed over the last layer, and selective etching is performed to expose the gold electrodes. A solution containing the SMMs are spin-coated on top, where the SMMs self-assemble.

Writing to the bit is accomplished by applying a polarized voltage pulse through a nanocircuit element. A positive pulse will pull the SMM and a negative pulse will push the SMM. The bistable nature of the bit will result in the SMM staying in the positioned end when the pulse is removed since that is where the energy is lowest. To read the bit, another nanocircuit element is biased with a VREAD voltage. If the SMM is present in the detection end, it supplies the necessary energy levels for current to resonantly tunnel across the junction to the ground voltage (in a fashion analogous to a resonant tunneling diode) resulting in a first stable state being read. If the SMM is not present in the detection end, the energy levels are shifted out of resonance and the current does not tunnel across the junction and a second stable state is read. Other forms of read/write structure (e.g., microactuators) can be employed as will be recognized by one skilled in the art.

A memory device can be constructed using either a two- or three-dimensional array of the SMMs. Because the SMMs are molecular in size, a dense memory chip can be fabricated. Further, the wiring width and the area of each cell is reduced. The switching electric field can be reduced by using the SMM memory cell and write current necessary for writing a magnetization invert may be reduced, whereby power consumption being restrained and switching being carried out at high speed. The NANO coercive force is small and the switching magnetic field is small. When the NANO-device is used as a memory cell of a magnetic memory, the current of a write wiring for generating a magnetic field necessary for inverting magnetization can be reduced. Therefore, according to the magnetic memory forming the memory cell by NANO-magnets, a highly integrated formation can be performed, the power consumption is reduced, and the switching speed can be made faster.

The molecular memory such as SMM memory is used as on-chip data or off-chip storage device for a processor chip. In one embodiment, the memory system organization is a multi-level memory hierarchy. A combination of a small, low-latency level one (L1) memory backed by a higher capacity, yet slower, L2 memory and finally by main memory provides the best tradeoff between optimizing hit time and miss time. Different molecular memory arrays with differing speed and size requirements can be deployed in a computer system. For example, a high speed static RAM can be used as L1 memory, while a high speed high density NANO memory array can be used as L2 memory and low speed NANO memory array can be used as regular memory. In one system on a chip, processor logic and cache is implemented using traditional semiconductor structure, and a large main memory array is provided on chip using molecular memory. Finally, NANO-head disk drive can be used as long term data storage devices.

NANO Disk Drive

Figure 6A:
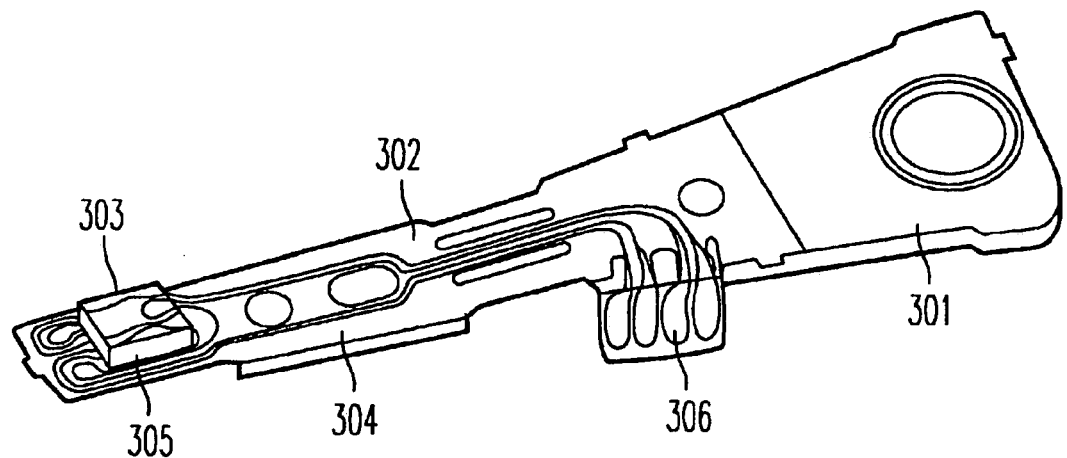
FIGS. 6A-6B show perspective views of an exemplary single molecule magnet data storage device, in this case a disk drive in accordance with the present invention.

Yet another embodiment is an embodiment in which the SMMs are applied to a magnetic head. FIG. 6A is a perspective view of a NANO-magnetic head assembly mounted with an SMM head. An actuator arm 301 is provided with a hole for being fixed to a fixed shaft inside of a magnetic disk apparatus and is provided with a bobbin portion for holding a drive coil (not illustrated) and the like. A suspension 302 is fixed to one end of the actuator 301. A front end of the suspension 302 is wired with a lead wire 304 for writing and reading signals, one end of the lead wire 304 is coupled with respective electrode of a NANO-magnetic head 305 mounted on a head slider 303, and the other end of the lead wire 304 is connected to an electrode pad 306. The NANO-head 305 is fabricated using thin-film type substrate, with spin-coating of the SMM elements at the last stages of head manufacture.

The NANO-head 305 has one or more NANO sub-heads so that it can access information serially or in parallel for improved data throughput. In addition, error correction codes can be encoded and decoded on the NANO-head. Further, each of the sub-heads can be part of a RAID array. The NANO-head 305 provides data used for standard RAID levels including 1, 3, and 5 or combinations of two other RAID levels. For example, in RAID 1+0 (also called RAID 10), multiple RAID 1 pairs are striped for faster access; and in RAID 15, two RAID 5 arrays are mirrored for added reliability.

Figure 6B:
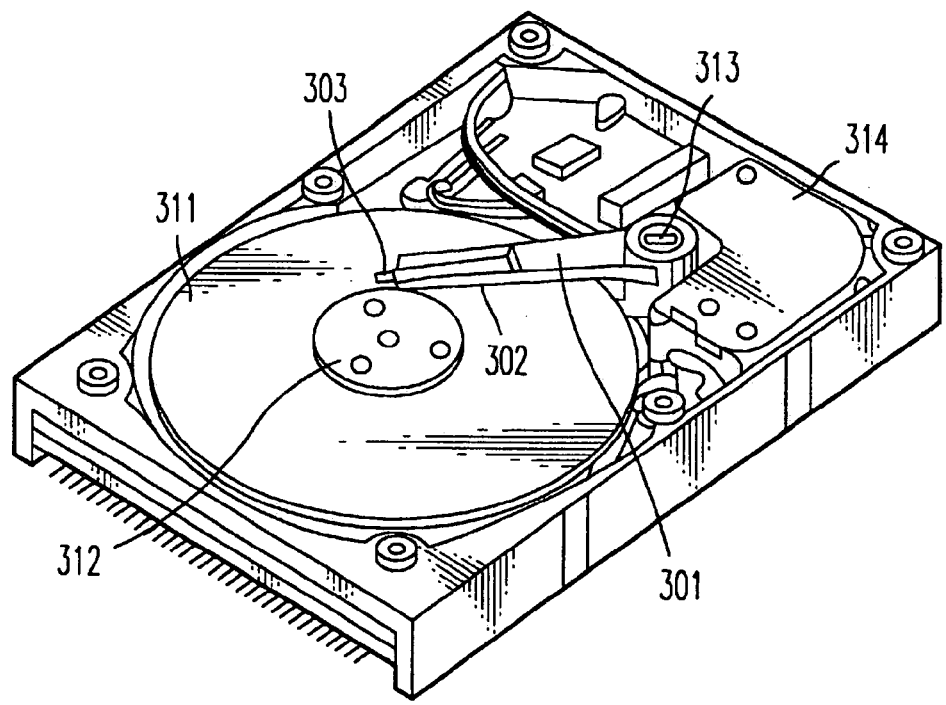

FIG. 6B is a perspective view of an inner structure of a magnetic disk apparatus (magnetic information reproducing apparatus) mounted with the magnetic head assembly of FIG. 6A. A NANO-magnetic disk 311 is mounted on a spindle 312 and is rotated by a motor (not illustrated) responding to a control signal from a control portion of a drive apparatus (not illustrated). The NANO-magnetic disk 311 has a surface that is processed using thin fim deposition with a spin-coat of the self-assembled SMMs late in fabrication of the disk 311. The actuator arm 301 is fixed to a fixed shaft 313 for supporting the suspension 302 and the head slider 303 at the front end thereof. When the magnetic disk 311 is rotated, a surface of the head slider 303 opposed to the disk 311 is held in a floating state from a surface of the magnetic disk 311 by a predetermined amount, thereby reproducing the magnetic information of the magnetic disk. At another end of the actuator arm 301, a chemical coil motor 314 is provided and includes a type of a linear motor. The chemical coil motor 314 includes a drive coil (not illustrated) wound up to the bobbin portion of the actuator arm 301 and a magnetic circuit including a permanent magnet and an opposed yoke arranged to be opposed to each other to interpose the coil. The actuator arm 301 is supported by ball bearings (not illustrated) provided at two upper and lower locations of the fixed shaft 313 and can freely be slidingly rotated by the chemical coil motor 314.

NANO-Optical Dram

In yet another embodiment, the NANO-elements can be an array of optical storage molecules (OSMs). In one embodiment, arrays of OSMs can be used in combination with semiconductor structures to replace solid state memory systems or alternatively the OSMs can be deposited on a disk platter to achieve high density disk drive. The OSM molecules can be used for spin-based molecular electronics devices as well.

The OSMs convert energy patterns into electronic digital signals by exposing an image plate having OSMs supported by a matrix to an energy pattern. The energy pattern can be provided by a plurality of optical signals output from a bundle of optical fibers of optical circuitry. The applications include telecommunication and parallel optical computing. A plurality of energy patterns recorded by the array of OSMs in electronic signals can be considered as snapshots of optical signals which can be read as optical signals or electronic signals.

In one embodiment, the OSM can be a nanophase storage luminescence material of the general formula X/Y, wherein X is at least one guest and Y is a host. The host can be selected from the group consisting of organic, inorganic, glass, crystalline, non-crystalline, porous materials or combinations thereof. The host can be semiconducting nanoparticles such as insulating nanoparticles, conducting nanoparticles, and combinations thereof. The semiconductor nanoparticle can be sulfide, telluride, selenide, or oxide semiconductors. The semiconductor nanoparticle is selected from the group of $Zn_xS_y$, $Zn_xSe_y$, $Zn_xTe_y$, $Cd_xS_y$, $Cd_xSe_y$, $Cd_xTe_y$, $Pb_xS_y$, $Pb_xSe_y$, $Pb_xTe_y$, $Mg_xS_y$, $Ca_xS_y$, $Ba_xS_y$, and $Sr_xS_y$, wherein $0<x\leq1$, $0<y\leq1$. The semiconductor nanoparticle can be ZnS. The semiconductor nanoparticle can also be represented by the general formula $(M_{1-z}N_z)_xA_{1-y}B_y$, wherein M=Zn, Cd, Pb, Ca, Ba, Sr, Mg; N=Zn, Cd, Pb, Ca, Ba, Sr, Mg; A=S, Se, Te, O; B=S, Se, Te, O; $0<x\leq1$, $0<y\leq1$, $0<z\leq1$). The semiconductor nanoparticle can also be $Zn_{0.4}Cd_{0.4}S$.

The writing of optical signals involves the conversion of optical signals to electronic states via photon induced electronic excitations. As discussed in Application Serial No. 20030064532, NANO particle energy structure can be modified via quantum size confinement. When electrons and holes are produced in NANO particles by excitation, the electrons and holes may de-excite or relax to the lowest excited states and recombine to give luminescence. They also may be trapped by electron or hole traps at the surfaces, interfaces, or/and in the surrounding matrix. The electrons or holes at traps are in a metastable state.

The read-out of the recorded electronic data converted from optical signals can be achieved by several mechanisms. 1) When stimulated by light or by heat some electrons or holes may be released and go back to the NANO particles, recombining to provide luminescence—i.e., photostimulated luminescence (PSL) or thermoluminescence. Light energy is provided to optically stimulate the photostimulated luminescence NANO particles. The NANO particles release the stored energy and provide luminescence due to electron-hole recombination; and converting the luminescence into digital signals indicative of the energy pattern. The stimulating light or heat energies can be applied uniformly to the array of OSMs and detecting the PSL and thermoluminescence by a 2D optical sensor. 2) Alternatively, the recombination and luminescence of the stored electrons and holes in the energy pattern can also be stimulated by sweeping electric voltage pulses along the word lines and bit lines. The detection of the stimulated luminescence signals include only a single or 1D array of optical detectors. 3) Finally, the stored electrons and holes from the exposed energy pattern can be read out electronically as in conventional memory devices using the electronic circuitry in the memory cell array as described below. Transistors can be provided to convert the stored charge to voltage signals. Additional conductive lines connecting to the collector, the emitters, the gates can be provided to facilitate the readouts. The invention device is similar to electrically erasable programmable read-only memory (EEPROM) devices with additional optical writing (via 2D optical pattern) capabilities.

An exemplified architecture of the OSM memory device is illustrated in FIG. 5. The OSM memory device includes a memory cell array constructed over a substrate and the substrate includes a silicon-on-insulator (SOI) wafer. In the memory cell array, first signal electrodes (word lines) for selecting rows and second signal electrodes (bit lines) for selecting columns are arranged to intersect at right angles. The first signal electrodes may be the bit lines and the second signal electrodes may be the chemical structure lines, differing from this example. An OSM layer is disposed at least between the first signal electrodes and the second signal electrodes. Therefore, memory cells, each of which includes an OSM, are formed at intersections between the first signal electrodes and the second signal electrodes. A peripheral circuit section (including a peripheral driver circuit for selectively allowing information to be written into or read from the memory cells) and an amplifier circuit which for reading the information is also formed. The peripheral circuit section includes a first driver circuit for selectively controlling the first signal electrodes, a second driver circuit 252 for selectively controlling the second signal electrodes, and a signal detecting circuit such as a sense amplifier, for example.

The OSMs are formed last by spin-coating a solution containing self-assembled OSMs on a wafer after the wafer has been processed and devices are formed using conventional semiconductor fabrication techniques. Conventional semiconductor structures are formed as is conventional. During the next to the last conventional step, gold electrodes are formed. Then a resist layer is formed over the last layer, and selective etching is performed to expose the gold electrodes. A solution containing the OSMs are spin-coated on top, where the OSMs self-assemble. Writing to the bit is accomplished by applying a tightly focused light emitter that can be a nanocircuit element. To read the bit, another nanocircuit element such as a light detector detects whether the optical DRAM cell is on or off based on the stored light energy. If the OSM is on, it supplies the necessary energy levels for current to resonantly tunnel across the junction to the ground voltage (in a fashion analogous to a resonant tunneling diode) resulting in a first stable state being read. If the OSM is off, the energy levels are shifted out of resonance and the current does not tunnel across the junction and a second stable state is read. Other forms of read/write structure (e.g., microactuators) can be employed as will be recognized by one skilled in the art.

A memory device can be constructed using either a two- or three-dimensional array of the OSMs. Because the OSMs are molecular in size, a dense memory chip can be fabricated. Further, the wiring width and the area of each cell is reduced. The switching light field can be reduced by using the OSM memory cell and write current necessary for writing an optical invert may be reduced, whereby power consumption being restrained and switching being carried out at high speed. The molecular memory such as OSM memory is used as on-chip data or off-chip storage device for a processor chip. In one embodiment, the memory system organization is a multi-level memory hierarchy. A combination of a small, low-latency level one (L1) memory backed by a higher capacity, yet slower, L2 memory and finally by main memory provides the best tradeoff between optimizing hit time and miss time. Different molecular memory arrays with differing speed and size requirements can be deployed in a computer system. For example, a high speed static RAM can be used as L1 memory, while a high speed high density NANO optical DRAM array can be used as L2 memory and low speed NANO memory array can be used as regular memory. In one system on a chip, processor logic and cache is implemented using traditional semiconductor structure, and a large main memory array is provided on chip using molecular memory. Finally, NANO-head disk drive can be used as long term data storage devices.

NANO Optical Interconnect

In a high speed multi-chip module (MCM) environment, chip-to-chip connections are usually made using bond wires, with microstrip lines on the MCM substrate used to interconnect chips that are farther apart. Presently, electrical bond wires are used to interconnect microchips. Using the electrical wires has serious drawbacks. The electrical wires are sensitive to electromagnetic interference and themselves create such interference which poses especially serious problems for distribution of timing signals. The electrical wires must be located at the edges of chips. Signal attenuation and phase delay depend upon the length of the electrical wires. Thus, depending on the lengths of the electrical wires and their locations in the module, it may be difficult to achieve equal attenuation and/or equal signal phase delay among multiple wires, if needed. In addition, in many cases signal bandwidths of several Gigahertz are desirable but cannot be achieved if electrical wires are used because electrical bond wires act as open antennae at high frequencies and introduce noise coupling among the wires. For example, bond wires of 500 micrometers in length and 1 mil (0.001 inch) diameter carrying 10 milliamperes of current will produce appreciable (100 millivolts or more) coupling or cross-talk at 10 Gigahertz even when they are spaced several pitch distances apart, a typical pitch being 100 to 150 micrometers. This effect will substantially limit the maximum speed of a typical MCM module having hundreds of bond wires from several chips. The cross-talk is even more severe when the chips are located farther apart and require longer bond wires. Previously, optoelectronic devices such as vertical-cavity lasers and photodetectors have been bonded onto microelectronic chips to provide free-space optical interconnections. However, such lasers and detectors are bulky.

In one embodiment of the invention, NANO optical elements such as OSMs are used with an optical waveguide to interconnect MCMs to provide an optical interconnection system. In one embodiment, conventional electronics are deposited using standard semiconductor processing techniques. Next, OSMs and light detectors are spin-coated above the semiconductor layer and they self assemble to form transmitters or receivers at designated locations on the MCMs. During fabrication, the MCMs are immersed in a solution that allows nano-optical interconnect (nano-lightpath) to self-assemble in 3D space between the transmitters and the receivers. The self-assembly is keyed so that specific nano-lightpaths bond between specific transmitter and receiver pairs. One type of keying uses chemical bond key encoding or DNA encoding. The NANO light fibers or other suitable light conductors to interconnect the OSMs to their respective light detectors. Lightpaths traverse several physical links but information traveling on a lightpath is carried optically from end-to-end. The system is insensitive to electromagnetic interference; needs not be located at the edges of a chip but rather can be placed for optimal utility to the circuit function; can be given the same or other pre-specified lengths regardless of the placement in the module; and are capable of high signal bandwidths without causing the cross-talk problem. The optical interconnection system can further include a semiconductor region over or in the substrate. An electronic circuit can be formed conventional semiconductor techniques. The electronic circuit controls or monitors the interconnection of the optical signals.

In another embodiment for wide area networking, the system performs wavelength routing, which is a form of circuit switching. In wavelength-routed networks, a lightpath, which is an end-to-end optical communication connection, is established before data can be sent. Such lightpaths are called "wavelength-routed" because each uses a dedicated wavelength channel on every link along a physical path, and hence, once data is transmitted on a specific wavelength by its source, how the data will be routed (or switched) at the intermediate nodes will be determined by the "color" of the wavelength only. Optical packet switching (OPS) is similar to traditional electronic packet switching, except for that payload (i.e., data) will remain in optics, while its header may be processed electronically or optically. In one embodiment, the above optical random access memory performs optical buffering. Optical burst switching (OBS) is a technique for transmitting bursts of traffic through an optical transport network by setting up a connection and reserving resources end to end for the duration of a burst. OBS is a way to achieve a balance between the coarse-grained wavelength routing and fine-grained optical packet switching.

In another embodiment, the system includes a nano-optical switch is a nano photonic switch having N full-duplex ports, each of which can connect to any other without OEO conversion, although the switch may still be controlled by electronic signals. Broadly speaking, switches refer to devices that may be called add-drop multiplexers (ADMs), routers, and cross-connects. An add/drop multiplexer (ADM) is an optical system that is used to modify the flow of traffic through a fiber at a routing node. An ADM passes traffic on certain wavelengths through without interruption or opto-electronic conversions, while other wavelengths are added or dropped, carrying traffic originating or terminating at the node. A wavelength router (WR) is a more powerful system than an ADM. For each of the wavelengths it takes in a signal at an input port and routes it to a particular output port, independent of the other wavelengths. A WR with N input and N output ports capable of handling k wavelengths can be considered as k independent N×N single wavelength switches. These switches have to be preceded by a wavelength demultiplexer and followed by a wavelength multiplexer to implement a WR. They are sometimes also called wavelength routing switches (WRS) or wavelength crossconnects (WXCs). Equipped with WCs, a WXC becomes a wavelength interchanging switch, also known as wavelength interchanging crossconnect (WIXC). (Note that a wavelength crossconnect (WXC) is commonly called an optical crossconnect (OXC).

In a wavelength-routed network embodiment, nano-wavelength crossconnect (WXC) or nano-optical crossconnect (OXC) nodes are inter-connected by nano-fiber links. A lightpath is realized by allocating a wavelength on each link on the path between the two nodes. Each link can support a certain number of wavelengths. To avoid wavelength continuity constraint, nano-wavelength converters (WCs) are used in the network. A wavelength converter is a device that takes in data at one wavelength and outputs it on a different wavelength. Wavelength conversion can play a significant role in improving the utilization of the available wavelength in the network, or reducing the blocking rate for lightpath requests. The lightpaths can be set up and taken down upon demand. These are analogous to setting up and taking down circuits in circuit-switched networks. The key elements in the network are the optical crossconnects (OXCs). The major components required to realize OXCs are passive wavelength multiplexers and demultiplexers, switches, and/or wavelength converters. Depending on the functionality available at the nodes, these networks can be classified as either static or reconfigurable. A static network does not have any switches or dynamic wavelength converters in it. A reconfigurable network, on the other hand, contains switches and/or dynamic wavelength converters. The main difference between the two types of networks is that the set of lightpaths that can be established between users is fixed for a static network, whereas it can be changed, by changing the states of the switches or wavelength converters at the OXC nodes, for a reconfigurable network.

NANO Optical Storage Device

In another embodiment, single molecule light sensors are used to provide data storage. The NANO-elements convert energy patterns into digital signals by exposing an image plate having a NANO particle array supported by a matrix to an energy pattern. The NANO particle array formed of photostimulated luminescence NANO particles which cooperate to store energy indicative of the energy pattern. As discussed in Application Serial No. 20030064532, NANO particle energy structure can be modified via quantum size confinement. When electrons and holes are produced in NANO particles by excitation, the electrons and holes may de-excite or relax to the lowest excited states and recombine to give luminescence. They also may be trapped by electron or hole traps at the surfaces, interfaces, or/and in the surrounding matrix. The electrons or holes at traps are in a metastable state.

When stimulated by light or by heat some electrons or holes may be released and go back to the NANO particles, recombining to provide luminescence—i.e., photostimulated luminescence (PSL) or thermoluminescence. Light energy is provided to optically stimulate the photostimulated luminescence NANO particles. The NANO particles release the stored energy and provide luminescence due to electron-hole recombination; and converting the luminescence into digital signals indicative of the energy pattern. As a data storage device, the writing light can be either ultra-violet (UV) or blue or any other light having energy higher than the energy gap of the host materials (i.e. the writing light is variable and will depend on the energy gap of the host material). The reading light can be visible or infrared (IR) light, the choice of reading light is also variable and depends on the trap depth of the host material. Semiconductors such as MgS, CaS, SrS, and SrSe doped with rare earth elements such as Ce, Sm, and Eu have been previously considered for optical storage and dosimetric applications. The configuration of the optical writer and optical reader are similar a CD-R or DVD-R drive and similar to the configurations in FIGS. 6A and 6B. The layer of NANO particles can be spin-coated over a substrate surface.

NANO Chemical Sensors

Figure 7:
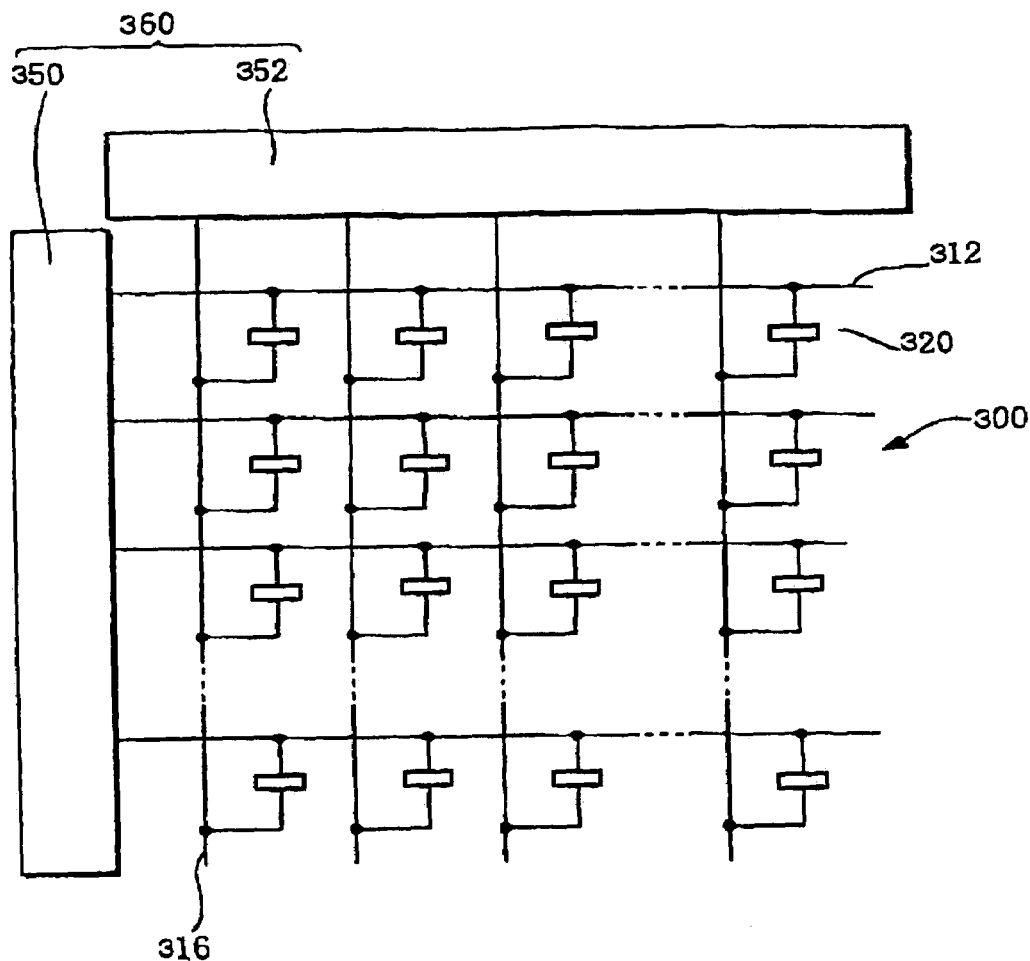
FIG. 7 is a diagram of a system having an array of NANO-based chemical and biological sensors in accordance with the present invention.

FIG. 7 is an exemplary diagram of a system having an array of NANO-based sensors. The NANO-elements can be used as sensors such as Guided-Optics Intrinsic Chemical Sensors. These sensor types are based on the fact that chemical species can affect the waveguide properties. Hence, it is not the absorption or emission properties of an analyte that are measured, but rather the effect of the analyte upon the optical properties of the optical waveguide. More specifically, these sensors are based on one or more of the following effects of the analyte: (a) An increase in the strain/stress of the coating, (b) Modification of the waveguide temperature, (c) Attenuation of the guided light amplitude, (d) Change of the effective refractive index of the mode, (e) Modification of the polarization of the light.

In one embodiment, a sensor includes resonant NANOparticles embedded in a semipermeable matrix. The NANOscale sensor can operate with a single molecule to recognize the presence of a specific short sequence in a mixture of solid molecules, gaseous molecules or aqueous molecules such as DNA or RNA molecules. The system selectively detects and identifies a plurality of chemical species by using an array of NANO sensors. When a target molecule binds to the probes (NANOparticles) in the sensor, the probe molecule changes shape and alters the reflectivity of the sensor. In one embodiment, the NANOparticles are embedded in a carrier or matrix. The matrix is preferably transparent to an optical sampling wavelength and not Raman active at the Stokes shifts of interest. The optical sample wavelength may be any suitable laser wavelength. The matrix may be any suitable inorganic or polymeric material such as mesoporous silica. The optical sampling geometry can be as a layer deposited onto a reflective substrate exposed to incident light. Alternatively, the optical sampling geometry can be as a cladding layer in a waveguide structure, where the Raman excitation is a result of the evanescent wave of the guided optical mode propagating in that structure.

The analytes of interest are exposed to the semipermeable layer, diffuse through this layer and are adsorbed onto the surfaces of the embedded NANOparticles. The scattered light is modulated by the Stokes modes of the analyte molecules, and detection consists of spectral analysis of the scattered light using a standard dispersive geometry and lock-in based photodetection. The NANOparticles' resonances are tuned to match a pump laser wavelength. The NANOparticles can be functionalized with molecules that exhibit a strong Raman response. A variety of candidate molecules may be used, such as para-mercaptoaniline, which can be bound to the surface of the NANOparticles and which yields three strong Stokes modes. Alternatively the NANOparticles can be embedded in a medium exhibiting a strong Raman response. The optical sampling geometry can be a layer deposited onto a reflective substrate exposed to incident light. Alternatively, the optical sampling geometry can be as a layer in a waveguide structure, where the Raman excitation is a result of the evanescent wave of the guided optical mode propagating in that structure.

According to some embodiments, the resonant NANOparticles are solid metal NANOparticles. The shape of the metal NANOparticles may be selected so as to adjust the wavelength of the resonance. Thus, contemplated shapes include spheroids, ellipsoids, needles, and the like. Further the metal NANOparticles may be aggregated into multiparticle aggregates so as to adjust the wavelength of the resonance. Still further, the metal NANOparticles may be embedded in a matrix material that is capable of adjusting the wavelength of the resonance. For example, the matrix may be any dielectric material suitable to form the core of a metal NANOshell. More details on the NANOshell sensor is described in Application Serial No. 20030174384, the content of which is incorporated by reference.

In one embodiment, the sensors are incorporated in an interferometer, and phase-modulated or interferometric optical sensors offer the highest sensitivity. Interferometric sensor systems typically employ the MachZehnder interferometer configuratio. Other configurations such as those of Michelson and Fabry-Perot can also be used. The interaction with the chemical substance takes place through the evanescent waves. The physical shape of the waveguide may change. The waveguide parameter changes due to a change in the physical dimension as well as to a change in the refractive index of the waveguide as a function of temperature. The intensity of the optical field decreases exponentially as it travels in the waveguide. The Kramers-Kronig relationship relates the imaginary part of the refractive index to its real part. Therefore, in attenuation mode chemical sensors, the phase of the guided mode also changes. The phase of the guided light may change. The TM and TE mode experience different phase shifts or attenuation.

One embodiment uses polarization of the light in sensing applications. The NANO-sensor consists of an integrated difference (or polarimetric) interferometer that uses only one waveguide. The waveguide is designed to have only two modes of propagation: the fundamental TE and TM modes. A small portion of the waveguide's core where it contacts the measurand (a gas or a liquid) is exposed. The propagation constant of the TE and TM modes is sensitive to the refractive index of the sample. The dependence of each propagation constant on the refractive index of the sample is different and is dictated according to the equations for a three layer waveguide. At the output of the interferometer the light exiting the waveguide is passed through a polarizer at 45° and into a photodetector. After the polarizer, the waves arising from the original TE and TM are polarized in the same direction and may interfere.

In one embodiment, shape changes in a single DNA molecule bound to each sensor are detected and the result is compared against a database of substances (for example pathogens). If a match is found, the result is displayed.

In another embodiment, immobilized "probe" molecules of biological interest can be used. When exposed to an assay sample of interest, "target" molecules in the sample bind to the probe molecules to an extent determined by the concentration of the target molecule and its affinity for a particular probe molecule. If the target concentrations are known, the affinity of the target for the different probes can be estimated simultaneously. Conversely, given the known affinities of the different molecules in the target, the amounts of observed binding may be used to estimate simultaneously the concentrations of multiple analytes in the sample. U.S. Patent Application 20040002064 entited "Toxin detection and compound screening using biological membrane microarrays" shows examples of the probe molecules of biological interest, the content of which is incorporated by reference.

In another embodiment, when a target molecule binds to the probe in the sensor, the probe molecule changes shape, and in its new conformation, pulls on the sensor. The motion of the sensor is detected using evanescent wave scattering, which analyzes light that leaks out behind a reflecting mirror. This evanescent wave is used to sense the position of an object "beyond" the mirror. Thus, conformational changes in a single DNA molecule at the NANOmeter scale are detected and the result is compared against a database of substances (for example pathogens). If a match is found, the result is displayed.

In another embodiment, the matrix can include Polymer Waveguide Chemical Sensors where both intrinsic and extrinsic sensing mechanisms are present. In this case, the optical waveguide itself is made of a NANO-polymer that interacts with the chemical substance. The matrix is made from material that are able to absorb a target chemical onto the polymer surface. By diffusing into the waveguide the chemical is separated from the mixture. Thus, in this case, the waveguide is involved in both the separation process and the quantitative sensing of the target chemical.

In another embodiment, to increase the probing efficiency, optical energy inside the matrix is increased by operating the waveguide near its cut-off, or, more conveniently, by exciting surface plasmons. Light propagating inside the waveguide interacts with the charge density waves of a thin layer such as a metal like silver layer. If the guided wave's wavenumber matches that of the surface plasmon, the optical energy is absorbed by the plasmons and is consequently dissipated. The plasmon wavenumber, in turn, depends on the conductivity and can the surface condition of the metallic layer. A thin sensitive polymer film is usually deposited over the metallic film which, upon absorption of chemicals and gases, changes the plasmon wavenumber of the metallic film.

FIG. 7 is an exemplary diagram of an array of NANO-based sensors. As shown in FIG. 7, a sensor includes a NANO-cell sensor array 300. In the sensor array 300, first signal electrodes (chemical structure lines) 312 for selecting rows and second signal electrodes (bit lines) 316 for selecting columns are arranged to intersect at right angles. The first signal electrodes may be the bit lines and the second signal electrodes may be the chemical structure lines, differing from this example. A NANO-sensor layer 314 is disposed at least between the first signal electrodes 312 and the second signal electrodes 316. Therefore, sensor cells 320, each of which includes a NANO-sensor, are formed at intersections between the first signal electrodes 312 and the second signal electrodes 316. A peripheral circuit section 360 including a peripheral driver circuit for selectively allowing information to be read from the sensor cells and an amplifier circuit which for reading the information is also formed. The peripheral circuit section 360 includes a first driver circuit 350 for selectively controlling the first signal electrodes 312, a second driver circuit 352 for selectively controlling the second signal electrodes 316, and a signal detecting circuit (not shown) such as a sense amplifier, for example. As specific examples of the peripheral circuit section 360, a Y gate, a sense amplifier, an input-output buffer, an X address decoder, a Y address decoder, and an address buffer can be given. The peripheral circuit section 360 may be formed by MOS transistors formed on a substrate (single crystal silicon substrate, for example). In the case where the substrate is formed of a single crystal silicon substrate, the peripheral circuit section 360 can be integrated on the same substrate as the NANO-sensor array 300. The NANO-sensors are formed last by spin-coating a solution containing self-assembled NANO-sensors on a wafer after the wafer has been processed and devices are formed using conventional semiconductor fabrication techniques. Conventional semiconductor structures are formed as is conventional. During the next to the last conventional step, gold electrodes are formed. Then a resist layer is formed over the last layer, and selective etching is performed to expose the gold electrodes. A solution containing the NANO-sensors are spin-coated on top, where the NANO-sensors self-assemble. Finally, a permeable layer is formed above the NANO-sensors to protect the NANO-elements and the semiconductor elements while allowing the target chemicals to pass through to the NANO-sensors.

In one embodiment, the layer is a gas sensitive film containing or covering NANO-elements such as NANO-pores. As the sensitive film is exposed to different gases or chemicals, its resistance changes. The resistance of the film is measured by passing a small amount of current and monitoring the voltage drop across the film. In one device for sensing air quality, the sensor's film is readily oxidized (by $NO_2$ or $O_2$) or reduced (by CO or $NH_3$). Upon oxidation or reduction, the electrical resistivity (or some other physical parameter) of the matrix film changes and it is detected to infer the gas concentration. A heater can be provided near the matrix to provide temperature adjustments to better detect gas.

In yet another embodiment, the matrix is ultrasonically activated to detect gases and chemicals. In these embodiments, a gas or chemical sensitive NANO-layer is deposited over an ultrasonic vibrator. When gases or chemicals are absorbed by the sensitive layer, they change the layer's mechanical properties. These mechanical changes influence the vibration amplitude and phase and can be picked up by monitoring the vibrational characteristics of the oscillator. In a microbalance embodiment, bulk wave detection is used to detect very small mass loading that occurs when minute quantities of materials are deposited over the surface of the oscillator. This method is the basis of thickness-monitors used in evaporation systems and can detect NANOgram of materials. The surface acoustic wave embodiment is even more sensitive than the microbalance embodiment since it directly detects the surface loading. It can be used to detect simple mass loading effects and any mechanical changes that may occur in its gas or chemical sensitive layer. This method can detect changes as small as one part in billion.

For example, if desired, the NANO-elements can be coated with a specific coating of interest (e.g., a ligand such as a peptide or protein, e.g., an enzyme), chosen for its ability to bind a particular ligand binding partner (e.g., an antibody or receptor can bind a ligand, or can themselves be the ligand to which ligand binding partner binds). Common analytes of interest for which detection is sought include glucose, cholesterol, warfarin, anthrax, testosterone, erythromycin, metabolites, pesticides, toxic molecules (e.g., formaldehyde, benzene, toluene, plutonium, etc.), ethanol (or other alcohols), pyruvate, and/or drugs.

For example, biosensors can include NANOstructures which capture or comprise enzymes such as oxidases, reductases, aldehyde/ketone reductases, alcohol dehydrogenases, aldehyde oxidases, cytochrome p450s, flavin monooxygenases, monoamine oxidases, xanthine oxidases, ester/amide hydrolases, epoxide hydrolases or their substrates or which capture their reaction products. Signal transduction is optionally facilitated by use of conductive polymers, to bind compounds to the NANOstructure, which facilitates electron transport to the surface of the structure. Several such polymers are available, including, e.g., polyaniline. It will be recognized that many of the biomolecules or other analytes to be captured (proteins, nucleic acids, lipids, carbohydrates) in the setting of a biosensor are charged, which can be used to cause them to "switch" a NANOscale transistor, providing for detection of binding of an analyte.

In other embodiments, biomolecules such as enzymes generate signals that are detected by an array. For example, the array can include a glucose oxidase and/or a cholesterol oxidase enzyme for the detection of glucose or cholesterol levels in blood or other biological fluids. For example, a number of existing glucose monitoring systems exist, including ferrocene, ferricyanide and Osmium polymer mediated systems. These systems generally use glucose oxidases in the process of glucose detection. These systems are adapted to the present invention by mounting or capturing one or more analyte detection molecule (e.g., glucose oxidase or the relevant mediator) on a NANOstructure of interest. Similarly, in a biohazard detector, a p450 or other suitable enzyme can be used to detect the presence of warfarin or another relevant molecule of interest.

The binding of receptors and carbon NANOtubes or biomolecules can be detected by an electrical method or resonance method or by using an x-y fluorescent laser reader. When the method of detecting an electrical signal is applied, the binding of receptors is detected by reading a minor change in voltage level of the carbon NANOtubes occurring when the receptors or biomolecules are bound to the carbon NANOtubes, using an appropriate circuit. In one environment, the NANOtubes or nanostructures can be any conducting or semiconducting nanostructures. In some embodiments, the nanostructures can also be nanowires, nanorods, or some other elongated nanostructures. In particular, the nanostructures can be carbon nanotubes and may be single-wall, semiconducting, carbon nanotubes. There can be any number of nanostructures, some of which may intersect one another as they traverse the device, and some of which may traverse the device without intersection. A power supply applies a first voltage across the nanostructure sensing array. A first current through the nanostructure sensing array is measured with a meter. The nanostructure sensing array is exposed to an environment of interest. The electrical supply applies the same first voltage across the nanostructure sensing array and the gate voltage source applies the same first gate voltage to the substrate. A second current through the nanostructure sensing array is measured with the meter. Differences between the first current and the second current can be attributed to electrical changes in the nanostructure sensing array caused by interaction with an analyte. Electrical changes can be correlated to identification of particular analytes by comparing the changes with predetermined electrical changes made in know environments.

When the resonance detection method is applied, a NANOplate structure designed to have a resonance frequency of a range from megaHertzs to low gigaHertzs is irradiated with a laser diode, and the binding of receptors or biomolecules to the NANOplate structure is optically measured by detecting a reflection signal using a position detection photodiode. When the x-y fluorescent laser reader is used, the target biomolecules bound to receptors are reacted with, for example, fluorescent molecules or fluorescence-labeled antibodies, and the entire chip after the reaction with the target biomolecules is placed on the x-y fluorescent laser reader to detect fluorescence. a detection system for detecting the binding of receptors and carbon NANOtubes or the binding of receptors and biomolecules may be further included. These types of binding can be detected by an electrical method or resonance method or by using an x-y fluorescent laser reader. When the method of detecting an electrical signal is applied, the binding of receptors or biomolecules is detected by reading a minor change in voltage level of the carbon NANOtubes occurring when the receptors or biomolecules are bound to the carbon NANOtubes, using an appropriate circuit. When the resonance detection method is applied, a NANOplate structure designed to have a resonance frequency of a range from megaHertzs to low gigaHertzs is irradiated with a laser diode, and the binding of receptors or biomolecules to the NANOplate structure is optically measured by detecting a reflection signal using a position detection photodiode. When the x-y fluorescent laser reader is used, the target biomolecules bound to receptors are reacted with, for example, fluorescent molecules or fluorescence-labeled antibodies, and the entire chip after the reaction with the target biomolecules is placed on the x-y fluorescent laser reader to detect fluorescence. In particular, the entire chip is scanned with a laser beam capable of exciting the fluorescence-labeled target proteins and imaged by using a charge-coupled device (CCD) capable of scanning the entire chip array. Alternatively, a confocal microscope, which increases automation and detects data rapidly at a high resolution, can be applied to collect data from the chip array.

Once digitized using the NANO-sensors, various algorithms can be applied to detect a pattern associated with a substance. The chemical signal is parameterized into chemical features by a feature extractor. The output of the feature extractor is delivered to a sub-chemical structure recognizer. A structure preselector receives the prospective sub-structures from the recognizer and consults a dictionary to generate structure candidates. A syntax checker receives the structure candidates and selects the best candidate as being representative of the detected chemical. In case the chemical is a pathogen, suitable alarms can be sent.

With respect to the feature extractor, a wide range of techniques can be used, including the short time energy, the zero crossing rates, the level crossing rates, the filter-bank spectrum, the linear predictive coding (LPC), and the fractal method of analysis. In addition, vector quantization may be utilized in combination with any representation techniques.

A fractal parameter block can further be used alone or in conjunction with others to represent spectral information. Fractals have the property of self similarity as the spatial scale is changed over many orders of magnitude. A fractal function includes both the basic form inherent in a shape and the statistical or random properties of the replacement of that shape in space. As is known in the art, a fractal generator employs mathematical operations known as local affine transformations. These transformations are employed in the process of encoding digital data representing spectral data. The encoded output constitutes a "fractal transform" of the spectral data and consists of coefficients of the affine transformations. Different fractal transforms correspond to different images or sounds. The fractal transforms are iteratively processed in the decoding operation.

Alternatively, a wavelet parameterization block can be used alone or in conjunction with others to generate the parameters. Like the FFT, the discrete wavelet transform (DWT) can be viewed as a rotation in function space, from the input space, or time domain, to a different domain. The DWT consists of applying a wavelet coefficient matrix hierarchically, first to the full data vector of length N, then to a smooth vector of length N/2, then to the smooth-smooth vector of length N/4, and so on. Most of the usefulness of wavelets rests on the fact that wavelet transforms can usefully be severely truncated, that is, turned into sparse expansions. In the DWT parameterization block, the wavelet transform of the chemical signal is performed. The wavelet coefficients is allocated in a non-uniform, optimized manner. In general, large wavelet coefficients are quantized accurately, while small coefficients are quantized coarsely or even truncated completely to achieve the parameterization.

After the feature extraction has been performed, the chemical parameters are next assembled into a multidimensional vector and a large collection of such feature signal vectors can be used to generate a much smaller set of vector quantized (VQ) feature signals by a vector quantizer that cover the range of the larger collection. In addition to reducing the storage space, the VQ representation simplifies the computation for determining the similarity of spectral analysis vectors and reduces the similarity computation to a look-up table of similarities between pairs of codebook vectors. To reduce the quantization error and to increase the dynamic range and the precision of the vector quantizer, the one embodiment partitions the feature parameters into separate codebooks, preferably three. In the one embodiment, the first, second and third codebooks correspond to the cepstral coefficients, the differenced cepstral coefficients, and the differenced power coefficients. The construction of one codebook, which is representative of the others, is described next.

One embodiment uses a binary split codebook to generate the chemical structures in each codebook. In the one embodiment, an M-vector codebook is generated in stages, first with a 1-vector codebook and then splitting the chemical structures into a 2-vector codebook and continuing the process until an M-vector codebook is obtained, where M is preferably 256.

The split vectors in each branch of the tree is compared to each other to see if they are very similar, as measured by a threshold. If the difference is lower than the threshold, the split vectors are recombined. To maintain the tree balance, the most crowded node in the opposite branch is split into two groups, one of which is redistributed to take the space made available from the recombination. Nodes are readjusted to ensure that the tree is properly pruned and balanced. If the desired number of vectors has been reach, the process ends; otherwise, the vectors are split once more.

Generally, the quantization distortion can be reduced by using a large codebook. However, a very large codebook is not practical because of search complexity and memory limitations. To keep the codebook size reasonable while maintaining the robustness of the codebook, fuzzy logic can be used in another embodiment of the vector quantizer.

With conventional vector quantization, an input vector is represented by the chemical structure closest to the input vector in terms of distortion. In conventional set theory, an object either belongs to or does not belong to a set. This is in contrast to fuzzy sets where the membership of an object to a set is not so clearly defined so that the object can be a part member of a set. Data are assigned to fuzzy sets based upon the degree of membership therein, which ranges from 0 (no membership) to 1.0 (full membership). A fuzzy set theory uses membership functions to determine the fuzzy set or sets to which a particular data value belongs and its degree of membership therein.

In one embodiment, a neural network is used to recognize each chemical structure in the codebook as the neural network is quite robust at recognizing chemical structure patterns. Once the chemical features have been characterized, the chemical recognizer then compares the input chemical signals with the stored templates of the vocabulary known by the recognizer. Data from the vector quantizer is presented to one or more recognition models, including an HMM model, a dynamic time warping model, a neural network, a fuzzy logic, or a template matcher, among others. These models may be used singly or in combination. The output from the models is presented to an initial N-gram generator which groups N-number of outputs together and generates a plurality of confusingly similar candidates as initial N-gram prospects. Next, an inner N-gram generator generates one or more N-grams from the next group of outputs and appends the inner trigrams to the outputs generated from the initial N-gram generator. The combined N-grams are indexed into a dictionary to determine the most likely candidates using a candidate preselector. The output from the candidate preselector is presented to a chemical structure N-gram model or a chemical grammar model, among others to select the most likely chemical structure based on the occurrences of other chemical structures nearby.

Dynamic programming obtains a relatively optimal time alignment between the chemical structure to be recognized and the nodes of each chemical model. In dynamic time warping, the input chemical signal A, defined as the sampled time values $A=a(1) \ldots a(n)$, and the vocabulary candidate B, defined as the sampled time values $B=b(1) \ldots b(n)$, are matched up to minimize the discrepancy in each matched pair of samples. Computing the warping function can be viewed as the process of finding the minimum cost path from the beginning to the end of the chemical structures, where the cost is a function of the discrepancy between the corresponding points of the two chemical structures to be compared.

The method of whole-chemical structure template matching has been extended to deal with connected chemical structure recognition. A two-pass dynamic programming algorithm to find a sequence of chemical structure templates which best matches the whole input pattern. In the first pass, a score is generated which indicates the similarity between every template matched against every possible portion of the input pattern. In the second pass, the score is used to find the best sequence of templates corresponding to the whole input pattern.

In one embodiment, the Markov network is used to model a number of chemical sub-structures. The transitions between states are represented by a transition matrix $A=[a(i,j)]$. Each $a(i,j)$ term of the transition matrix is the probability of making a transition to state j given that the model is in state i. The output symbol probability of the model is represented by a set of functions $B=[b(j)(O(t)]$, where the $b(j)(O(t)$ term of the output symbol matrix is the probability of outputting observation $O(t)$, given that the model is in state j. The first state is always constrained to be the initial state for the first time frame of the utterance, as only a prescribed set of left-to-right state transitions are possible. A predetermined final state is defined from which transitions to other states cannot occur. Transitions are restricted to reentry of a state or entry to one of the next two states. Such transitions are defined in the model as transition probabilities. For example, a chemical signal pattern currently having a frame of feature signals in state 2 has a probability of reentering state 2 of $a(2,2)$, a probability $a(2,3)$ of entering state 3 and a probability of $a(2,4)=1-a(2,1)-a(2,2)$ of entering state 4. The probability $a(2,1)$ of entering state 1 or the probability $a(2,5)$ of entering state 5 is zero and the sum of the probabilities $a(2,1)$ through $a(2,5)$ is one. Although the one embodiment restricts the flow graphs to the present state or to the next two states, one skilled in the art can build an HMM model without any transition restrictions, although the sum of all the probabilities of transitioning from any state must still add up to one.

The Markov model is formed for a reference pattern from a plurality of sequences of training patterns and the output symbol probabilities are multivariate Gaussian function probability densities. The chemical signal traverses through the feature extractor. During learning, the resulting feature vector series is processed by a parameter estimator, whose output is provided to the hidden Markov model. The hidden Markov model is used to derive a set of reference pattern templates, each template representative of an identified pattern in a vocabulary set of reference chemical sub-structure patterns. The Markov model reference templates are next utilized to classify a sequence of observations into one of the reference patterns based on the probability of generating the observations from each Markov model reference pattern template. During recognition, the unknown pattern can then be identified as the reference pattern with the highest probability in the likelihood calculator.

The HMM template has a number of states, each having a discrete value. However, because chemical signal features may have a dynamic pattern in contrast to a single value. The addition of a neural network at the front end of the HMM in an embodiment provides the capability of representing states with dynamic values. The input layer of the neural network comprises input neurons. The outputs of the input layer are distributed to all neurons in the middle layer. Similarly, the outputs of the middle layer are distributed to all output states, which normally would be the output layer of the neuron. However, each output has transition probabilities to itself or to the next outputs, thus forming a modified HMM. Each state of the thus formed HMM is capable of responding to a particular dynamic signal, resulting in a more robust HMM. Alternatively, the neural network can be used alone without resorting to the transition probabilities of the HMM architecture.

Although the neural network, fuzzy logic, and HMM structures described above are software implementations, NANO-structures that provide the same functionality can be used. For instance, the neural network can be implemented as an array of adjustable resistors each representing a link to a neuron whose output is summed by an analog summer or adder.

NANO Image Sensors

In another embodiment, the various NANO devices can be integrated into image sensors for capture image information. Common image sensors include Charge Coupled Devices (CCD) and CMOS sensors. NANO devices as described above can be used to act as photo collection components, charge transfer devices (such as CCD registers), and signal amplification devices in the image sensors.

Figure 8:
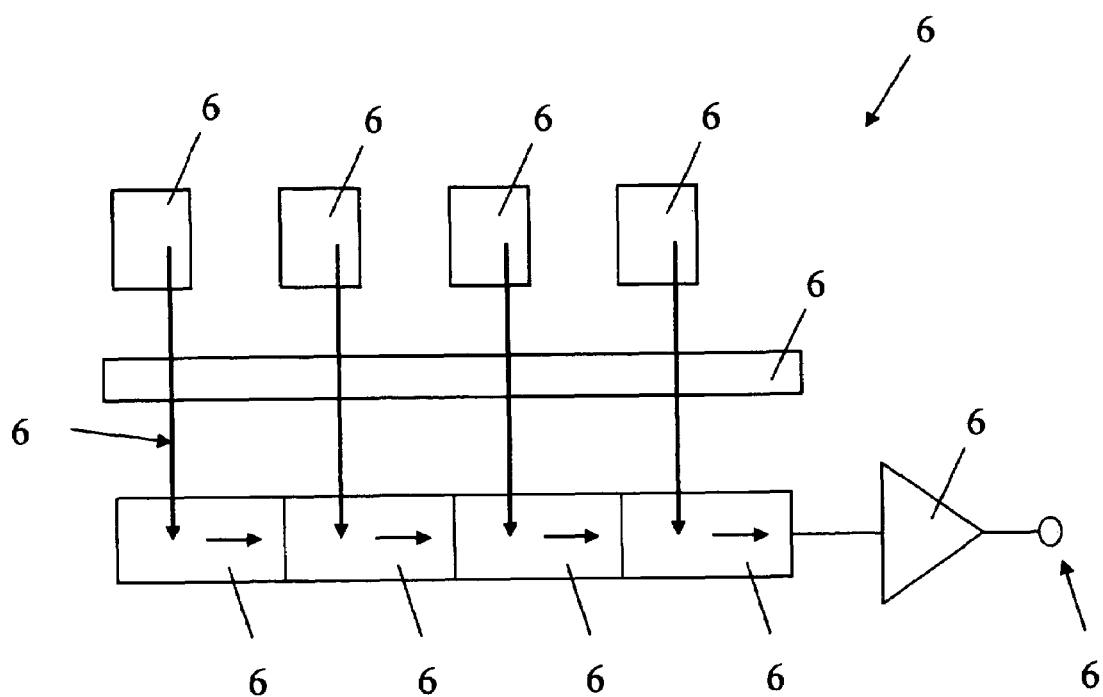
FIG. 8 is an exemplary diagram of an array of NANO-based image sensors in accordance with the present invention.

Taking CCD sensors as an example, CCD image sensors can exist in different architectures such as Linear CCD array, Bi-Linear CCD array, Area CCD Sensor Array, and frame Transfer CCD, etc. The simplest architecture is a linear sensor. As shown in FIG. 8, the linear CCD array 600 consists of a line of photodiodes 601-604, each of which is respectively adjacent to a single CCD readout register 631-634. The charges collected by the photo diodes 601-604 are transferred (610) to CCD registers 631-634 under the control of the transfer gate 620. The charges collected are read out one pixel at a time at output signal 650 after the charge signals are converted to voltage signal by readout amplifier 640.

Although CCD architectures may be different, the basic operations of a CCD sensor all begin with the conversion of photons into electrons. When light is incident on the active area of the image sensor it interacts with the atoms that make up the silicon crystal. The energy transmitted by the light (photons) is used to enable an electron to excite to the conduction band and leaving a hole in the valence band. The more photons incident on the sensor, the more electron-hole pairs that are generated. High energy photons (short wavelengths) on the other hand are absorbed more closely to the surface of the sensor and may not reach the active part of the detector. Hence, there will be a spectrum over which the sensor will operate, falling off at short and long wavelengths.

The number of electrons generated per photon is known as the "quantum efficiency", or QE. The electrons can be separated from the holes in the photo collection areas. The amount of charge collected will depend on the light intensity, its spectrum and the integration time. By setting out a line or a 2D array of photo collection areas, it is possible to build up a representation of the image incident on the sensor.

In accordance with the present invention, a 1D or 2D array of image collection areas are patterned by the NANO-elements made up of single-walled NANOtubes aggregating (e.g., by van der Waals forces) in substantially parallel orientation to form a monolayer extending in directions substantially perpendicular to the orientation of the individual NANOtubes. Such monolayer arrays can be formed by conventional techniques employing "self-assembled monolayers" (SAM) or Langmiur-Blodgett films. NANOtubes 1 are bound to a substrate 2 having a reactive coating 3 (e.g., gold). Typically, SAMs are created on a substrate which can be a metal (such as gold, mercury or ITO (indium-tin-oxide)). The molecules of interest, here the SWNT molecules, are linked (usually covalently) to the substrate through a linker moiety. The linker moiety may be bound first to the substrate layer or first to single-wall NANOtubes ("SWNT") molecule (at an open or closed end) to provide for reactive self-assembly. Langmiur-Blodgett films are formed at the interface between two phases, e.g., a hydrocarbon (e.g., benzene or toluene) and water. Orientation in the film is achieved by employing molecules or linkers that have hydrophilic and lipophilic moieties at opposite ends.

The 1D or 2D array of image collection areas can include photo diodes formed by PN-type junctions discussed in U.S. Application Serial No. 20030200521, the content of which is incorporated herein by reference. The 1D or 2D NANO sensor array can include arrays of crossed nanoscale wires having selectively programmable crosspoints. Nanoscale wires of one array are shared by other arrays, providing signal propagation between the arrays.

The NANO elements can be patterned to form a 2D array for capturing an image-wise energy pattern from photons or energy particles. Each pattern NANO element forms a photo diode with band gap sensitive to the photon energies the image sensor is designed to capture. At regular intervals photo induced charges at each pixel must be emptied and the amount of charge measured to determine the local light intensity. This is accomplished using a CCD register. A measuring device sits at the end of the row, known as the output node.

In another embodiment, the 1D or 2D array of image collection areas can include NANO wires which are capable of capture photons and convert them into photoelectrons. The orientation of the NANO wires can be controlled to maximize the photon detection efficiency. Methods of aligning nanowires are discussed in U.S. Patent Publication 20030186522, the disclosure of which is incorporated hereof by reference.

In accordance with the present invention, the CCD registers and charge readout circuit, the readout amplifiers (for example, 620, 631-634, 640, 650) are fabricated in one or more layers made of semiconductor materials such as silicon and silicon oxide using conventional semiconductor microfabrication technologies. The image sensitive image layer (comprising photo diodes 601-604) patterned with NANO materials is formed over the layers of the semiconductor materials.

The charges in an image collection area, or a pixel, is transferred into a measuring device in the semiconductor layer to produce a signal that depends on the amount of stored charge. The charge transfer is controlled by the transfer gate 620 at a predetermined clock rate. The empty image collection area in the NANO layer is ready for capturing the next image. The downward charge transfer from the NANO photo sensitive layer to the semiconductor charge measuring layer is similar to the frame transfer CCD architecture. Detailed operations of photo induced charge transfers and readout are discussed in U.S. Pat. Nos. 5,946,034 and 6,576,938, the disclosures of which are incorporated hereof by reference.

The NANO-semiconductor CCD device as described above has the following advantages. Since the photon sensing pixels occupy the NANO photo sensitive layer on top, no photon receiving area needs to be wasted for building CCD registers and voltage conversion devices. The effective spatial fraction of image sensing can be maximized to 80-95% range. Another advantage of the NANO-semiconductor CCD device in the present invention is the frame fresh rate is significantly increased because photo induced charges are transfer directly to the CCD registers, rather than cascade transferred between photo charge collection areas. These advantages are critical for fabricating miniature and high speed imaging devices such as digital cameras, digital video cameras, night vision devices, telescope cameras, and microscopic cameras for scientific observations.

In accordance to another embodiment of the present invention, the NANO-semiconductor imaging device can be sensitive to different photo spectrum such red, green, blue, infrared, UV etc. by using color filter arrays (CFA) disposed over the NANO photo sensitive layer. Different CFA patterns include Bayer pattern, interlaced liner pattern etc. The semiconductor layer can further include electronic circuit for constructing color planes from the photo-induced charges filtered by CFA. The electronic circuit can also perform various image processing operations well known in the art. Detailed operations of CFA patterns and improvement are discussed in U.S. Pat. No. 6,366,318, the disclosures of which are incorporated hereof by reference.

In another embodiment, NANO-elements are fabricated above a CMOS image sensor where each pixel contains three transistors: a select transistor, a source follower transistor and a reset transistor. The source follower transistor is connected to a photodiode with a NANO-element formed above the photodiode. Light is collected by the photodiode/NANO-element causes a change in the potential on the photodiode which is read out through the action of the select and source follower transistors. The reset transistor is used to establish a constant potential on the photodiodes prior to the start of exposure to light. In one embodiment, the NANO-element is an FSA assembled geometric structure with a specific optical absorption spectrum, a specific optical transmission spectrum, a specific optical reflection characteristic, or a capability for modifying the polarization of light. In another embodiment, fullerene NANOtubes such as an (n,n) tube can be used in conjunction with other materials can be used to form a Schottky barrier which would act as a light harvesting sensor or antenna. In one embodiment, a (10, 10) tube can be connected via sulfur linkages to gold at one end of the tube and lithium at the other end of the tube forming a natural Schottky barrier. Current is generated through photo conductivity. As the (10, 10) tube acts like an antenna, it pumps electrons into one electrode, but back flow of electrons is prevented by the intrinsic rectifying diode nature of the NANOtube/metal contact. In forming an antenna, the length of the NANOtube can be varied to achieve any desired resultant electrical length. The length of the molecule is chosen so that the current flowing within the molecule interacts with an electromagnetic field within the vicinity of the molecule, transferring energy from that electromagnetic field to electrical current in the molecule to energy in the electromagnetic field. This electrical length can be chosen to maximize the current induced in the antenna circuit for any desired frequency range. Or, the electrical length of antenna element can be chosen to maximize the voltage in the antenna circuit for a desired frequency range. Additionally, a compromise between maximum current and maximum voltage can be designed. More on the fullerene light sensor is disclosed in Application Serial No. 20020150524, the content of which is incorporated by reference.

The NANO image sensor is eventually connected to various other imaging devices such as a stand-alone digital camera (both still and video cameras), and embedded digital cameras (that may be used in cellular phones, personal digital assistants (PDA) and the like). In another example implementation, various imaging devices may be coupled to image sensor package, including digital still cameras, tethered PC cameras, imaging enabled mobile devices (e.g. cell phones, pagers, PDA's and laptop computers), surveillance cameras, toys, machine vision systems, medical devices and image sensors for automotive applications.

In yet another embodiment, an array of electrically conductive carbon NANOtube (CNT) towers are grown directly on the surface of a silicon chip. The CNT towers allow signals captured from a charge-coupled device (CCD) to be transmitted directly to the neural elements of the retina to restore vision. A retinal electrode array with a remote return electrode is provided outside of the eye. An array of stimulating NANO-electrodes is placed on the retinal surface (epiretinally) or under the retina (subretinally) and a relatively large return electrode is placed outside of the sclera and distant from the array of stimulating electrodes. The remote return electrode promotes deeper stimulation of retinal tissue to support vision.

The structures discussed above to recognize chemical substances can be applied to recognize images as well. Such structures include HMMs, neural networks, fuzzy logic, and statistical recognizers, among others.

NANO Displays

Turning now to a different embodiment to display images, the NANO-elements can be light-emitting NANO particles. The production of a robust, chemically stable, crystalline, passivated NANO particle and composition containing the same, that emit light with high efficiencies and size-tunable and excitation energy tunable color is discussed in Application Serial No. 20030003300, the content of which is hereby incorporated b reference. The methods include the thermal degradation of a precursor molecule in the presence of a capping agent at high temperature and elevated pressure. A particular composition prepared by the methods is a passivated silicon NANO particle composition displaying discrete optical transitions. Group IV metals form NANO crystalline or amorphous particles by the thermal degradation of a precursor molecule in the presence of molecules that bind to the particle surface, referred to as a capping agent at high temperature and elevated pressure. In certain embodiments, the reaction may run under an inert atmosphere. In certain embodiments the reaction may be run at ambient pressures. The particles may be robust, chemically stable, crystalline, or amorphous and organic-monolayer passivated, or chemically coated by a mixture of organic molecules. In one embodiment, the particles emit light in the ultraviolet wavelengths. In another embodiment, the particles emit light in the visible wavelengths. In other emobodiments, the particles emit light in the near-infrared and the infrared wavelengths. The particles may emit light with high efficiencies. Color of the light emitted by the particles may be size-tunable and excitation energy tunable. The light emission may be tuned by particle size, with smaller particles emitting higher energy than larger particles. The surface chemistry may also be modified to tune the optical properties of the particles. In one embodiment, the surfaces may be well-passivated for light emission at higher energies than particles with surfaces that are not well-passivated. The average diameter of the particles may be between 1 and 10 nm. A particular composition prepared by the methods is a passivated silicon NANO particle composition displaying discrete optical transitions and photoluminescence.

In another embodiment, a light may be formed having a broad size distribution of silicon NANO particles. The broad size distribution may be advantageous in that the combination of wavelengths emitted by the different size particles may produce a white light. The silicon NANO particles may be embedded in a polymer matrix. The polymer matrix is not, however, necessary for the silicon NANO particles to function effectively as the emissive layer. The size distribution of silicon NANO particles may allow the emission of white light. The NANO particles themselves may emit with size-independent quantum yields and lifetimes. Clusters of NANO particles may produce a broad emission band. If energy transfer occurs between neighboring NANOparticles, it does not result in the selective emission from only the largest particles with the lowest energy gap between the highest occupied and lowest unoccupied molecular orbits (HOMO and LUMO). This situation is qualitatively different than known technology using CdSe NANOparticles.

An embodiment of a basic design for light emitting device includes a first electrode, second electrode, and emissive layer. Emissive layer may include the NANO particles exhibiting discrete optical properties as described herein. Emissive layer may include a polymer wherein the NANO particles may be suspended. However, NANO particle based light emitting devices may not require a polymer to emit, in contrast to many organic LEDs. Polymers may inflict losses through absorption, scattering, and poor electron-hole interfaces. Emissive layer may be positioned adjacent first electrode. First electrode may function as a cathode. Emissive layer may be positioned adjacent second electrode. Second electrode may function as an anode. Substrate may include a transparent conductive oxide layer. Non-limiting examples of the transparent conductive oxide layer may include indium tin oxide, tin oxide, or a translucent thin layer of Ni or Au or an alloy of Ni and Au. The basic design of light emitting devices is described in further detail in U.S. Pat. No. 5,977,565 which is incorporated herein by reference. The NANOparticles may emit light by optical stimulation. In this device, an optical excitation source is used in place of electrical stimulation. However, in another embodiment, a combination of optical excitation and electrical stimulation may be used to enhance device performance, such as overall energy efficiency or perhaps color tenability.

The NANO display device in the present invention can include an array of light-emitting cells disposed in rows and columns and constructed over a substrate. Each light emitting cell comprises a first electrode, a second electrode, and a light-emitting NANO material disposed in the intersecting region between the first electrode and the second electrode. The light-emitting NANO material is capable of emitting light when a voltage is applied between the first electrode and the second electrode. The NANO display device of claim 1, wherein the light-emitting NANO material includes low molecular weight or polymeric organic molecules, and NANO particles formed by semiconductor materials as described below. The light-emitting NANO material can emit photons at one or more wavelengths for example in the Ultra Violet, visible, and infrared spectra. A light emitting diode is formed in each light-emitting cell by the light-emitting NANO material, the first electrode, and the second electrode. A NANO diode can be fabricated using techniques above. The light-emitting cells are insulated by insulation regions so that each light-emitting cell can be individually addressed for light emission.

In another embodiment, a molecule is used as light emitter with two electrodes at a tunneling distance from each other. Such a tunneling distance may as well lie in the subnanometer range as above that range and is the distance which allows a tunneling current to flow between the electrodes. As discussed in U.S. Application Serial 20020096633, the content of which is incorporated by reference, the molecule can have a tertiary-butyl substituted tetracycline with the tetracycline as the central entity and the tertiary butyls as the peripheral entities which are movable with respect to the central entity. The molecule has several stable or metastable conformations depending on the states of its entities. These states are determined by the inner binding forces of the molecule, i.e. between the peripheral entities and the central entity, and the binding forces between the entities and the environment. The molecule is situated preferably on a crystalline substrate which serves as one of the electrodes. Hence, the inner forces of the molecule and the forces towards the substrate determine the conformations. In a first conformation the peripheral entities have a binding force towards tile substrate which dominates over the force between the central entity and the substrate. With other words, the central entity is so far away from the substrate that the force between it and the substrate is weaker than the force between the substrate and the peripheral entities. The binding force between the peripheral entities and the substrate are however sufficiently weak that the molecule is not fixed in its horizontal position. It therefore floats around on the substrate surface at room temperature. Another conformation is dominated by the force between the central entity and the substrate. The central entity is then near enough at the substrate that the binding force holds the central entity to the substrate. In this conformation, the molecule remains in its position, therefore it is also called the pinned conformation. The peripheral entities in this conformation are somehow distorted or bent or more generally moved from their equilibration position, i.e. the position which they had in the first conformation. The holding force between the central entity and the substrate is stronger than eventual restoring forces between the peripheral entities and the central entity which try to form the molecule back to the first conformation. The molecule is immobilized by the combined force between the substrate and the central entity and between the peripheral entities and the substrate. The molecule can be switched between the two stable conformations. The switching is induced by electrical voltage but can also occur through mechanical energy. The switching is reversible. However, also irreversible switching is possible for selected molecule types. When an electrical current is allowed to flow through the substrate, light emission occurs. The substrate may have a predetermined surface structure, namely for a crystalline substrate the crystalline plane in which it lies. Light emission occurs on various planes, such as the $\{111\}$ and the $\{100\}$ plane. Copper, gold or silver are exemplary substrate materials on which the effect can be seen. Other materials for the substrate, such as polycrystalline materials or amorphous materials work as well.

In another embodiment, the light emitter nano-elements can be inorganic nanocrystals. The crystal composition includes a solvent with semiconductor nanoparticles in the solvent, wherein the solvent and the semiconductor nanoparticles are in an effective amount in the liquid crystal composition to form a liquid crystalline phase. The semiconductor nanoparticles can be rod-shaped or disk-shaped, and has an aspect ratio greater than about 2:1 or less than about 1:2. As discussed in Application Serial No. 20030136943, the content of which is incorporated by reference, the nanocrystals are treated as a conventional polymer or biological macromolecule from the assembly point of view. This enables a wide range of chemical macromolecular assembly techniques to be extended to inorganic solids, which possess a diverse range of optical, electrical, and magnetic properties. The optical properties of the semiconductor nanoparticles can depend upon their diameters and lengths. The photoluminescence wavelengths produced by the semiconductor nanoparticles can be tuned over the visible range by variation of the particle size, and the degree of polarization can be controlled by variation of the aspect ratio. Accordingly, by tuning the size of the semiconductor nano particles, the liquid crystal compositions may emit different colors (i.e., different wavelengths of light). For instance, when the semiconductor nano particles in the liquid crystal composition are about 3 nanometers wide and are about 5 nanometers long, the liquid crystal composition can produce green light. When the semiconductor nano particles in the liquid crystal composition are about 3 nanometers wide and are about 60 nanometers long, the liquid crystal composition can produce orange light. When the semiconductor nano particles in the liquid crystal composition are about 4 nanometers wide and about 6 nanometers long, the liquid crystal composition can produce red light. Accordingly, in embodiments of the invention, the optical properties of the liquid crystal composition can be "tuned" by adjusting the size of the nano particles in the liquid crystal composition. Also, because the semiconductor nano particles are aligned in embodiments of the invention, any light that is produced by the aligned semiconductor nano particles can be polarized. The semiconductor nano particles may comprise any suitable semiconductor material. For example, suitable semiconductors include compound semiconductors. Suitable compound semiconductors include Group II-VI semiconducting compounds such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe. Other suitable compound semiconductors include Group III-V semiconductors such as GaAs, GaP, GaAs—P, GaSb, InAs, InP, InSb, AlAs, AlP, and AlSb. The use of Group IV semiconductors such as germanium or silicon may also be feasible under certain conditions.

In another embodiment, a NANO-light emitting faceplate patterned with colored-light-emitting nano pixels having a predetermined size, pattern and spacing, the nano-light color emitters eliminates the need for polarizers and color filters in the Liquid Crystal Displays, which increases the efficiency of light transmission, and increase brightness and contrast, and reduces power consumption. The pattern of nano pixels in patterns for emitting different color light can be achieved a sequence spin coating steps. For example, a layer of green-photon emitting NANO materials is first spin coated over NANO binding areas that is in a 2D pattern as described above. The excess green emitting NANO material is removed. A second pattern of NANO binding materials is formed on the substrate over the areas that is not covered by the green-photon emitting NANO materials. The NANO binding materials at this step may be specific to a blue-photon emitting material that is subsequently spin coated. The excess blue-photon emitting material is removed. A red-photon emitting material is coated finally in similar steps to complete the color emitting pattern for a full color display.

In another embodiment, electronic display can be achieved by modulating reflective index or the orientations of the reflective axes of the NANO-elements on light reflective or refractive surfaces. The modulation of the reflective index of the NANO materials can be driven by a two dimensional array of electrode pairs and driver circuits as in the conventional electronic display system. Each pair of electrodes and the associated NANO material define an image pixel. The reflective index of the NANO materials can be spatially modulated by selectively switching on and off of the electrode pairs at different pixel locations, therefore defining an image-wise pattern. An projective electronic NANO display is obtained by illuminating an uniform light beam across the NANO reflective (or refractive) surfaces. In summary, the NANO display device incldues an array of light-emitting cells disposed in rows and columns and constructed over a substrate. Each light emitting cell comprises a first electrode, a second electrode, and a light-reflective or light-refractive NANO material disposed in the intersecting region between the first electrode and the second electrode. The light-reflective or light-refractive NANO material is capable of deflecting light when a voltage is applied between the first electrode and the second electrode.

The NANO display devices can include driver circuits for driving rows and columns electrodes, digital signal processing units, memory, display mode control, power drivers which are typically found in conventional electronic displays. The NANO display devices can include driver circuits for driving rows and columns electrodes, digital signal processing units, memory, display mode control, power drivers which are typically found in conventional electronic displays. The display component is mounted on an interconnect substrate, usually flex, and electrical connections are made from the edge of the CMOS back plane to the substrate. Finally, the display component is suitably encapsulated, thus providing environmental protection. Plastic encapsulation is typically used in consumer products. The resulting display modules produced in this manner are compact, lightweight, and relatively inexpensive.

The magnification of the image can be accomplished using refractive or reflective lens assemblies that are well known and widely utilized in standard optical projection systems.

NANO Solar Cells

Figure 9:
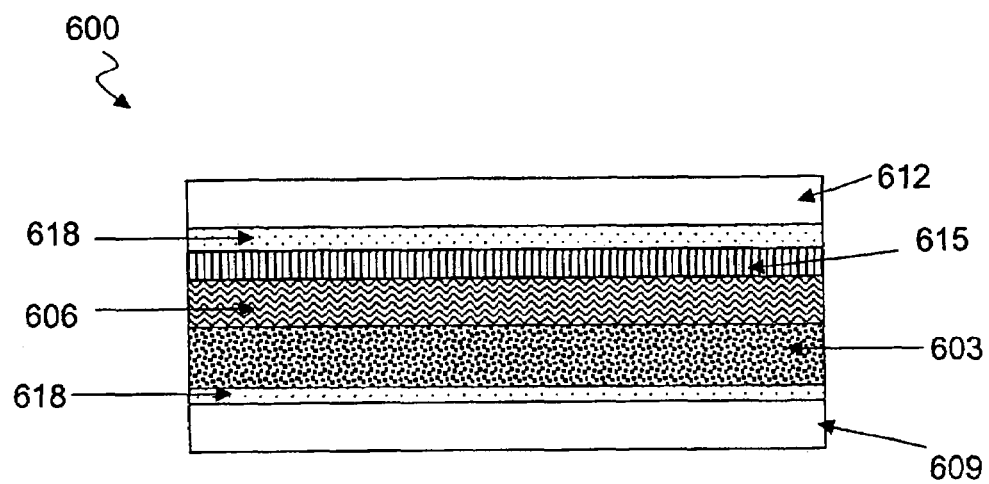
FIG. 9 depicts a cross-sectional view of a flexible photovoltaic cell.

The nano-elements can be used as a solar cell as well. FIG. 9 depicts a flexible photovoltaic cell 600, in accordance with the invention, that includes a photosensitized interconnected nanoparticle material 603 and a charge carrier material 606 disposed between a first flexible, significantly light transmitting substrate 609 and a second flexible, significantly light transmitting substrate 612. In one embodiment, the flexible photovoltaic cell further includes a catalytic media layer 615 disposed between the first substrate 609 and second substrate 612. Preferably, the photovoltaic cell 600 also includes an electrical conductor 618 deposited on one or both of the substrates 609 and 612. The methods of nano particle interconnection provided herein enable construction of the flexible photovoltaic cell 600 at temperatures and heating times compatible with such substrates 609 and 612. The flexible, significantly light transmitting substrates 609 and 612 of the photovoltaic cell 600 preferably include polymeric materials.

Suitable substrate materials include, but are not limited to, PET, polyimide, PEN, polymeric hydrocarbons, cellulosics, or combinations thereof. Further, the substrates 609 and 612 may include materials that facilitate the fabrication of photovoltaic cells by a continuous manufacturing process such as, for example, a roll-to-roll or web process as discussed in U.S. Application Serial No. 20030189402, the content of which is incorporated by reference. The substrate 609 and 612 may be colored or colorless. Preferably, the substrates 609 and 612 are clear and transparent. The substrates 609 and 612 may have one or more substantially planar surfaces or may be substantially non-planar. For example, a non-planar substrate may have a curved or stepped surface (e.g., to form a Fresnel lens) or be otherwise patterned.

An electrical conductor 618 is deposited on one or both of the substrates 609 and 612. Preferably, the electrical conductor 618 is a significantly light transmitting material such as, for example, ITO, a fluorine-doped tin oxide, tin oxide, zinc oxide, or the like. In one illustrative embodiment, the electrical conductor 618 is deposited as a layer between about 100 nm and about 500 nm thick. In another illustrative embodiment, the electrical conductor 618 is between about 150 nm and about 300 nm thick. According to a further feature of the illustrative embodiment, a wire or lead line may be connected to the electrical conductor 618 to electrically connect the photovoltaic cell 600 to an external load.

As noted in Application Serial No. 20030189402, metal oxide nanoparticles are interconnected by contacting the nanoparticles with a suitable polylinker dispersed in a suitable solvent at or below room temperature or at elevated temperatures below about 300° C. The nanoparticles may be contacted with a polylinker solution in many ways. For example, a nanoparticle film may be formed on a substrate and then dipped into a polylinker solution. A nanoparticle film may be formed on a substrate and the polylinker solution sprayed on the film. The polylinker and nanoparticles may be dispersed together in a solution and the solution deposited on a substrate. To prepare nanoparticle dispersions, techniques such as, for example, microfluidizing, attritting, and ball milling may be used. Further, a polylinker solution may be deposited on a substrate and a nanoparticle film deposited on the polylinker. The photosensitized interconnected nanoparticle material 603 may include one or more types of metal oxide nanotubes, as described in detail above. Preferably, the nanotubes contain titanium dioxide particles having an average particle size of about 20 nm. A wide variety of photosensitizing agents may be applied to and/or associated with the nanotubes to produce the photosensitized interconnected nanotube material 603. The photosensitizing agent facilitates conversion of incident visible light into electricity to produce the desired photovoltaic effect. It is believed that the photosensitizing agent absorbs incident light resulting in the excitation of electrons in the photosensitizing agent. The energy of the excited electrons is then transferred from the excitation levels of the photosensitizing agent into a conduction band of the interconnected nanotubes 603. This electron transfer results in an effective separation of charge and the desired photovoltaic effect. Accordingly, the electrons in the conduction band of the interconnected nanotubes are made available to drive an external load electrically connected to the photovoltaic cell. In one illustrative embodiment, the photosensitizing agent is sorbed (e.g., chemisorbed and/or physisorbed) on the interconnected nanotubes 603. The photosensitizing agent may be sorbed on the surfaces of the interconnected nanotubes 603, throughout the interconnected nanotubes 603, or both. The photosensitizing agent is selected, for example, based on its ability to absorb photons in a wavelength range of operation, its ability to produce free electrons (or electron holes) in a conduction band of the interconnected nanotubes 603, and its effectiveness in complexing with or sorbing to the interconnected nanotubes 603. The charge carrier material 606 portion of the photovoltaic cells may form a layer in the photovoltaic cell, be interspersed with the material that forms the photosensitized interconnected nanotube material 603, or be a combination of both. The charge carrier material 606 may be any material that facilitates the transfer of electrical charge from a ground potential or a current source to the interconnected nanotubes 603 (and/or a photosensitizing agent associated therewith). A general class of suitable charge carrier materials can include, but are not limited to solvent based liquid electrolytes, polyelectrolytes, polymeric electrolytes, solid electrolytes, n-type and p-type transporting materials (e.g., conducting polymers), and gel electrolytes.

In another embodiment, nanocrystalline $TiO_2$ is replaced by a monolayer molecular array of short carbon nanotube molecules. The photoactive dye need not be employed since the light energy striking the tubes will be converted into an oscillating electronic current which travels along the tube length. The ability to provide a large charge separation (the length of the tubes in the array) creates a highly efficient cell. A photoactive dye (such as cis-[bisthiacyanato bis(4,4'-dicarboxy-2,2'-bipyridine Ru(II))] can be attached to the end of each nanotube in the array to further enhance the efficiency of the cell. In another embodiment of the present invention, the $TiO_2$ nanostructure described by Grtzel in U.S. Pat. No. 5,084,365 (incorporated herein by reference in its entirety) can serve as an underlying support for assembling an array of SWNT molecules. In this embodiment, SWNTs are attached directly to the $TiO_2$ (by absorptive forces) or first derivatized to provide a linking moiety and then bound to the $TiO.sub.2$ surface. This structure can be used with or without a photoactive dye as described above.

In yet another embodiment, instead of nanotubes, shape-controlled inorganic nanocrystals can be used. Shape-controlled inorganic nanocrystals offer controlled synthesis that allows not only the prediction of a structure based on computer models, but also the prediction of a precise synthetic recipe that produces that exact structure in high-purity and high-yield, with every particle identical to every other particle. Inorganic semiconductor nanocrystals can control variables such as length, diameter, crystallinity, doping density, heterojunction formation and most importantly composition. Inorganic semiconductor nanocrystals can be fabricated from all of the industrially important semiconductor materials, including all of the Group III-V, Group II-VI and Group IV materials and their alloys, as well as the transition metal oxides. Furthermore, the inorganic semiconductor nanostructures can be fabricated such that material characteristics change controllably throughout the nanostructure to engineer additional functionality (i.e. heterostructures) and complexity into the nanostructure. As discussed in U.S. Application Serial No. 20030145779, three dimensional tetrapods may be important alternatives to nanocrystal fibers and rods as additives for mechanical reinforcement of polymers (e.g., polymeric binders including polyethylene, polypropylene, epoxy functional resins, etc.). Tetrapod shaped nanocrystal particles, for example, can interlock with each other and can serve as a better reinforcing filler in a composite material (e.g., with a binder), than for example, nanospheres. The nanocrystal particles can be mixed with the binder using any suitable mixing apparatus. After the composite material is formed, the composite material can be coated on a substrate, shaped, or further processed in any suitable manner.

An exemplary photovoltaic device may have nanocrystal particles in a binder. This combination can then be sandwiched between two electrodes (e.g., an aluminum electrode and an indium tin oxide electrode) on a substrate to form a photovoltaic device. Two separate mixtures can be used: one containing inorganic semiconductors made of cadmium selenide (CdSe) nanorod molecules and one containing the organic polymer to be blended with the nanorods. The mixtures are then combined and spin-cast at room temperature to produce an even film of nanorods that's approximately 200 nanometers thick—about a thousandth the thickness of a human hair. Tetrapods also have independent tunability of the arm length and the band gap, which is attractive for nanocrystal based solar cells or other types of photovoltaic devices. In comparison to nanocrystal particles that are randomly oriented, the tetrapods are aligned and can provide for a more unidirectional current path than randomly oriented nanocrystal particles.

In one embodiment, each flexible photovoltaic cell further includes one or more flexible light-transmitting substrates, a photosensitized interconnected nanoparticle material, and an electrolyte redox system. In general, the nanotube material and the electrolyte redox system are both disposed between the first and second substrates. The flexible base may be the first significantly light-transmitting substrate of the flexible photovoltaic cell. In one embodiment, the flexible photovoltaic cell further includes a photosensitized nanomatrix layer and a charge carrier medium. The photovoltaic cell may energize the display element directly, or may instead charge a power source in electrical communication with the display element. The display apparatus may further include an addressable processor and/or computer interface, operably connected to the at least one photovoltaic cell, for controlling (or facilitating control of) the display element.

"Semiconductor-nanocrystal" includes semiconducting crystalline particles of all shapes and sizes. They can have at least one dimension less than about 100 nanometers, but they are not so limited. Rods may be of any length. "Nanocrystal", "nanorod" and "nanoparticle" can and are used interchangeably herein. In some embodiments of the invention, the nanocrystal particles may have two or more dimensions that are less than about 100 nanometers. The nanocrystals may be core/shell type or core type. For example, some branched nanocrystal particles according to some embodiments of the invention can have arms that have aspect ratios greater than about 1. In other embodiments, the arms can have aspect ratios greater than about 5, and in some cases, greater than about 10, etc. The widths of the arms may be less than about 200, 100, and even 50 nanometers in some embodiments. For instance, in an exemplary tetrapod with a core and four arms, the core can have a diameter from about 3 to about 4 nanometers, and each arm can have a length of from about 4 to about 50, 100, 200, 500, and even greater than about 1000 nanometers. Of course, the tetrapods and other nanocrystal particles described herein can have other suitable dimensions. In embodiments of the invention, the nanocrystal particles may be single crystalline or polycrystalline in nature.

IC Packaging

The foregoing electronic devices are generally housed in a package including a chip with a plurality of chip pads formed on the chip as input/output ports for a variety of signals. A lead frame includes a plurality of contact points which are electrically connected to the chip pads to receive the variety of signals from or to output the same to an external circuit. Further, bonding wires electrically connect each chip pad to its respective contact points on the lead frame. The bonding wires comprise one or more of nano material such as Fullerene molecules, nanotubes, nanowires, nanocomposite material, nanostructured carbon material as described below.

The structure of the package is protected by, for example, a nano-ceramic power compound or resin as described below to remove heat.

Fullerene molecular wires are used to replace conventional bonding wires. In one embodiment, the bonding wires can be FSAs or selfassembly assisted by binding to FSA or fullerene nano-wires. Choice of FSAs can also enable self-assembly of compositions whose geometry imparts useful chemical or electrochemical properties including operation as a catalyst for chemical or electrochemical reactions, sorption of specific chemicals, or resistance to attack by specific chemicals, energy storage or resistance to corrosion. Examples of biological properties of FSA self-assembled geometric compositions include operation as a catalyst for biochemical reactions; sorption or reaction site specific biological chemicals, agents or structures; service as a pharmaceutical or therapeutic substance; interaction with living tissue or lack of interaction with living tissue; or as an agent for enabling any form of growth of biological systems as an agent for interaction with electrical, chemical, physical or optical functions of any known biological systems.

FSA assembled geometric structures can also have useful mechanical properties which include but are not limited to a high elastic to modulus weight ratio or a specific elastic stress tensor. Self-assembled structures, or fullerene molecules, alone or in cooperation with one another (the collective set of alternatives will be referred to as "molecule/structure") can be used to create devices with useful properties. For example, the molecule/structure can be attached by physical, chemical, electrostatic, or magnetic means to another structure causing a communication of information by physical, chemical, electrical, optical or biological means between the molecule/structure and other structure to which the molecule/structure is attached or between entities in the vicinity of the molecule/structure. Examples include, but are not limited to, physical communication via magnetic interaction, chemical communication via action of electrolytes or transmission of chemical agents through a solution, electrical communication via transfer of electronic charge, optical communication via interaction with and passage of any form with biological agents between the molecule/structure and another entity with which those agents interact.

The bonding wires can also act as antennas. For example, the lengths, location, and orientation of the molecules can be determined by FSAs so that an electromagnetic field in the vicinity of the molecules induces electrical currents with some known phase relationship within two or more molecules. The spatial, angular and frequency distribution of the electromagnetic field determines the response of the currents within the molecules. The currents induced within the molecules bear a phase relationship determined by the geometry of the array. In addition, application of the FSAs could be used to facilitate interaction between individual tubes or groups of tubes and other entities, which interaction provides any form of communication of stress, strain, electrical signals, electrical currents, or electromagnetic interaction. This interaction provides an "interface" between the self-assembled NANO structure and other known useful devices. In forming an antenna, the length of the NANOtube can be varied to achieve any desired resultant electrical length. The length of the molecule is chosen so that the current flowing within the molecule interacts with an electromagnetic field within the vicinity of the molecule, transferring energy from that electromagnetic field to electrical current in the molecule to energy in the electromagnetic field. This electrical length can be chosen to maximize the current induced in the antenna circuit for any desired frequency range. Or, the electrical length of an antenna element can be chosen to maximize the voltage in the antenna circuit for a desired frequency range. Additionally, a compromise between maximum current and maximum voltage can be designed. A Fullerene NANOtube antenna can also serve as the load for a circuit. The current to the antenna can be varied to produce desired electric and magnetic fields. The length of the NANOtube can be varied to provide desired propagation characteristics. Also, the diameter of the antenna elements can be varied by combining an optimum number of strands of NANOtubes. Further, these individual NANOtube antenna elements can be combined to form an antenna array. The lengths, location, and orientation of the molecules are chosen so that electrical currents within two or more of the molecules act coherently with some known phase relationship, producing or altering an electromagnetic field in the vicinity of the molecules. This coherent interaction of the currents within the molecules acts to define, alter, control, or select the spatial, angular and frequency distributions of the electromagnetic field intensity produced by the action of these currents flowing in the molecules. In another embodiment, the currents induced within the molecules bear a phase relationship determined by the geometry of the array, and these currents themselves produce a secondary electromagnetic field, which is radiated from the array, having a spatial, angular and frequency distribution that is determined by the geometry of the array and its elements. One method of forming antenna arrays is the self-assembly monolayer techniques discussed above.

Various molecules or NANO-elements can be coupled to one or more electrodes in a layer of an IC substrate using standard methods well known to those of skill in the art. The coupling can be a direct attachment of the molecule to the electrode, or an indirect attachment (e.g. via a linker). The attachment can be a covalent linkage, an ionic linkage, a linkage driven by hydrogen bonding or can involve no actual chemical attachment, but simply a juxtaposition of the electrode to the molecule. In some one embodiments, a "linker" is used to attach the molecule(s) to the electrode. The linker can be electrically conductive or it can be short enough that electrons can pass directly or indirectly between the electrode and a molecule of the storage medium. The manner of linking a wide variety of compounds to various surfaces is well known and is amply illustrated in the literature. Means of coupling the molecules will be recognized by those of skill in the art. The linkage of the storage medium to a surface can be covalent, or by ionic or other non-covalent interactions. The surface and/or the molecule(s) may be specifically derivatized to provide convenient linking groups (e.g. sulfur, hydroxyl, amino, etc.). In one embodiment, the molecules or NANO-elements self-assemble on the desired electrode. Thus, for example, where the working electrode is gold, molecules bearing thiol groups or bearing linkers having thiol groups will self-assemble on the gold surface. Where there is more than one gold electrode, the molecules can be drawn to the desired surface by placing an appropriate (e.g. attractive) charge on the electrode to which they are to be attached and/or placing a "repellant" charge on the electrode that is not to be so coupled.

The FSA bonding wires can be used alone or in conjunction with other elements. A first group of elements includes palladium (Pd), rhodium (Rh), platinum (Pt), and iridium (Ir). As noted in U.S. Patent Application Serial No. 20030209810, in certain situations, the chip pad is formed of aluminum (Al). Accordingly, when a gold-silver (Au—Ag) alloy bonding wire is attached to the chip pad, the Au of the bonding wire diffuses into the chip pad, thereby resulting in a void near the neck. The nano-bonding wire, singly or in combination with the elements of the first group form a barrier layer in the interface between a Au-rich region (bonding wire region) and an Al-rich region (chip pad region) after wire bonding, to prevent diffusion of Au and Ag atoms, thereby suppressing intermetallic compound and Kirkendall void formation. As a result, a reduction in thermal reliability is prevented.

Nano-bonding wires can also be used singly or in combination with a second group of elements that includes boron (B), beryllium (Be), and calcium (Ca). The elements of the second group enhances tensile strength at room temperature and high temperature and suppresses bending or deformation of loops, such as sagging or sweeping, after loop formation. When an ultra low loop is formed, the elements of the second group increase yield strength near the ball neck, and thus reduce or prevent a rupture of the ball neck. Especially, when the bonding wire has a small diameter, a brittle failure near the ball neck can be suppressed.

Nano-bonding wires can also be used singly or in combination with a third group of elements that includes phosphorous (P), antimony (Sb), and bismuth (Bi). The elements of the third group are uniformly dispersed in a Au solid solution to generate a stress field in the gold lattice and thus to enhance the strength of the gold at room temperature. The elements of the third group enhance the tensile strength of the bonding wire and effectively stabilize loop shape and reduce a loop height deviation.

Nano-bonding wires can also be used singly or in combination with a fourth group of elements that includes magnesium (Mg), thallium (Tl), zinc (Zn), and tin (Sn). The elements of the fourth group suppress the grain refinement in a free air ball and soften the ball, thereby preventing chip cracking, which is a problem of Au—Ag alloys, and improving thermal reliability.

The nano-bonding wires provide superior electrical characteristics as well as mechanical strength in wire bonding applications. In a wire bonding process, one end of the nano bonding wire is melted by discharging to form a free air ball of a predetermined size and pressed on the chip pad to be bound to the chip pad. A loop of the nano bonding wire having an appropriate height and length is formed to reach a corresponding lead frame, and the other end of the bonding wire is bound to the lead frame with an application of pressure. As a result, the chip and the lead frame are electrically connected. For low cost production, the chip can be embedded inside a suitable epoxy. Alternatively, the chip can be embedded in a plastic flexible substrate that can interconnect a number of other chips. For example, in a plastic flexible credit card, a solar cell is mounted, printed or suitably positioned at a bottom layer to capture photons and convert the photons into energy to run the credit card operation. Display and processor electronics are then mounted or on a plastic substrate. A transceiver chip with nano antennas is also mounted or printed on the plastic substrate.

For high performance applications that generate large amounts of heat such as processor chips, the resulting chip is then bonding to a nano-ceramic housing to maximize heat radiation and to control chip temperature.

As discussed in U.S. Application Serial No 20040029706, the content of which is incorporated by reference, methods are disclosed for using ceramic nanocomposites in applications requiring thermal barrier materials and in applications requiring material properties selected from the group consisting of thermally insulating, electrically conducting, mechanically robust, and combinations thereof. However, for certain electrical applications, thermal conductance is required.

In one embodiment of the present system, a heat conducting ceramic nanocomposite for removing unwanted heat is made with a ceramic host material and a nanostructured carbon material selected from the group consisting of carbon nanotubes, single-wall carbon nanotubes, vapor grown carbon fibers, fullerenes, buckyballs, carbon fibrils, buckyonions, metallofullerenes, endohedral fullerenes, and combinations thereof. In some embodiments, the nanostructured carbon material serves to increase the thermal conductivity of the ceramic host. In some embodiments, it does this by serving as a phonon concentrating center. In other embodiments, it increases the thermal conductivity by altering the structure of the ceramic host. In some embodiments of the present system, at least some of the nanostructured carbon material present imparts greater structural integrity to the ceramic host. A ceramic nanocomposite, according to the present system, can exist in the form of coatings, bulk objects, and combinations thereof. The ceramic host of the nanocomposite of the present system can be any ceramic which suitably provides for the nanocomposite material of the present system. Suitable ceramics include, but are not limited to, zirconia, alumina, silica, titania, yttria, ceria, boron nitride, carbon nitride, silicon nitride, silicon carbide, tantalum carbide, tungsten carbide, and combinations thereof. In some embodiments, the nanostructured carbon material comprises single-wall carbon nanotubes which may, or may not, be in the form of short "pipes." In some embodiments, the nanostructured carbon material is modified by a chemical means to yield derivatized nanostructured carbon material. Here, "derivatization" is taken to mean attachement of other chemical entities to the nanostructured carbon material. This attachement may be by chemical or physical means including, but not limited to, covalent bonding, van der Waals forces, electrostatic forces, physical entanglement, and combinations thereof. In other embodiments, the nanostructured carbon material is modified by a physical means selected from the group consisting of plasma treatment, heat treatment, ion bombardment, attrition by impact, milling and combinations thereof. In other embodiments, the nanostructured carbon material is modified by a chemical means selected from the group consisting of chemical etching by acids either in liquid or gaseous form, chemical etching by bases either in liquid or gaseous form, electrochemical treatments, and combinations thereof.

In another embodiment, the chip substrate can be in contact with several thin-film thermoelectric elements placed in parallel to heat or cool a particular area depending on the direction of current flow in these elements. Each thermoelectric nano-element has an n-type thermoelectric material, a p-type thermoelectric material located adjacent to the n-type thermoelectric material, a Peltier contact connecting the n-type thermoelectric material to the p-type thermoelectric material.

Electrodes contact both a side of the n-type thermoelectric material opposite the Peltier contact and a side of the p-type thermoelectric material opposite the Peltier contact. Appropriately biased electrical current flow through selected ones of the thermoelectric elements makes the Peltier contact either a heated junction or a cooled junction. In another embodiment, only one leg of the thermoelectric element is required to produce heating or cooling. In this embodiment, a selected type of thermoelectric material (i.e. n-type or p-type) is utilized with the Peltier contact. Current flow in a first direction through an electrode, a thermoelectric material, the Peltier contact, and a subsequent electrode results in a heated junction at the Peltier contact. A current flow in a second direction opposite to the first produces a cooled junction at the Peltier contact. As disclosed in U.S. Patent Application No. 20020174660, the content of which is incorporated by reference, a cantilever similar to arrangements known in the art for atomic force microscopy (AFM) can be used. The integration of a thermoelectric cooling/heating device or module with a cantilever, especially the cantilevers similar to those used in AFM, provides for "nanometer-size temperature control" of bio-tissues, cells, and perhaps other atomic-scale structures in nano technology such as for example nano-self-assembly.

In some embodiments of the present system, a method for making ceramic nanocomposites comprising a nanostructured carbon component and a ceramic host component includes preparing a slurry comprising ceramic particles and solvent; and adding nanostructured carbon materials such that they become dispersed in the slurry. The solvent used to prepare the slurry can be selected from the group consisting of aqueous solvents, non-aqueous solvent, and combinations thereof. Such solvents include, but are not limited to, water, toluene, ethyl alcohol, trichloroethylene, methyl ethyl ketone, and combinations thereof. In some embodiments, the step of preparing the slurry further comprises adding a dispersal agent. Such dispersal agents include, but are not limited to, natural formulations, synthetic formulations, polyelectrolyte dispersants, surfactants, wrapping polymers, and combinations thereof. In some embodiments, the step of preparing the slurry further comprises adding binding agents and/or plasticizers.

In some embodiments of the present system, the adding the nanostructured carbon materials (note that this step can be combined with the step of preparing the slurry) to the slurry further comprises the utilization of dispersion assistance to facilitate dispersion. In some embodiments, this step further comprises a milling operation, and possibly a nanomilling operation. In some embodiments of the present system, the slurry is shaped by a casting technique. Suitable casting techniques include, but are not limited to, tape casting, spin casting, solid casting, slip casting, robocasting, and combinations thereof. In some embodiments, the step of shape-forming comprises a gel casting technique. Here, a "sol-gel" technique is one which provides for a ceramic component first as a solution or "sol" of precursors which is hydrolyzed and polymerized into a "gel." Thus, the term, "sol-gel" represents the material at any stage of its transformation from a solution to a gel. The method of making coatings and objects can also include spraying these ceramic nanocomposite powders with a technique selected from the group consisting of plasma spraying, thermal spraying, powder spraying, electrostatically-assisted powder spraying, and combinations thereof.

In various embodiments, nano-elements can be formed in conjunction with nano-sized materials include, but are not limited to, ceramics, intermetallics, and metals. Other examples of nano-sized materials according to embodiments of the present invention include coated and encapsulated materials. Ceramic materials and intermetallics are often used to enhance, for example, the high-temperature mechanical strength of the nanocomposite material. In some embodiments the ceramic comprises an oxide, such as, for example, an oxide comprising at least one of aluminum, yttrium, zirconium, and cerium. In other embodiments, the ceramic comprises at least one of a carbide, a nitride, and a boride. In still other embodiments, the intermetallic comprises a silicide. In certain embodiments where the nano-sized material comprises a metal, the nano-sized metal has a melting temperature higher than that of the molten material such that the nano-sized metal remains substantially inert with respect to the molten metal. Metals with high melting points, for example, tungsten, are suitable as nano-sized materials for embodiments of this type. It will be appreciated by those skilled in the art that the choice of any specific combination of molten material and nano-sized material is based upon the combination of properties desired for the resultant nanocomposite material, including, but not limited to, physical, chemical, mechanical, electrical, magnetic, and thermal properties.

In one embodiment, an electronic device is formed with a nanocomposite material. The method includes providing a molten material; providing a nano-sized electronic device along with other nano-material, the nano-sized electronic device/material being substantially inert with respect to the molten material; introducing the nano-sized material into the molten material; dispersing the nano-sized material within the molten material using at least one dispersion technique selected from the group consisting of agitating the molten material using ultrasonic energy to disperse the nano-sized material within the molten material; introducing at least one active element into the molten material to enhance wetting of the nano-sized material by the molten material; and coating the nano-sized material with a wetting agent to promote wetting of the molten metal on the nano-sized material; and solidifying the molten material to form a solid nanocomposite material, the nanocomposite material comprising a dispersion of the nano-sized material within a solid matrix. Additional materials include those noted in U.S. Application Serial No. 20040016318, the content of which is incorporated by reference. The electronic devices self-assemble inside the matrix after the dispersion. Such a nano-composite material with built-in transistors, processors, memories and other electronics forms intelligent articles such as medical prostheses, smart clothing, smart appliances and smart vehicles and smart robots, among others. These articles in turn are powered by nano fuel cells.

The resulting composite material can be a nanocomposite magnet, a magnetic refrigerator element, an abrasion resistant surface coat, a higher-order structure piezoelectric element composed of a mixture of piezoelectric materials different in frequency response property, a heating element, a higher-order structure dielectric displaying the characteristics over a wide range of temperature, a photocatalyst material and the induction material thereof, a functional surface coat composed of a mixture of materials having such properties as the water holding property, hydrophilicity, and water repellency, a minute machine part, an abrasion resistant coat for a magnetic head, an electrostatic chuck, a sliding member material, an abrasion resistant coat of a die and mending the abraded and chipped parts thereof, an insulating coat of an electrostatic motor, an artificial bone, an artificial dental root, a condenser, an electronic circuit part, an oxygen sensor, an oxygen pump, a sliding part of a valve, a distortion gauge, a pressure-sensitive sensor, a piezoelectric actuator, a piezoelectric transformer, a piezoelectric buzzer, a piezoelectric filter, an optical shutter, an automobile knock sensor, a supersonic sensor, an infrared sensor, an antivibration plate, a cutting machining tool, a surface coat of a copying machine drum, a polycrystalline solar cell, a dye sensitization type solar cell, a surface coat of a kitchen knife or a knife, the ball of a ball point pen, a temperature sensor, the insulation coat of a display, a superconductor thin film, a Josephson element, a super plastic structure body, a ceramic heating element, a microwave dielectric, a water-repellent coat, an antireflection film, a heat ray reflecting film, a UV absorbing film, an inter-metal dielectric layer (IMD), a shallow trench isolation (STI), and the like. In various embodiments, nano-elements such as FSAs are used as fillers in a variety of pure phase materials such as polymers that are now readily available at low cost. The nanofiller may be mixed with a monomer, which is then polymerized to form a polymer matrix composite. In another embodiment, the nanofiller may be mixed with a matrix powder composition and compacted to form a solid composite. In yet another embodiment, the matrix composition may be dissolved in a solvent and mixed with the nanofiller, and then the solvent may be removed to form a solid composite. In still another embodiment, the matrix may be a liquid or have liquid like properties. The nano-fillers improve the properties of the low cost pure phase materials including, for example, electrical conductivity, magnetic permeability, dielectric constant, and thermal conductivity. A matrix is blended with a filler material with desirable properties that can include refractive index, transparency to light, reflection characteristics, resistivity, permittivity, permeability, coercivity, B—H product, magnetic hysteresis, breakdown voltage, skin depth, curie temperature, dissipation factor, work function, band gap, electromagnetic shielding effectiveness, radiation hardness, chemical reactivity, thermal conductivity, temperature coefficient of an electrical property, voltage coefficient of an electrical property, thermal shock resistance, biocompatibility, and/or wear rate. The desired material property is selected from the group consisting of refractive index, transparency to light, reflection characteristics, resistivity, permittivity, permeability, coercivity, B—H product, magnetic hysteresis, breakdown voltage, skin depth, curie temperature, dissipation factor, work function, band gap, electromagnetic shielding effectiveness, radiation hardness, chemical reactivity, thermal conductivity, temperature coefficient of an electrical property, voltage coefficient of an electrical property, thermal shock resistance, biocompatibility and wear rate. The nanostructured filler may comprise one or more elements selected from the s, p, d, and f groups of the periodic table, or it may comprise a compound of one or more such elements with one or more suitable anions, such as aluminum, antimony, boron, bromine, carbon, chlorine, fluorine, germanium, hydrogen, indium, iodine, nickel, nitrogen, oxygen, phosphorus, selenium, silicon, sulfur, or tellurium. The matrix may be a polymer (e.g., poly(methyl methacrylate), poly(vinyl alcohol), polycarbonate, polyalkene, or polyaryl), a ceramic (e.g., zinc oxide, indium-tin oxide, hafnium carbide, or ferrite), or a metal (e.g., copper, tin, zinc, or iron). Other filler materials include those in Application Serial No. 20030207978, the content of which is incorporated by reference.

NANO Energy Source

Figure 10:
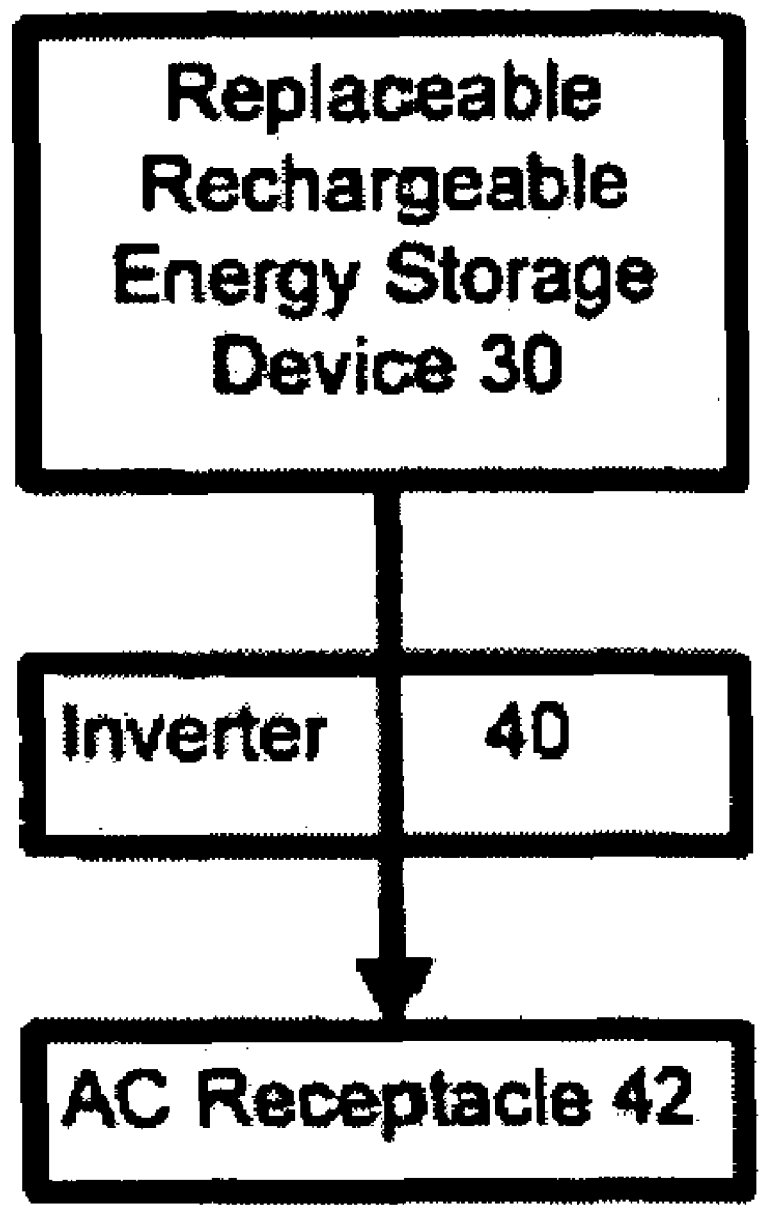
FIG. 10 shows an exemplary fuel cell.

FIG. 10 shows one embodiment of a mobile power unit 1. The unit 1 has one or more fuel cells 30. The output of the fuel cells is direct current (DC) which is provided to an inverter 40 for generating AC voltages to operate mobile equipment. Since the fuel cell 30 compactly stores large quantity of energy, the entire mobile power unit 1 is approximately the size of a cigarette pack and yet can power AC equipment in the field for days. When the fuel cells 30 are depleted, they can be refueled in situ, thus allowing the AC equipment to operate without interruption.

Fuel cells enable the electrochemical conversion of fuel gases and oxygen into oxidized products and electrical energy. The difference from traditional chemical processes consists of performing reduction and oxidation of the components, separately, at two electrodes. Chemical reaction of the reactants at the electrodes occurs because ionic conduction is ensured via a gas-tight electrolyte, and the transport of electrons takes place only via an external circuit. The hydrogen is obtained from fossil fuels. Typical representatives of these fuels are natural gas, methanol and aliphatic or aromatic hydrocarbons, as well as mixtures thereof, such as, for example, petrol and diesel oil. In principle, it is also possible to produce the hydrogen-containing fuel gas biologically and directly as synthesis gas and to work it up in an appropriate manner for use in a fuel cell. Methanol can also be produced biologically, for example, with the aid of methylotrophic yeasts.

In one embodiment, the cell 30 stores hydrogen which has previously been produced from electricity and water. The cell 30 is a cost-effective and pollution-free energy storage device. Different types of fuel cells including proton exchange membranes, solid oxides, high temperature fuel cells, and regenerative fuel cells can be used. In one emdodiment, a proton exchange membrane (PEM) fuel cell includes an anode, a cathode, and a selective electrolytic membrane disposed between the two electrodes. In a catalyzed reaction, a fuel such as hydrogen is oxidized at the anode to form cations (protons) and electrons. The ion exchange membrane facilitates the migration of protons from the anode to the cathode. The electrons cannot pass through the membrane and are forced to flow through an external circuit thus providing an electrical current. At the cathode, oxygen reacts at the catalyst layer, with electrons returned from the electrical circuit, to form anions. The anions formed at the cathode react with the protons that have crossed the membrane to form liquid water as the reaction product. Typically, a combustion reaction is not involved. Accordingly, fuel cells are clean and efficient.

The hydrogen in the fuel cell 30 can also move through an active transport membrane (ATM). In the ATM embodiment, the fuel cell 30 employs molecules used in biological processes to create fuel cells that operate at moderate temperatures and without the presence of harsh chemicals maintained at high temperatures, which can lead to corrosion of the cell components. The compact, inert energy sources can be used to provide short duration electrical output. Since the materials retained within the fuel cells are non-corrosive and typically not otherwise hazardous, it is practical to recharge the fuel cells with fuel, with the recharging done by the user. Alternatively, the fuel cells 30 can be electrically re-charged.

In one embodiment, the fuel cell includes a first compartment with an electron carrier in communication with redox enzymes to deliver electrons to a first electrode; a second compartment having an electron receiving composition in chemical communication with a second electrode, and a barrier separating the first compartment from the second compartment; said barrier having embedded proton transporting proteins effective to transport protons from the first compartment to the second compartment. During operation, an electrical current flows along a conductive pathway formed between the first electrode and the second electrode.

The first compartment can include an electron transfer mediator that transfers electrons from the redox enzymes to the first electrode. The proton transporting proteins include redox enzyme activity. A reservoir can be used for supplying to the vicinity of at least one of the electrodes a component consumed in the operation of the fuel cell and a pump for drawing such component to that vicinity.

As discussed in U.S. Pat. No. 6,500,571, the content of which is incorporated by reference, examples of particularly preferred enzymes providing one or both of the oxidation/reduction and proton pumping functions include, for example, NADH dehydrogenase (e.g., from *E. coli.* Tran et al., "Requirement for the proton pumping NADH dehydrogenase I of *Escherichia coli* in respiration of NADH to fumarate and its bioenergetic implications," Eur. J. Biochem. 244: 155, 1997), NADPH transhydrogenase, proton ATPase, and cytochrome oxidase and its various forms. Methods of isolating such an NADH dehydrogenase enzyme are described in detail, for example, in Braun et al., Biochemistry 37: 1861-1867, 1998; and Bergsma et al., "Purification and characterization of NADH dehydrogenase from *Bacillus subtilis*," Eur. J. Biochem. 128: 151-157, 1982. The lipid bilayer can be formed across the perforations 49 and enzyme incorporated therein by, for example, the methods described in detail in Niki et al., U.S. Pat. No. 4,541,908 (annealing cytochrome C to an electrode) and Persson et al., J. Electroanalytical Chem. 292: 115, 1990. Such methods can comprise the steps of: making an appropriate solution of lipid and enzyme, where the enzyme may be supplied to the mixture in a solution stabilized with a detergent; and, once an appropriate solution of lipid and enzyme is made, the perforated dielectric substrate is dipped into the solution to form the enzyme-containing lipid bilayers. Sonication or detergent dilution may be required to facilitate enzyme incorporation into a bilayer. See, for example, Singer, Biochemical Pharmacology 31: 527-534, 1982; Madden, "Current concepts in membrane protein reconstitution," Chem. Phys. Lipids 40: 207-222, 1986; Montal et al., "Functional reassembly of membrane proteins in planar lipid bilayers," Quart. Rev. Biophys. 14: 1-79, 1981; Helenius et al., "Asymmetric and symmetric membrane reconstitution by detergent elimination," Eur. J. Biochem. 116: 27-31, 1981; Volumes on biomembranes (e.g., Fleischer and Packer (eds.)), in Methods in Enzymology series, Academic Press.

Using enzymes having both the oxidation/reduction and proton pumping functions, and which consume electron carrier, the acidification of the fuel side caused by the consumption of electron carrier is substantially offset by the export of protons. Net proton pumping in conjunction with reduction of an electron carrier can exceed 2 protons per electron transfer (e.g., up to 3 to 4 protons per electron transfer). Accordingly, in some embodiments care must be taken to buffer or accommodate excess de-acidification on the fuel side or excess acidification of the product side. Alternatively, the rate of transport is adjusted by incorporating a mix of redox enzymes, some portion of which enzymes do not exhibit coordinate proton transport. In some embodiments, care is taken especially on the fuel side to moderate proton export to match proton production. Acidification or de-acidification on one side or another of the fuel cell can also be moderated by selecting or mixing redox enzymes to provide a desired amount of proton production. Of course, proton export from the fuel side is to a certain degree self-limiting, such that in some embodiments the theoretical concern for excess pumping to the product side is of, at best, limited consequence. For example, mitochondrial matrix proteins which oxidize electron carriers and transport protons operate to create a substantial pH gradient across the inner mitochondrial membrane, and are designed to operate as pumping creates a relatively high pH such as pH 8 or higher. (In some embodiments, however, care is taken to keep the pH in a range closer to pH 7.4, where many electron carriers such as NADH are more stable.) Irrespective of how perfectly proton production is matched to proton consumption, the proton pumping provided by this embodiment of the invention helps diminish loses in the electron transfer rate due to a shortfall of protons on the product side. In some embodiments, proton pumping is provided by a light-driven proton pump such as bacteriorhodopsin. Recombinant production of bacteriorhodopsin is described, for example, in Nassal et al., J. Biol. Chem. 262: 9264-70, 1987. All trans retinal is associated with bacteriorhodopsin to provide the light-absorbing chromophore. Light to power this type of proton pump can be provided by electronic light sources, such as LEDs, incorporated into the fuel cell and powered by a (i) portion of energy produced from the fuel cell, or (ii) a translucent portion of the fuel cell casing that allows light from room lighting or sunlight to impinge the lipid bilayer.

The fuel cell operates within a temperature range appropriate for the operation of the redox enzyme. This temperature range typically varies with the stability of the enzyme, and the source of the enzyme. To increase the appropriate temperature range, one can select the appropriate redox enzyme from a thermophilic organism, such as a microorganism isolated from a volcanic vent or hot spring. Nonetheless, preferred temperatures of operation of at least the first electrode are about 80.degree. C. or less, preferably 60.degree. C. or less, more preferably 40.degree. C. or 30.degree. C. or less. The porous matrix is, for example, made up of inert fibers such as asbestos, sintered materials such as sintered glass or beads of inert material.

The first electrode (anode) can be coated with an electron transfer mediator such as an organometallic compound which functions as a substitute electron recipient for the biological substrate of the redox enzyme. Similarly, the lipid bilayer of the embodiment of FIG. 3 or structures adjacent to the bilayer can incorporate such electron transfer mediators. Such organometallic compounds can include, without limitation, dicyclopentadienyliron (C.sub.10 H.sub.10 Fe, ferrocene), available along with analogs that can be substituted, from Aldrich, Milwaukee, Wis., platinum on carbon, and palladium on carbon. Further examples include ferredoxin molecules of appropriate oxidation/reduction potential, such as the ferredoxin formed of rubredoxin and other ferredoxins available from Sigma Chemical. Other electron transfer mediators include organic compounds such as quinone and related compounds. The electron transfer mediator can be applied, for example, by screening or masked dip coating or sublimation. The first electrode can be impregnated with the redox enzyme, which can be applied before or after the electron transfer mediator. One way to assure the association of the redox enzyme with the electrode is simply to incubate a solution of the redox enzyme with electrode for sufficient time to allow associations between the electrode and the enzyme, such as Van der Waals associations, to mature. Attentively, a first binding moiety, such as biotin or its binding complement avidin/streptavidin, can be attached to the electrode and the enzyme bound to the first binding moiety through an attached molecule of the binding complement.

The redox enzyme can comprise any number of enzymes that use an electron carrier as a substrate, irrespective of whether the primary biologically relevant direction of reaction is for the consumption or production of such reduced electron carrier, since such reactions can be conducted in the reverse direction. Examples of redox enzymes further include, without limitation, glucose oxidase (using NADH, available from several sources, including number of types of this enzyme available from Sigma Chemical), glucose-6-phosphate dehydrogenase (NADPH, Boehringer Mannheim, Indianapolis, Ind.), 6-phosphogluconate dehydrogenase (NADPH, Boehringer Mannheim), malate dehydrogenase (NADH, Boehringer Mannheim), glyceraldehyde-3-phosphate dehydrogenase (NADH, Sigma, Boehringer Mannheim), isocitrate dehydrogenase (NADH, Boehringer Mannheim; NADPH, Sigma), and .alpha.-ketoglutarate dehydrogenase complex (NADH, Sigma).

The redox enzyme can also be a transmembrane pump, such as a proton pump, that operates using an electron carrier as the energy source. In this case, enzyme can be associated with the electrode in the presence of detergent and/or lipid carrier molecules which stabilize the active conformation of the enzyme. As in other embodiments, an electron transfer mediator can be used to increase the efficiency of electron transfer to the electrode.

Associated electron carriers are readily available from commercial suppliers such as Sigma and Boehringer Mannheim. The concentrations at which the reduced form of such electron carriers can be as high as possible without disrupting the function of the redox enzyme. The salt and buffer conditions are designed based on, as a starting point, the ample available knowledge of appropriate conditions for the redox enzyme. Such enzyme conditions are typically available, for example, from suppliers of such enzymes.

In another embodiment where the fuel cells 30 need to be physically replaced while the AC equipment is running, the inverter 40 receives a back-up energy source such as a small battery or a high capacity capacitor. A current sensor is provided to sense current from the battery unit 30. Once the current is interrupted during operation indicating that the energy storage units are being replaced or that it has lost power, the inverter is connected to the back up energy source by a solid state switch or a relay. In this manner, the user-replaceable battery units 30 can be substituted in the field without interrupting power to the appliance by using the back-up energy source. The inverter 40 receives a low DC voltage input in electrical communication and provides a source of high DC voltage. The AC voltage to an appliance may be by an electrical lead directly from the voltage converter to the appliance or via a switch mechanism or an electrical plug or socket. In one embodiment, a standard AC wall plug connected to the inverter 40 operably supplies the high DC voltage to an appliance.

The back-up energy storage device can also be a conventional battery or a supercapacitor, which is a component intermediate between a capacitor and a battery in terms of energy and power. The supercapacitor can be any electrochemical system using at least the surface properties of an ideally polarizable material of high specific surface area. In other words, the super-capacitor is an electrochemical capacitor of high capacitance.

During charging of the supercapacitor, there is a build-up of ionic species on either side of the two electrodes, at the ideally polarizable material/electrolyte interface. There may also be oxidation-reduction reactions in the presence of redox sites, resulting in a pseudocapacitive system. Supercapacitors based on the principle of the double layer have been manufactured from a variety of materials. These supercapacitors are assembled from two carbon electrodes having a high specific surface area. In general, the capacitors include current leads, a separator lying between the electrodes, an electrolyte and a package sealed with respect to the environment. One component of a supercapacitor consists of the electrolyte which, typically, comprises a solution of a salt, that is to say a combination of a salt and a solvent. In general, the electrolytes are low-viscosity liquids and have a high conductivity over a wide temperature range. They must also be of low cost, chemically and electrochemically stable and compatible with carbon or the other materials of which the electrodes are composed.

One exemplary super-capacitor is disclosed in U.S. Pat. No. 6,671,166, the content of which is incorporated by reference. As discussed therein, a high power capacitor ideally polarizable has a positive electrode and its current collector, a negative electrode and its current collector, said electrodes comprising a carbon containing material with high specific surface area, a separator and a non-aqueous liquid electrolyte impregnating said separator and said electrodes. The non-aqueous liquid electrolyte is an organic solution of a sodium or potassium or alkalin-earth metal salt, on their own or mixed in a solvent containing an acid.

The inverter 40 can be a step-up transformer capable of amplifying low DC voltage to high DC voltage. The term "low voltage DC" generally encompasses voltages within the range from about 5 volts to about 50 volts DC and more preferably from about 6 volts to about 36 volts DC and even more preferably from about 8 volts to about 24 volts DC. Particularly preferred low voltages are about 8, 12, 24 or 36 volts with a variation of about 4 volts. High voltage AC encompasses voltages within the range from about 280 to about 480 volts AC. At high voltage levels power may be supplied over long distances with a voltage drop with minimal adverse effect on the system. As a result, the user can effectively power an end appliance at a great distance from the power source and portable converter. This is advantageous in a situation where a mobile appliance is energized by the system. The mobile power unit and the appliance, singly or in combination, may be moved widely and freely.

In one embodiment, the inverter can be pulse-width modulated inverter. A PWM inverter is controlled by a control circuit, and the output of the PWM inverter is supplied to a sine wave filter (LC low-pass filter). The sine filter includes an LC filter composed of a reactor and a capacitor, and a damping circuit which is a serial circuit of a resistor and a capacitor. The damping circuit is connected in parallel with the capacitor in order to limit oscillation waveforms accompanying the resonance of the reactor and the capacitor. The control circuit comprises a mean value circuit, an automatic voltage regulator (AVR), an instantaneous voltage command value generator, and a PWM signal generator. First, a voltage detector is connected to the output of the sine filter to detect the instantaneous output voltage V of the sine filter. The output voltage V is inputted to the mean value circuit. The mean value circuit produces the mean value of the instantaneous output voltage. The mean value is subtracted from a predetermined voltage reference value by a summing point, and the difference is supplied to the automatic voltage regulator. The automatic voltage regulator corrects the voltage reference value so that the difference becomes zero, and supplies the resultant corrected voltage reference value to the instantaneous voltage command value generator. The instantaneous voltage command value generator, receiving the corrected voltage reference value VA and a predetermined frequency reference value, generates a sinusoidal instantaneous voltage command value having amplitude determined by the corrected voltage reference value VA and a frequency determined by the frequency reference value. The output voltage V is subtracted from the instantaneous voltage command value by a summing point 82, and the difference is provided to a gain adjuster. The output of the gain adjuster is added to the voltage command value by a summing point that outputs a corrected voltage command value to the PWM signal generator. The PWM signal generator outputs a pulse signal corresponding to the corrected voltage command value and controls the PWM inverter by the pulse signal.

The foregoing describes the control of one PWM inverter in one embodiment. In another embodiment, a plurality of PWM inverters can be connected in parallel to supply power to a common load.

In one embodiment, the fuel cell 30 has a microcontroller embedded therein. The microcontroller provides the appliance with various information items such as fuel cell conditions, fuel cell charge capacity, and a manufacturing company of the fuel cell. Typically, communications between the fuel cell microcontroller and the appliance are done over a serial RS-232 protocol. Other protocols include Universal Serial Bus (USB), SCSI, or Firewire. In this manner, the smart fuel cell can provide information about its residual capacity to the appliance so as to display a fuel cell state relevant to the residual capacity of the fuel cell.

As described above, while the smart fuel cell has a function of offering the information on the residual amount of fuel cell capacity, and it is required to exactly estimate the fuel cell capacity changeable in accordance with various environmental elements in order to offer exact fuel cell residual capacity information. Thus, the smart fuel cell sets up a new reference capacity in accordance with the changes of fuel cell capacity, and provides present residual capacity information based on the reference capacity. For the purpose of establishing the new reference capacity, the smart fuel cell carries out calibration when an output voltage becomes lower than a predetermined level. The calibration is used for re-establishing the reference capacity of the fuel cell with a measured value of a total charge capacity of a fuel cell. During the calibration, a discharge starts from a full-charged state, and the amount discharged until the output voltage of the smart fuel cell becomes lower than the predetermined voltage level is established as a reference capacity. In case that the fuel cell continues to be discharged after the calibration, the reference capacity is set by performing a re-calibration after the former discharge is finished.

In one embodiment where the appliance is a computer, a power management software detects a state of low fuel cell (LB) in which the fuel cell residual capacity is reduced less than 10%, and displays a warning for a user. Then, if the smart fuel cell continues to discharge, and thus a low low fuel cell voltage is detected, i.e. if the fuel cell residual capacity is reduced less than a predetermined amount, e.g., less than 3%, the power management system stores data by making an operating system (OS) program to protect current data at work. This case is called a low low fuel cell (LLB) state. The OS program serves to support a power management function such as advanced power manager (APM) or advanced configuration and power interface (ACPI), and for instance, a WINDOWS type of OS (operating system) of the MICROSOFT Corporation belongs to the program. The OS program allows the data being processed of the present system to be stored in a hard disk drive, and after the operation, the power management system finishes the system by blocking the power source provided from the smart fuel cell.

In one embodiment, predictive-based design is used to engineer a virus (as discussed in more details below) to satisfy electrode formation and assembly with a polymer electrolyte for a Li ion battery. Tetraglutamate (EEEE-) is then fused to the N terminus of each copy of the major coat p8 protein with 100% expression. The clone serves as a general template for growing nanowires through the interaction of the glutamate with various metal ions. The major coat p8 proteins of M13 viruses are used to grow cobalt oxide and gold cobalt oxide nanowires. The resulting nano-battery provides high current capacity and can be recharged quickly.

FIGS. 11-12 show diagrams relating to field emission devices (FEDs) that capitalize on the movement of electrons. The FED includes at least a cathode, carbon nanotube (CNT) emitter tips, and an anode spaced from the cathode. A voltage is applied between the cathode and the anode causing electrons to be emitted from the CNT emitter tips. The electrons travel in the direction from the cathode to the anode. The FED devices can be used in a variety of applications including, but not limited to, microwave vacuum tube devices, power amplifiers, ion guns, high energy accelerators, free electron lasers, and electron microscopes, flat panel displays, electron sources in x-ray tube applications, electron-beam lithography applications and the like. For example, CNT thermionic emitters, which operate at relatively high temperatures and allow for relatively slow electronic addressing and switching, are used in x-ray imaging applications. The CNT can be used as cold cathode field emitter for an electron source in x-ray imaging applications, such as computed tomography (CT) applications, to improve scan speeds, as well as in other applications. Moreover, CNT can be used as low pressure gas discharge lighting and fluorescent lighting. The CNT devices improve key performance factors associated with cold cathode field emitters such as the emitter tip sharpness, the alignment and spacing of the emitter tips and the gates, the emitter tip to gate distance and the emitter tip density. For example, the emitter tip to gate distance partially determines the turn-on voltage of the cold cathode field emitter, i.e. the voltage difference required between the emitter tip and the gate for the cold cathode field emitter to start emitting electrons. CNT devices have small the emitter tip to gate distance, which provides low turn-on voltage of the cold cathode field emitter and low the power consumption/dissipation. Additionally, the CNT device has high emitter tip density which affects the footprint of the cold cathode field emitter.

FIG. 11 shows a simplified diagram of an FED with CNT emitters. The cathode module includes a bottom substrate 730, a number of cathode electrodes 732 arranged on the bottom substrate 730, and a number of CNT emitters 733 disposed on each cathode electrode 732. The bottom substrate 730 can be made of an insulating material, such as glass, ceramic, quartz, etc. The cathode electrodes 732 may be made of a conductive material, such as metal, an ITO (indium tin oxide) thin film, etc. The emitters 733 may be made of silicon, graphite, diamond, CNTs, or a suitable metal or alloy. The cathode module may be made by a printing method, deposition, or another suitable method. For example, a typical printing method may include providing a flat glass or plastic or polymeric sheet used as a bottom substrate; printing a number of strip-shaped ITO thin films on a surface of the flat glass or plastic or polymeric sheet by a screen printing process, said strip-shaped ITO thin films being substantially parallel to each other and separated from each other by short intervals; and printing a paste containing CNTs on a surface of each ITO thin film. The CNTs are treated to make at least first ends of the CNTs extend upwardly from the ITO thin films. In another embodiment, the cathode electrodes 732 may instead be a single cathode electrode deposited on an entire surface of the bottom substrate. In addition to glass, plastic, or polymeric substrate material, the substrate can also be made of glass quartz, silicon, or alumina, silica, platinum, iron and its alloys, cobalt and its alloys, nickel and its alloys, and ceramics.

The anode module includes a top plate 731, an anode electrode 35 deposited on a surface of the top plate 731, and a phosphor layer 737 coated on a surface of the anode electrode 735. The top plate 731 may be a transparent, insulating glass or plastic or polymeric sheet. The anode electrode 735 can be made of an ITO thin film. The phosphor layer 737 can emit visible light under bombardment of electrons.

The space 734 is sealed and evacuated. The voltage is supplied by a power supply. The electrons emitted from the emitting tips 733 are accelerated by the gate electrode 732, and move toward the anode conductor layer 737 which is a transparent conductor such as indium-tin oxide. To operate the field emission display device, the cathode is held at a negative potential relative to the anode. As a result of this potential difference, electrons are emitted from the emitter tips 733 and travel to the anode. The gate electrode can be used to accelerate the emitted electrons. As the emitted electrons hit the phosphor layer, light is given off. The colors of the emitted light depend on the phosphors that are used. For example Zn:Scu, Al for green, $Y_2O_3$:Eu for Red, and ZnS:Ag for blue.

The cathode module and the anode module are aligned and packaged in vacuum 734 to form the field emission display. One or more spacers 738 may be positioned between the cathode module and the anode structure for maintaining its separation from the anode and cathode electrodes.

In one embodiment, the cathode electrode can be a metal such as copper (Cu) or aluminum (Al) which has been deposited or printed onto plastic or polymeric or glass substrates. The cathode electrode can also be made from other metals such as tungsten (W), niobium (Nb), tantalum (Ta), titanium (Ti), molybdenum (Mo), chromium (Cr), gold (Au), silver (Ag) and the like; alloys and compounds containing these metal elements. The conductive material for constituting the gate electrode includes at least one metal selected from the group consisting of tungsten (W), niobium (Nb), tantalum (Ta), titanium (Ti), molybdenum (Mo), chromium (Cr), aluminum (Al), copper (Cu), gold (Au), silver (Ag), nickel (Ni), cobalt (Co), zirconium (Zr), iron (Fe), platinum (Pt) and zinc (Zn); alloys or compounds containing these metal elements. The metal adhesion may be enhanced with the addition of an underlying adhesion layer. The metal can also be pretreated to promote the adhesion of the CNTs.

The cathode electrode and the gate electrode and the electrically conductive layer can be formed using deposition methods such as an electron beam deposition method and a hot filament deposition method, a sputtering method, a combination of a CVD method or an ion plating method with an etching method, a screen-printing method, a plating method and a lift-off method. When a screen-printing method or a plating method is employed, the cathode electrodes in the form of stripes can be directly formed.

A dielectric film or mask can be applied to pattern the metal surface into a plurality of electrodes prior to CNT deposition or screen printing. The dielectric film is formed above a field emitter substrate (which can be plastic or polymeric or glass). The dielectric film is patterned with holes over the cathodes. Metal gates with openings which are located over the holes of the dielectric film are formed to expose the surface of the cathodes.

In one embodiment, emitter tips are formed and deposited on the metal surface using viral enabled synthesis and assembly of CNT. In this embodiment, the substrate with the patterned electrodes is immersed into a solution containing engineered viruses. The viruses can assemble on multiple length scales so that hierarchical assembly of the CNT emitter tips can be done.

FIG. 12 shows an exemplary process for fabricating the FED using viral templates. In this process, a virus is genetically engineered to have a plurality of selective binding or nucleating sites (750). The virus is used as a biotemplate to self-assemble a chain of a material such as CNT (752). One or more viruses can be daisy-chained so that the total chain length is a multiple of the average viral length. Next, the process binds one binding site of the viral chain to a predesigned metal spot on the cathode electrode to form an electronic device such as an emitter, among others (754). Optionally, the process opens one end of the viral chain by cutting one end of the viral chain (756).

Viruses can be conjugated with one-dimensional nanowires/nanotubes, two dimensional nano electrodes, and microscale bulk devices. One-dimensional materials, such as nanotubes or nanowires, when conjugated with the pIII end of M13 viruses, may form phase separated lamellar structures that have inorganic nanotube or nanowire layers and phage building block layers. Two-dimensional nano-thick plate shaped electrodes can be organized. Viral-semiconductor composite nano-wires can be attached across metal electrodes through binding sites at either end of the virus. A series of sites for binding, including electrode sites for example, can be patterned onto a surface, and the viruses allowed to be disposed between the binding sites, based on the virus end recognition of the binding site. For example, square grids can be formed, each point on the square being connected by the virus.

By exploiting the liquid crystalline properties of the virus, fibers or fabric like networks of viruses can be constructed with specifically designed mechanical properties based on the secondary and tertiary structures induced by viral-viral binding. In addition these materials can have special properties impregnated into them by further functionalizing the viruses to bind regents or signaling elements. Additionally, multifunctional viral based arrays can have uses in tissue repair where one part of the array selectively binds to a tissue type where another part can nucleate bone or other structural biomaterials.

In one embodiment, a semiconductor substrate is solution-processed to modify material and thin film. The material can be soluble in a solution or capable of suspension in a solution so they may be processed by a solution technique such as ink jet printing or spin coating, and formed into a thin film such as organic thin films and polymer thin film, for example. The materials can be thin films such as conductive polymers, semi-conductive polymers and dielectric polymers. However, a solution-processed material may also be a precursor of small organic molecular material that is soluble in a solvent. The structure may be constructed with any combination of solution-processed electronic materials capable of being formed into thin films. By way of example, poly(3,4-ethylenedioxythiophene), also called PEDOT, is a conductive polymer suitable for drain, gate and source contacts. An exemplary suitable semiconductive polymer is poly (3-hexylthiophene-2,5-diyl), also called P3HT. An exemplary dielectric polymer is poly(vinylphenol), also called PVP. Other exemplary polymer materials can be solution processed and formed into thin films as well.

Figure 13A:
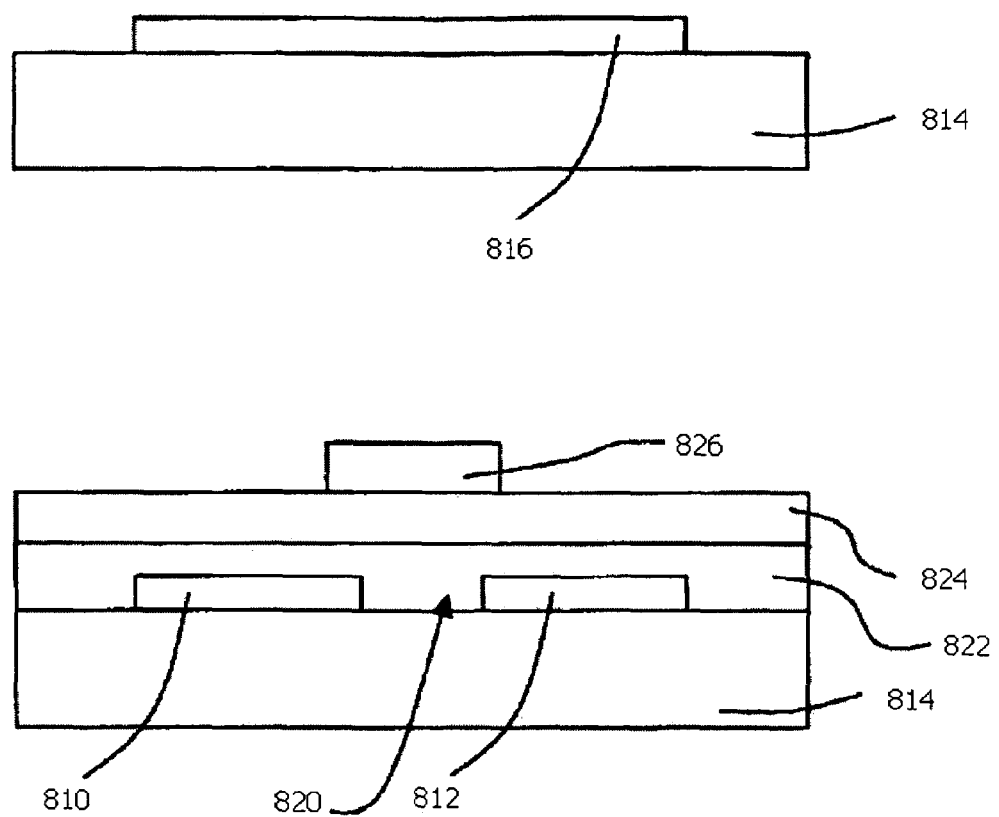
FIGS. 13A-13C show exemplary cross sectional views of viral templated transistors.

Referring now to FIG. 13, an exemplary embodiment formation method and solution-processed thin film transistor is illustrated. The transistor has source and drain contacts 810, 812 formed upon a substrate 814. The substrate 814 should have good dielectric properties and is compatible with the solution-processed thin film materials used to form the transistor 808. The substrate can include glass, polycarbonate, polyarylate, polyethylenterephtalate (PET), polyestersulfone (PES), polyimide, polyolefin, or polyethylene naphtthalate (PEN), among others. First, conductive solution-processed thin film material 816 is deposited upon the substrate 814 by spin coating, electroplating, or by inkjet printing.

In one embodiment, engineered viruses self-assemble to form the source/drain structure 810/812 with the gate channel 820 in between. A virus terminal bonding material is screen printed or ink-jet printed on the substrate 814 or otherwise lithographed on the substrate 814 to define the areas to be occupied by the source area 810 and the drain area 812. The substrate 814 is dipped into a solution with viruses engineered to carry CNT along the length of the virus and to attach to the substrate on one end or terminal of the virus. After bonding occurs, the substrate and viral template are heated to anneal the CNTs carried along the length of the virus and to remove the virus template. Optionally, the CNTs can be cut at the remaining end to create open ended CNT structures. A wash can be done to prepare the system for the next fabrication process.

As discussed in Application Serial No. 20050170336, genetic programming is carried out to engineer a virus structure using the different displayed peptide features of a virus such as the filamentous M13 virus. Peptides can be selected with binding specificity using a combinatorial library. The combinatorial library of random peptides, each containing 12 amino acids, are fused to the pIII coat protein of M13 coliphage and exposed to crystalline semiconductor structures. Peptides that bound to the semiconductor materials were eluted, amplified, and re-exposed to the semiconductor materials under more stringent conditions. After a few iterations, the semiconductor specific phages are isolated and sequenced to determine the binding peptide. In this manner, peptides are selected with high binding specificity depending on the crystallographic structure and composition of the semiconductor material. The peptides can have a binding specificity for not just semiconductor materials, but a range of both organic and inorganic materials.

In addition to materials-specific addressability, the genetic programming can specify viral length and geometry. The length of a filamentous virus is generally related to the size of its packaged genetic information and the electrostatic balance between the pVIII-derived core of the virion and the DNA. Specific linkage, binding, and concatenation of virus particles can help produce longer viral scaffolds, and thus longer wires. The multiplicity of additions can be controlled by engineering binding motifs into one virus, which then can accurately recognize binding sites on another virus. As described earlier, the pIII protein resides at one end of the M13 virus and can be exploited to display peptide and protein fusions. At the other end of the virus, the pIX protein also can be subject to modification. For example, pIX and pVII fusions are used to display antibody heavy- and light-chain variable regions. Viral end linkages may have the same or different binding and/or nucleating specificity. In addition, the virus particles may display binding and/or nucleating motifs in addition to the end regions, such as an amino acid oligomer binding motifs displayed on pVIII. For example, the pIII and pIX regions may be functionalized to bind and/or nucleate one composition, and pVIII may be functionalized to bind to a different composition. The binding of one end of a virus directly to the other end of the virus without the use of a linker can be used to form rings, wires, or other viral based structures as well. By engineering recognition sites and the corresponding conjugate moieties into a single virus, or multiple viruses, the entire system can be genetically programmed.

In one embodiment, the virus is multi-functionalized and provides recognition sites for binding, nucleation, and catalysis. Although naturally occurring virus can be used, viruses subjected to biopanning is used in one embodiment so that the virus particles specifically can recognize and bind to materials which were the object of the biopanning. The materials can also be nucleated and synthesized in particulate form, including nanoparticulate form, in the presence of the specific recognition and binding sites. Biopanning is further described in U.S. Pat. Nos. 5,223,409 and 5,571,698 to Ladner, the contents of which are incorporated by reference.

In another embodiment, viruses which have expressed peptides, including peptide oligomers and amino acid oligomer as specific binding sites, are used. Amino acid oligomers can include any sequence of amino acids whether native to a virus or heterologous. Amino acid oligomers may be any length and may include non-amino acid components. The virus particles can be helical viruses such as tobacco mosaic virus (TMV), phage pfl, phage fdl, CTX phage, and phage M13. These viruses are generally rod-shaped and may be rigid or flexible.

In one embodiment, rationally designed peptide and/or materials-specific peptides identified by biopanning are expressed on the major coat p8 proteins of M13 viruses to grow carbon nanowires or CNTs. At one end of M13 virus, there are approximately five molecules each of protein VII (pVII) and protein IX (pIX). The other end has about five molecules each of protein III (pIII) and protein VI (pVI), totaling 10-16 ran in length. The wild type M13 virus coat is composed of roughly 2800 copies of the major coat protein VIII (pVIII) stacked in units of 5 in a helical array. The M13 virus consists of 2700 major coat proteins (p8) helically wrapped around its single-stranded DNA, with minor coat proteins (p3, p6, p7, and p9) at each end of the virus. The functionality of these subunit proteins can be modified specifically through additions in the M13 genome. Modification of the major coat proteins, as well as minor coat proteins at the virus ends, forms functional heterostructured templates for precisely positioned nanomaterials.

The engineered viruses express one or more peptide sequences including amino acid oligomers on the surface of the viruses. The amino acid oligomers may be native to the virus or heterologous sequences derived from other organisms or engineered to meet specific needs. In embodiments where M13 systems are used, the different regions, such as pIII, pVI, pVII, pVVI, and pIX, may express the same or different amino acid oligomers. For example, pIII and pVIII may express amino acid oligomers with different binding specificities. In addition, amino acid oligomers with different binding specificities may be expressed on the same region, such as pVIII.

More details on the engineering of viruses to express amino acid oligomers are disclosed in U.S. Pat. No. 5,403,484 by Ladner et al discloses the selection and expression of heterologous binding domains on the surface of viruses. U.S. Pat. No. 5,766,905 by Studier et al discloses a display vector comprising DNA encoding at least a portion of capsid protein followed by a cloning site for insertion of a foreign DNA sequence. The compositions described are useful in producing a virus displaying a protein or peptide of interest. U.S. Pat. No. 5,885,808 by Spooner et al discloses an adenovirus and method of modifying an adenovirus with a modified cell-binding moiety. U.S. Pat. No. 6,261,554 by Valerio et al shows an engineered gene delivery vehicle comprising a gene of interest and a viral capside or envelope carrying a member of a specific binding pair. U.S. Published patent application 2001/0019820 by Li shows viruses engineered to express ligands on their surfaces for the detection of molecules, such as polypeptides, cells, receptors, and channel proteins.

A conjugate material can be selected so that the virus particles can be subjected to biopanning against the conjugate material, and then the conjugate material is selectively or specifically bound to the virus particle. In some applications, selective binding can be sufficient, whereas in other applications, a more powerful specific binding can be preferred. Examples of general types of conjugate materials include inorganic, organic, particulate, nanoparticulate, single crystalline, polycrystalline, amorphous, metallic, noble metal, magnetic, semiconductor, polymeric, electronically conducting, optically active, conducting polymeric, light-emitting, and fluorescent materials. Conjugate materials can be directly linked to the recognition site or can be linked to the recognition site by a linking moiety. Conjugate materials can be formed in the presence of the recognition moiety and coupled to it and bind to it as it is formed. Or, conjugation materials can be preformed and then bound to the recognition cite. For example, nanocrystals can be nucleated at the recognition sites or can be preformed and bound to the recognition sites. Conjugate materials which are useful electrode materials such as, for example, noble metals and gold can be used.

Engineered viruses modified at the ends (e.g., pIII and pIX) with recognition elements can be delivered between two desired locations. This can be combined with recognition elements on pVIII to grow particular materials including particulate and nanocrystalline materials. Viruses may be applied to a substrate with specified location and/or orientation by patterning the substrate with a material which the viruses specifically bind to. The viruses may be further functionalized with at least one other binding motif specific to a second material. The viruses may be exposed to this second material before, after, and/or simultaneously with being exposed to the patterned substrate. The second material may be an inorganic, organic, or any other desired material.

In another embodiment, source/drain structures can be formed by inkjet printing the source and drain areas 810 and 812 separated by the transistor channel areas 820. In yet another embodiment, a light-sensitive, self-assembled monolayer of CNT thin film material is spin coated on the substrate 814. Light triggers the cleavage of chemical bond and exposes an underlying functional group. The surface charge and the electrostatic interactions in the material are modified by exposure to ultraviolet light, which renders the particles negative and converts the thin film material into dense sediments in regions exposed by the light. In this manner, a beam of light causes the solidification and formation of the source and drain regions 810 and 812. Multiple wavelength-specific triggers can be used to allow different wavelengths of light to induce changes sequentially. After the formation of the desired structure(s) such as regions 810 and 812, the remaining thin film material layer is washed off and the next layer can be applied.

In another embodiment, the thin film CNT layer is spin coated above the substrate and a photo-mask is applied over the source and drain areas. Unwanted regions are etched away to leave transistor channel areas. In one embodiment, a high index immersion lithographic system can be used to transfer images from a reticle onto a semiconductor wafer during semiconductor processing. An exposure apparatus includes an illumination source, a reticle stage assembly that retains a reticle, an optical assembly (sometimes referred to as a projection lens), a wafer stage assembly that retains a semiconductor wafer, a measurement system, and a control system. The resist coated wafer is placed in the path of the radiation emanating from a patterned mask and exposed by the radiation. When the resist is developed, the mask pattern is transferred onto the wafer. In microscopy, extreme ultraviolet (EUV) radiation is transmitted through a thin specimen to a resist covered plate. When the resist is developed, a topographic shape relating to the specimen structure is left. Immersion lithography is a technique that can enhance the resolution of projection lithography by permitting exposures with numerical aperture (NA) greater than one, which is the theoretical maximum for conventional "dry" systems. By filling the space between the final optical element and the resist-coated target (i.e., wafer) with an immersion fluid, immersion lithography permits exposure with light that could otherwise be totally internally reflected at an optic-air interface. Numerical apertures as high as the index of the immersion liquid (or of the resist or lens material, whichever is least) are possible. Liquid immersion also increases the wafer depth of focus, i.e., the tolerable error in the vertical position of the wafer, by the index of the immersion liquid compared to a dry system with the same numerical aperture. Immersion lithography thus has the potential to provide resolution enhancement equivalent to the shift from 248 to 193 nm. Unlike a shift in the exposure wavelength, however, the adoption of immersion would not require the development of new light sources, optical materials, or coatings, and should allow the use of the same or similar resists as conventional lithography at the same wavelength. In an immersion system where only the final optical element of the optical assembly and its housing and the wafer (and perhaps the stage as well) are in contact with the immersion fluid, much of the technology and design developed for conventional tools in areas such as contamination control, carry over directly to immersion lithography. The immersion fluid in an immersion lithography system serves as a fluidic optical element. Fluids can also be used to form optical elements such as those inside the optical assembly of an exposure apparatus. In one implementation, an organic fluid is used to allow light to be focused more precisely onto the liquid processed structure and substrate. In another implementation, isotopically specified fluids are used for processing light passing therethrough. The isotopic composition of the fluid may be adjusted to vary the optical properties. The properties of the isotopically specified fluid may be monitored and adjusted to obtain desired optical characteristics of the fluidic optical element. Examples of such properties include the isotopic composition, index of refraction, temperature, and pressure. Water has optical properties that are suitable as the immersion fluid in an immersion lithography system. Water further has mechanical properties such as low viscosity and surface tension characteristics that render it particularly desirable for use in immersion lithography. The index of refraction of an immersion fluid plays a role in the imaging during lithography. Generally, an immersion fluid having a higher index of refraction is more desirable. The heavier isotopes of water can provide a desired higher index of refraction.

In yet another embodiment, the structure patterning can also be done by laser ablation where tuned laser radiation ablates the conductive solution-processed thin film material. Although a single device is illustrated, the conductive solution-processed thin film material 816 may be formed into a rough pattern such as a circuit interconnect pattern used to connect multiple transistors.

After the transistor channel is formed 820, a thin film of semiconductor solution-processed thin film material is deposited to form an active region thin film layer 822 over the source and drain contacts and exposed portions of the substrate 814. Semiconductor material deposits into the transistor channel 820 during this part of the formation process. Formation of the thin film layer may be conducted by a suitable solution processed deposition. Spin coating is an exemplary technique for the deposition of a dielectric solution-processed thin film material to form an isolation layer 824 over the active region thin film layer 822. Conductive solution-processed thin film material is then deposited upon the isolation layer 824 to form a gate contact 826.

The gate contact can be formed by viral self-assembly, light sensitive triggering, mask etching, inkjet printing techniques as discussed above or any suitable techniques. In addition, there may be a rough deposition of the gate contact 826 followed by selective ablation for refining the pattern. The gate contact 826 may form part of a circuit interconnect pattern, as well. Although the foregoing shows the gates are at the top and the drains/sources at the bottom, the arrangement can be reversed so that the gates are on the bottom and drains/sources are on top. In other implementations, the thin film layer 822 is not needed.

Figure 13B:
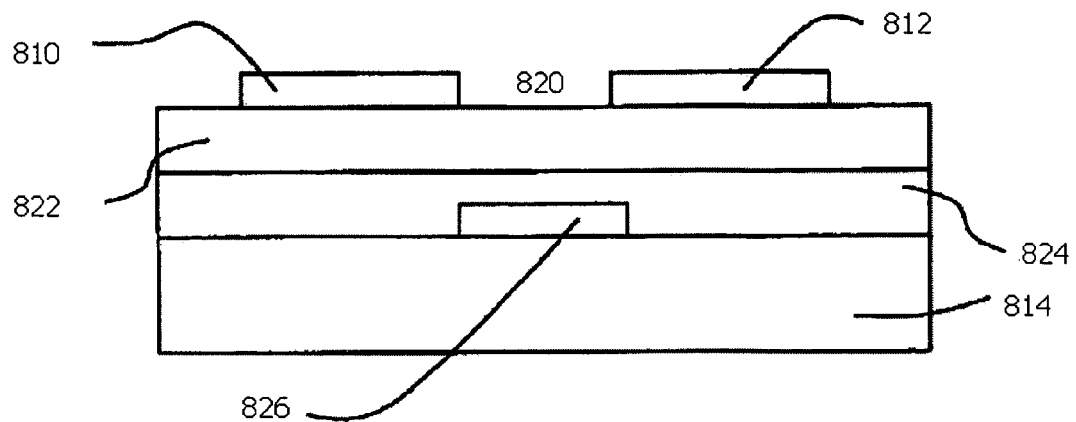
Figure 13C:
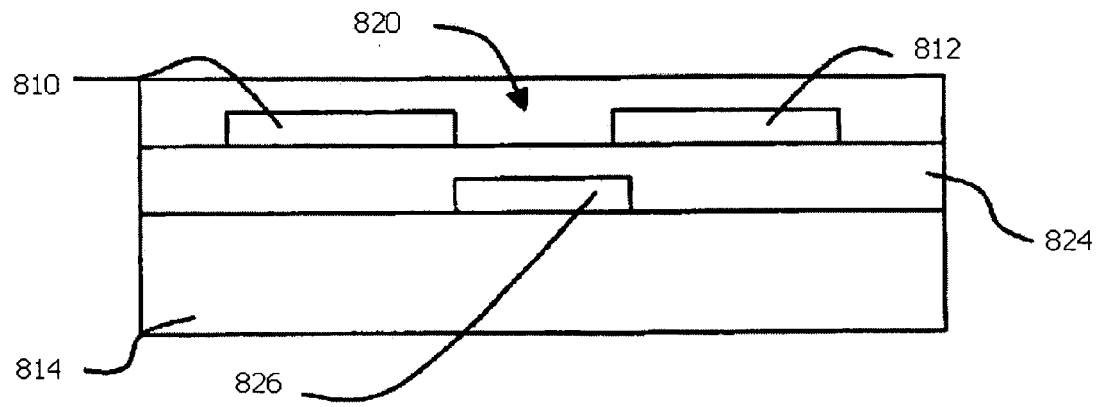

FIGS. 13B-13C show different transistor configurations. In FIG. 13B, the gate is formed first, while FIG. 13C shows the embodiment of FIG. 13B without an isolation layer 22.

FIG. 14A shows one embodiment for using engineered viruses to self assemble nano materials into semiconductor structures such as resistor, capacitor, inductor, diode, triode, transistor, or FEDs. The process includes genetically engineering first, second, third, fourth and fifth viruses each having a plurality of selective binding sites (850). Next, the process forms first, second, third, fourth and fifth viral biotemplates by immersing the first, second, third, fourth and fifth viruses in a solution with nano materials coupleable to the binding sites of the viruses (852). A source is self-assembled using the first viral biotemplate having one site attachable to the substrate (854). Similarly, the process self-assembles a channel with the second viral biotemplate having one site attachable to the substrate and one site attacheable to the first viral biotemplate (856). The process then self-assembles a drain with the third viral biotemplate having one site attachable to the substrate and one site attacheable to the second viral biotemplate (858). The process self-assembles an isolation layer above the first, second and third viral biotemplates with the fourth viral biotemplate (860). Next, the process self-assembles a gate with the fifth viral biotemplate having one site attachable to the isolation layer (862).

Turning now to FIG. 14B, a system is used to genetically engineer first, second, third, fourth and fifth viruses each having a plurality of selective binding sites (870). The process forms first, second, third, fourth and fifth viral biotemplates by immersing the first, second, third, fourth and fifth viruses in a solution with nano materials coupleable to the binding sites of the viruses (872). Next, the gate is self-assembled with the first viral biotemplate having one site attachable to the substrate (874); an isolation layer is formed above the first viral biotemplate with the second viral biotemplate (876); a source is formed with the third viral biotemplate having one site attachable to the isolation layer (878); a channel is formed with the fourth viral biotemplate having one site attachable to the isolation layer and one site attachable to the third viral biotemplate (880); and a drain is formed with the fifth viral biotemplate having one site attachable to the isolation layer and one site attacheable to the fourth viral biotemplate (882).

FIG. 14C is similar to FIG. 14B, except that the isolation layer is not formed. The process genetically engineers first, second, third, and fourth viruses each having a plurality of selective binding sites (890). The process forms first, second, third, and fourth viral biotemplates by immersing the first, second, third, and fourth viruses in a solution with nano materials coupleable to the binding sites of the viruses (892). Next, through self-assembly, a gate is formed with the first viral biotemplate having one site attachable to the substrate (894), a source is formed above the gate with the second viral biotemplate (896), a channel is formed with the third viral biotemplate having one site attachable to the second viral biotemplate (898), and a drain is formed with the fourth viral biotemplate having one site attachable to the third viral biotemplate (899).

In the above processes, the system can optionally open one end of the electronic structure or component by cutting one end of the viral chain. This can be done using polymerase, among other techniques. Open CNTs are advantageous in that, for example, the field concentration at the open-end tip of the CNTs may be higher thus allowing electron field emission at a lower applied field than conventional capped nanotubes. Other advantages may include ease of fabricating nano-composite materials and structures by filling the now-accessible nanotube core with other materials, ease of fabricating and using such an open-ended nanotube array as a nano-needle delivery device for therapeutic drugs, biological, molecules such as DNA for gene therapy, enzymes and proteins to influence cell behavior in animals, humans or plants, nano-scale delivery of chemical reactants such as catalysts, among others. In one implementation, the opening an end of a nanotube including a catalyst particle includes sputter etching the nanotube to remove an amorphous layer, bend the nanotube to one side, open a hole in the nanotube, and cause detachment of the catalyst particle. Other techniques include heating CNTs in the presence of air for short durations at temperatures at about 700 C. to burn away of the tube caps and/or the thinning of tube walls. Acid solutions, for example, solutions of hydrochloric acid, can chemically etch and remove catalyst particles, leaving open CNT ends. Cutting CNTs leaving open ends on both ends can be done using acid solutions, for example, nitric acid, supercritical water, ball milling, diamond particle abrasive, and dynamic nano-fragmententation.

More information for selection of the virus, genetic engineering methods, and for materials to be used with genetically engineered viruses: phage display libraries and experimental methods for using them in biopanning is further described, for example, in the following U.S. patent publications to Belcher et al.: (1) "Biological Control of Nanoparticle Nucleation, Shape, and Crystal Phase"; 2003/0068900 published Apr. 10, 2003; (2) "Nanoscale Ordering of Hybrid Materials Using Genetically Engineered Mesoscale Virus"; 2003/0073104 published Apr. 17, 2003; (3) "Biological Control of Nanoparticles"; 2003/0113714 published Jun. 19, 2003; and (4) "Molecular Recognition of Materials"; 2003/0148380 published Aug. 7, 2003, (5) "Composition, method, and use of bifunctional biomaterials"; 2004/0127640; filed Sep. 4, 2003; (6) "Peptide Mediated Synthesis of Metallic and Magnetic Materials"; Ser. No. 10/665,721, filed Sep. 22, 2003; and (7) "Fabricated BioFilm Storage Device"; 2004/0171139, filed Sep. 24, 2003, each which are each hereby incorporated by reference in their entirety. These references describe a variety of specific binding modifications which can be carried out for binding to conjugate structures, as well as forming the conjugate structures in the presence of the material modified for specific binding. In particular, polypeptide and amino acid oligomeric sequences can be expressed on the surfaces of viral particles, including both at the ends and along the length of the elongated virus particle such as M13 bacteriophage, including pIII and pVIII expressions, as well as pIX, pVII, and pVI expressions, and combinations thereof which are hereby incorporated by reference in their entirety. These references describe a variety of specific binding modifications which can be carried out for binding to conjugate structures, as well as forming the conjugate structures in the presence of the material modified for specific binding. In particular, polypeptide and amino acid oligomeric sequences can be expressed on the surfaces of viral particles, including both at the ends and along the length of the elongated virus particle such as M13 bacteriophage, including pIII and pVIII expressions, as well as pIX, pVII, and pVI expressions, and combinations thereof.

The viral synthesis and assembly technique is advantageous in that once the genes are programmed for assembly, little post-synthesis processing is needed. Further, the process uses room temperature aqueous synthesis and results in high quality CNT transistors or emitter tips.

In another embodiment, an electrophoretic deposition of the CNTs is done with an electrophoresis bath. The process can be optimized for attaching viral templated CNTs (or CNTs produced using other techniques) coupled to a particular metal such as gold or aluminum or copper to the metal surface. A chamber contains the solution of CNTs and a bath for immersing two opposing electrodes separated by some distance with the CNTs between the opposing electrodes. A power supply applies a voltage between the two electrodes immersed in the bath. The cathode lead is connected to the patterned aluminum substrate and the anode lead is connected to the other electrode. The substrate with the etched dielectric film is loaded into the electrophoresis bath. After fabrication using viral template or using other techniques, the CNTs can be dispersed in a suitable solvent such as isopropyl alcohol. The CNTs are uniformly deposited on the surface of the cathodes exposed through the holes by electrophoretic deposition at room temperature. The attachment of CNTs to the metal can be enhanced by a binder such as a mixture of silver paste, CNTs and ethanol, conductive carbon paste, a conductive metal paste or a carbonizable polymer.

After the deposition of CNT particles by electrophoresis, low-temperature heating can be performed to sustain the deposition of the CNTs on the cathodes and ensure easy removal of impurities which are incorporated into the electronic structure such as transistors or field emitters during the deposition.

Alternatively, the electrophoretic method disclosed in UK patent application 2,353,138 can be used. A CNT suspension is created which may include a surfactant. The suspension is sonicated to charge the CNT particles. The intensity of the electric field and the time for which the electric field is applied define the thickness of the CNT layer. Greater intensity and longer time yield thicker layers. The positive voltage of the DC power supply causes CNT particles charged by positive ions in the CNT suspension migrate to and are attached to the exposed cathodes of the field emitter substrate 6030, which results in the formation of a CNT film in the pattern of the exposed cathodes.

For applications to a diode, an electric field having opposite charges to those on the surfaces of the CNT particles is applied to exposed electrode surface of a field emitter substrate for selective deposition of CNT particles thereon. For application to a triode having gates, a weak positive electric field is applied to the gates while a positive electric field is applied to the electrodes of the field emitter substrate, which avoids deposition of CNT particles on the gates. In particular, the electrode plate is connected to the anode of the DC power supply and the cathodes of the field emitter substrate are connected to the cathode of the DC power supply. As a positive potential is applied to the gates, the gates repel positive ions in the CNT suspension at the surface, while the exposed cathodes of the field emitter substrate, which are connected to the cathode of the DC power supply, pull positive ions of the suspension through the holes. As a result, the CNTs are deposited on the exposed surface of the cathodes, not on the gates of the field emitter substrate. At this time, CNT particles are attracted to the field emitter substrate and are oriented substantially horizontal, or substantially parallel to the substrate, which allows the CNT particles to smoothly migrate through the holes to the cathodes, and thus the CNTs can be deposited.

In addition to electrophoresis, other processes such as screen printing can be used for creating the patterns. A screen printing process is disclosed in U.S. Pat. No. 6,270,369. In addition to screen printing, the CNTs can be applied to a substrate by ink jet printing. Ink printing is accomplished with CNT based liquid media or inks in which the fibrils are nearly individualized. Inks typically contain a carrier liquid and CNTs, and may be dried (i.e. evaporate the carrier liquid). The CNTs can also be deposited in the form of a mat. Such porous mats, having densities between 0.10 and 0.40 gm/cc are conveniently formed by filtration of suspensions of nanotubes as described in U.S. Pat. Nos. 6,099,965 and 6,031,711. Oxidized nanotubes are easily dispersed in and then filtered from aqueous media The mats may be subjected to a rigidization or cross linking step as discussed in the aforecited patents. In yet another method, fibril based inks can be formulated for use in spray equipment. When combined with a masking technology, spray painting of fibril based inks offers a suitable method for depositing fibril ink patterns of either simple or complex designs. Spray painting can also be used to apply a uniform coating over a large area, with or without a masking technology. Spraying equipment can accommodate inks/paints with a wide range of viscosity and thixotropy. Airbrushes are a type of sprayer widely used in the graphic arts industry and areas where fine detailed spraying is desired. The inks are sprayed through a stencil (i.e., mask, layer with cut out pattern, etc.) to form the corresponding pattern on the substrate and the carrier fluid is allowed to evaporate. The ratio of air to ink and the distance from the substrate can be adjusted to allow the optimum amount of drying of the aerosol droplets before they impinge on the substrate surface. In this way the adhesion of the droplets to the substrate and the tendency of the ink to run or spread can be controlled. Once dried the dried ink can have conductivity approaching that of a bare fibril mat depending on the level of any binder that may have been included in the ink formulation. The formation of thin fibril films with these compositions can be achieved by both printing and dip coating.

The CNTs, or film, may be modified by chemical or mechanical treatment. The surface may be treated to introduce functional groups. Techniques that may be used include exposing the CNTs to electromagnetic radiation, ionizing radiation, plasmas or chemical reagents such as oxidizing agents, electrophiles, nucleophiles, reducing agents, strong acids, and strong bases and/or combinations thereof. Plasma treatment may be carried out in order to alter the surface characteristics of the carbon fibrils, fibril structures and/or the matrix, which come in contact with the plasma during treatment so the fibril composite treated can be functionalized or otherwise altered as desired. The treatment can be carried out in a suitable reaction vessel at suitable pressures and other conditions and for suitable duration, to generate the plasma, contact it with the composite material, and effect the desired kind and degree of modification. Plasmas such as those based on oxygen, hydrogen, ammonia, helium, or other chemically active or inert gases can be utilized. Examples of other gases used to generate plasmas include, argon, water, nitrogen, ethylene, carbon tetrafluoride, sulfurhexafluoride, perfluoroethylene, fluoroform, difluoro-dicholoromethane, bromo-trifluoromethane, chlorotrifluoromethane, and the like. Plasmas may be generated from a single gas or a mixture of two or more gases. It may be advantageous to expose a composite material to more than one type of plasma. It may also be advantageous to expose a composite material to a plasma multiple times in succession; the conditions used to generate the plasma, the duration of such successive treatments and the duration of time between such successive treatments can also be varied to accomplish certain alterations in the material. It is also possible to treat the composite material, e.g., coat the material with a substance, wash the surface of the material, etc., between successive treatments. Plasma treatment of a composite material may effect several changes. For example, a composite material comprising a polymer and a plurality of carbon fibrils dispersed therein can be exposed to plasma. Exposure to plasma may etch the polymer and expose carbon fibrils at the surface of the composite, thus increasing the surface area of exposed carbon fibrils, e.g., so that the surface area of the exposed fibrils is greater than the geometric surface area of the composite. Exposure to plasma may introduce chemical functional groups on the fibrils or the polymer.

Chemical treatment can be also used. Acid treatments, particularly severe acids treatments, result in cutting the lengths of nanotubes, sharpening the ends of nanotubes, creating defects on the surface of nanotubes and introducing functional groups on the surface of nanotubes. Acid treated nanotubes are water dispersible, so chemical treatment offers advantages for the formation of nanotube film electrodes. Functional groups can be mostly removed by thermal treatment. The process for doing this is disclosed in U.S. Pat. No. 6,203,814.

In metal vapor treatment procedures metal atoms can be introduced into nanotube films by heating films under vapor of a metal. For example, Cs atoms, which have been shown to enhance field emission, can be introduced into a nanotube film by placing the film in a vacuum chamber which has a Cs source held at 200 C. above (Vapor pressure of Cs at 373 C. is 10 mm Hg).

Chemical vapor transport methods can be used. Most metals vaporize at very high temperature. Metal atoms of these metals, such as Ga, can be introduced into nanotube films by chemical vapor transport. Chemical sorption followed by heat treatment can be used. Metal atoms can be introduced into nanotube films by first absorbing a metal compound like metal halides or organometallic compounds on the surface of the nanotube films, followed by heating then under inert gas atmosphere to convert metal halides or organometallic compounds to metal atoms. Functionalization of nanotubes by chemical sorption can be used, some molecules, like metal phthalocyanines may have the effect of lowing work function of nanotubes and lead to an enhancement of field emission when absorbed on the surface of nanotubes. Absorption can be carried out by placing a nanotube film electrode in a phthalocyanine, porphyrin or metalloporphyrin solution; this procedure is disclosed in U.S. Pat. No. 6,203,814. The functionalization is carried out by phthalocyanines, metalloporphyrins, porphyrins or other organometallics. The treatment can also include annealing the film after functionalization. The annealing temperature can be carried out between 200 and 900 degrees Celsius in inert gas or under 360 degrees Celsius in air.

Ion Bombardment of CNT Films using energetic beams/sources, including atomic beams, electron beams, neutron beams, molecular beams, lasers, plasmas, UV light, x-ray and gamma rays can be used to treat nanotube films instead of ion bombardment. Mechanical treatment resulting in mechanical disruption, for example, ball milling can be used.

Other characteristics of CNTs can be modified by the above treatments. For example, the treatments can remove surface oxygen, remove insulating oxidation residues, generate edges, points, and singularities, recrystallize the tubes, generate non-tube carbon nanoparticles. A treatment can also be used to clean the CNTs, for example cleaning to remove the insulation coating generated by oxidation and cleaning to remove oxygen.

In other embodiments, CNTs prepared through the catalytic decomposition of various carbon-containing gases at metal surfaces, by high temperature carbon arc processes, can be used. Solid carbon is used as the carbon feed stock and is processed using simultaneous laser vaporization of graphite rods and a transition metal, as discussed in Tennent, U.S. Pat. Nos. 4,663,230, 5,165,909 and 5,171,560, the contents of which are incorporated by reference.

In a screen printing method, a dispersion of a CNT structure in a binder material (such as an epoxy resin or an acrylic resin or an inorganic binder material such as water glass) is applied onto a desired region of the cathode electrode and the binder material is fired or cured. The solvent is removed and the binder material is fired and cured). Alternatively, a dispersion of the CNT structure in a metal compound solution is applied onto the cathode electrode and then, the metal compound is fired, whereby the CNT structure is fixed to the surface of the cathode electrode with a matrix containing metal atoms constituting the metal compound. The matrix can be an electrically conductive metal oxide such as tin oxide, indium oxide, indium-tin oxide, zinc oxide, antimony oxide or antimony-tin oxide. After the firing, there can be obtained a state where part of each nano-tube structure is embedded in the matrix, or there can be obtained a state where the entire portion of each CNT is embedded in the matrix. The metal compound includes, for example, an organometal compound, an organic acid metal compound and metal salts (for example, chloride, nitrate and acetate). The organic acid metal compound solution is, for example, a solution prepared by dissolving an organic tin compound, an organic indium compound, an organic zinc compound or an organic antimony compound in an acid (for example, hydrochloric acid, nitric acid or sulfuric acid) and diluting the resultant solution with an organic solvent (for example, toluene, butyl acetate or isopropyl alcohol). Further, the organic metal compound solution is, for example, a solution prepared by dissolving an organic tin compound, an organic indium compound, an organic zinc compound or an organic antimony compound in an organic solvent (for example, toluene, butyl acetate or isopropyl alcohol). The CNT can be applied using a spray method, a spin coating method, a dipping method, a die quarter method and a screen printing method.

In one embodiment, the CNT structure dispersed compound or solution is applied onto the cathode electrode, the metal compound solution is dried to form a metal compound layer, then the excess metal compound layer on the cathode electrode is removed, and then the metal compound is fired. Alternatively, an unnecessary portion of the metal compound layer on the cathode electrode may be removed after the metal compound is fired. Alternatively, the metal compound solution may be applied only onto a desired region of the cathode electrode.

An activation treatment (washing treatment) of the surface of the semiconductor structure such as the transistor or the electron-emitting portion for FEDs can be done to improve efficacy. The activation treatment includes a plasma treatment in an atmosphere containing a gas such as hydrogen gas, ammonia gas, helium gas, argon gas, neon gas, methane gas, ethylene gas, acetylene gas or nitrogen gas.

In one CAD embodiment, protein engineering tools such as Rosetta, available at http://boinc.bakerlab.org/rosetta/ can be used to design the protein structure for the viruses. Proteins are linear polymer molecules made up of amino acid monomers and are often refered to as "chains.". Amino acids can be considered as the "links" in a protein "chain". Proteins are made of different amino acids that each have their own unique properties (different shapes, and attractive and repulsive forces, for example), and in combination, the amino acids exert forces on the chain to make it take on a specific shape or "fold." The order in which the amino acids are linked determines the protein's fold. There are many kinds of proteins that vary in the number and order of their amino acids. To predict the shape that a particular protein adopts, the fold with the lowest energy is determined. The energy is determined by a number of factors. For example, some amino acids are attracted to each other so when they are close in space, their interaction provides a favorable contribution to the energy. In one implementation, low energy shapes can be determined by:

1. Start with a fully unfolded chain.
2. Move a part of the chain to create a new shape.
3. Calculate the energy of the new shape.
4. Accept or reject the move depending on the change in energy.
5. Repeat 2 through 4 until error is less than a threshold.

The process may have two stages. The first stage uses a simplified representation of amino acids to minimize computational cost. This stage is regarded as a low resolution search. In the second stage, a full representation of amino acids is used. The second stage takes longer because of the increased complexity when considering the full representation (all atoms) of amino acids. The system can create new proteins with arbitrarily chosen three-dimensional structures that bind to specific semiconductor materials such as gold, aluminum, copper, silicon, among others. The protein structures can incorporate full backbone flexibility into rotamer-based sequence optimization by integrating ab initio protein structure prediction, atomic-level energy refinement, and sequence design.

In one embodiment, the system can be used to design the filamentous M13 virus, among other viruses, to self assemble electronic structures. Peptides can be selected with binding specificity using a computer aided design. The peptides, each containing 12 amino acids, are designed to be fused to the pIII coat protein of M13 coliphage and to bind to crystalline semiconductor structures. The user selects a designed or predetermined protein structure and the system pieces together string of amino acids most likely to link up to create the new protein. The user makes the protein, using identified amino acids and compares the new protein with the design to ensure that the manufactured protein matches the desired structure. This may be done using an existing protein sequence which is then broken into small chunks of amino acid sequences. The system searches for all different shapes each amino acid "chunk" could assume. The system mixes and matches shapes until a fit is found. In this manner, peptides are selected with high binding specificity depending on the crystallographic structure and composition of the semiconductor material. The peptides can have a binding specificity for not just semiconductor materials, but a range of both organic and inorganic materials. The CAD user can specify viral length and geometry. The length of a filamentous virus is generally related to the size of its packaged genetic information and the electrostatic balance between the pVIII-derived core of the virion and the DNA. Specific linkage, binding, and concatenation of virus particles can help produce longer viral scaffolds, and thus longer wires. The multiplicity of additions can be controlled by engineering binding motifs into one virus, which then can accurately recognize binding sites on another virus. As described earlier, the pIII protein resides at one end of the M13 virus and can be exploited to display peptide and protein fusions. At the other end of the virus, the pIX protein also can be subject to modification. For example, pIX and pVII fusions are used to display antibody heavy- and light-chain variable regions. Viral end linkages may have the same or different binding and/or nucleating specificity. In addition, the virus particles may display binding and/or nucleating motifs in addition to the end regions, such as an amino acid oligomer binding motifs displayed on pVIII. For example, the pIII and pIX regions may be functionalized to bind and/or nucleate one composition, and pVIII may be functionalized to bind to a different composition. The binding of one end of a virus directly to the other end of the virus without the use of a linker can be used to form rings, wires, or other viral based structures as well. By engineering recognition sites and the corresponding conjugate moieties into a single virus, or multiple viruses, the entire system can be genetically programmed. The CAD system uses models for viruses that can recognize and bind to materials.

In other embodiments, the biopanning approach discussed above can be used to engineer viruses and subsequently characterize the viral transistors for large scale integration of these viral transistors into a ULSI device.

Once the viral templated transistor is characterized, the system obtains a baseline configuration of each device. For example, the baseline circuit configuration for each type of memory device, i.e., a DRAM, SRAM, ROM, among others, can be determined from which the user may request in the future and prior to providing such memory devices to the user. An initial viral-templated transistor level circuit design of the complete baseline configuration is generated for all circuit blocks comprising a particular memory architecture (DRAM, SRAM, ROM, etc.). The baseline configuration may or, not be a configuration that is utilized in the future but is utilized to set the initial relationship between all the circuitry blocks defining a particular memory architecture.

Once the baseline designs are characterized, computer aided design (CAD) tools can be used to design large integration IC devices. In one embodiment, the nano devices form a fundamental basic logic element called a "tile" or a "module." This tile contains the nano-electronics array, a small amount of combinatorial logic and—depending on the particular architecture—it may also contain registers, buffer drivers. An array ("sea") of these tiles is then prefabricated across the face of the chip. The chip can contain additional prefabricated elements, which may include configurable general-purpose I/O blocks, microprocessor cores, embedded (block) RAM or ROM, cache memory, programmable logic arrays (PLAs), amplifiers, operational amplifiers, differential amplifiers, filters, integrators, phase-locked loops (PLLs), for example.

In one embodiment, the CAD system provides RLC calculations for bundled carbon-nanotube interconnects, which is geared for long, global interconnects. The system also provides statistical analysis of nano structure formation, prediction and optimization, defect calculation, location and mapping, allowing designs to be customized around defects. The system also generates online error detection to catch defects and transient errors that occur during operation.

In one embodiment, a PLA compiler is used to automatically generate a nanoPLA. The nanoPLA can be built from a crossed set of N-type and P-type nanowires. Viral templates are used to build the crossed N and P type nanowires. Alternatively, the nanowires are assembled into crossed arrays using flow alignment and/or Langmuir-Blodgett techniques. Electrically switchable, diode crosspoints provide a programmable wired-or plane which can be used to configure arbitrary logic into the PLA and avoid defective nanowires. The output of the or plane becomes the input of a restoration plane which is realized by field-effect control of nanowire conduction. The restoration plane can buffer or invert the input. The resulting logic can be clocked using the precharge and enable field-effect control on the nanowires. The restored outputs from the internal inversion plane become inputs to a second, programmable crosspoint region. Physically, this region is the same as the input plane. Each nanowire in this plane computes the wired or of one or more of the restored pterms computed by the input plane. The outputs of this plane are then restored in the same way as the internal restoration plane. Two restoration arrays can be ysed. One provides the buffered (non-inverted) sense of the or output and the second provides the inverted sense to provide both polarities of each output to be provided to the succeeding input planes. Taken together, the two planes provide nor-nor logic. This is logically equivalent to an or-and arrangement. With the selective inversion on the outputs, DeMorgan's equivalents can be used to view the circuit as a conventional and-or PLA. One set of outputs from each nanoPLA block feeds back to its own input region.

In a nano-memory CAD embodiment, a compiler is used to design circuits such as a custom viral templated memory device. As discussed above, the initial step in the compiler is the obtain a baseline configuration of each memory architecture for each type of memory device, i.e., a DRAM, SRAM, ROM, among others, from which the user may request in the future and prior to providing such memory devices to the user. An initial viral-templated transistor level circuit design of the complete baseline configuration is generated for all circuit blocks comprising a particular memory architecture (DRAM, SRAM, ROM, etc.). The baseline configuration may or, not be a configuration that is utilized in the future but is utilized to set the initial relationship between all the circuitry blocks defining a particular memory architecture. The memory cell of the baseline configuration of the particular memory architecture is specified to establish the memory cell array of memory cells. Next, peripheral circuitry that interfaces directly to the memory array is designed such as decoders, sense amplifiers, and data drivers and so forth, i.e., all of the separate circuit modules or blocks, necessary to drive into and out of the memory array. Next, additional peripheral circuitry blocks such as address buffers, clock drivers, I/O devices and so forth are designed. As the memory cell is configured into an array of rows and columns, set by the baseline configuration, the capacitance loads of each of the separate module's circuitry at each array node are calculated. Once all circuit modules for the baseline configuration have been designed, a complete transistor level circuit design can be made. Next, using standard computer aided design (CAD) layout software tools, a complete physical layout of each circuit module or block is made. From the physical layouts of each circuit module, X-Y coordinates are assigned to critical features of the device layouts such as transistor locations, metal line centerlines, and contact placements. Design rules are attached to these landmark definitions to insure that as fabrication processes change, or as device sizes change, process rule violations will not occur. Once all of the circuit modules for the baseline configuration have been designed, laid out and X-Y coordinates made, the next step writes into code, e.g., using (C+) programming code, the description of the physical layout and landmarks. Computer coded file is obtained for all of the physical description of the baseline configuration. The computer coded file handles defining transistor sizing—whenever any compilation is invoked, the process calculates anew all transistor sizes for the memory architecture being designed. Each module load cell is redefined and is multiplied by the number of loads. The process defines the physical placement of the metal lines, transistors, via connections, input and output locations and so forth. This corresponds to a section of code wherein all of the landmark values are declared in relationship to one another. A transistor level definition is generated in code of each circuit module. The code can also extract key capacitances from each circuit module that will be critical in determining the sizes of the buffers stages of any other peripheral modules that will be driving the input nodes of the aforementioned circuit modules. Once the initial design, layout and program coding steps have been written and tested, and once all electrical schematic and physical layout verification routines have been run to verify the functionality of the code, the next step of characterization from which mathematical equations will be derived is done to explain key parameters and properties of the viral-templated memory array. In one embodiment, the system genetically engineers a virus having a plurality of selective binding sites and forms a viral biotemplate by immersing the virus in a solution with capacitive or magnetic nano materials coupleable to the binding sites of the viruses to form a memory device. Similarly, the viruses can form a solar cell or a display. The nano materials can be nanocrystals that are annealed. The biotemplates correspond to a programmable logic array, a data storage array, a display, a light emitting array, a light sensor array, a processor, a memory array, a solar cell, an energy producing array, an energy storage array, a battery, an amplifier, an operational amplifier, a differential amplifier, a wireless power amplifier, or a wireless low noise amplifier. The system supports designing circuits using computer-aided-design (CAD) to generate an array of memory devices, a resistor, a capacitor, an inductor, a diode, a triode, a programmable logic array. The system can work with third party intellectual property cell designs. The system can model performance of electronic devices using the virus biotemplates. A personal area network can be generated for linking a plurality of electronic devices on a person.

In yet other embodiments, the virus can be engineered to produce human compatible electronic circuits that can be embedded inside the human body without rejection from the body. A virus is engineered to inject DNA materials into a host cell. The virus is injected near the region of interest, and self-assembles to build a drug manufacturing cell or a medical device to regulate the body.

In one embodiment, the virus assembles an insulin production system that treats diabetes, a set of related diseases in which the body cannot regulate the amount of sugar (glucose) in the blood. In a healthy person, the blood glucose level is regulated by several hormones, one of which is insulin. Insulin is produced by the pancreas, a small organ near the stomach that also secretes important enzymes that help in the digestion of food. Insulin allows glucose to move from the blood into liver, muscle, and fat cells, where it is used for fuel. In diabetes, glucose in the blood cannot move into cells, and it stays in the blood. This not only harms the cells that need the glucose for fuel, but also harms certain organs and tissues exposed to the high glucose levels. In Type 1 diabetes, the body stops producing insulin or produces too little insulin to regulate blood glucose level. People with type 1 diabetes generally require daily insulin treatment to sustain life. In Type 2 diabetes, the pancreas secretes insulin, but the body is partially or completely unable to use the insulin. The insulin production system includes insulin sensors to operate in a closed-loop to maintain a predetermined insulin level in the body.

In another embodiment, the virus is injected near the heart to build a pacemaker that supplements the pacing done by the human heart pacing cells. In other embodiments, the virus forms a cardioverter defibrillator (ICD) which can operate based on a heart-rate threshold, heart rate derivatives (rate of change, stability of fast rate duration), and tier-therapy (pacing, low energy cardioversion, and defibrillation), as well as ventricular tachycardia (VT) and ventricular fibrillation (VF) zones as therapeutic choices. Arrhythmia detection and correction devices can be formed by the viruses as well.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. A method to fabricate an electronic device on a substrate, comprising:
    genetically engineering first, second, third, and fourth viruses each having a plurality of selective binding sites;
    forming first, second, third, and fourth viral biotemplates by immersing the first, second, third, and fourth viruses in one or more solutions with nano materials coupleable to the binding sites of the viruses;
    self-assembling a gate with the first viral biotemplate having one site attachable to the substrate;
    self-assembling a source above the gate with the second viral biotemplate;
    self-assembling a channel with the third viral biotemplate having one site attachable to the second viral biotemplate; and
    self-assembling a drain with the fourth viral biotemplate having one site attachable to the third viral biotemplate.

2. The method of claim 1, comprising applying heat to the virus.

3. The method of claim 1, comprising opening one end of the biotemplate.

4. The method of claim 1, wherein the nano material comprises a carbon nanotube.

5. The method of claim 1, comprising forming a field emission device for one of: x-ray imaging, lighting, field emission display, microwave amplification, electron-beam lithography.

6. The method of claim 1, comprising
    genetically engineering a fifth virus having a plurality of selective binding sites;
    forming a fifth viral biotemplate by immersing the fifth virus in a solution with capacitive or magnetic nano materials coupleable to the binding sites of the viruses to form a memory device.

7. The method of claim 1, comprising:
    genetically engineering a fifth virus having a plurality of selective binding sites;
    forming a fifth viral biotemplate by immersing the fifth virus in a solution with light receiving nano materials coupleable to the binding sites of the viruses to form a solar cell.

8. The method of claim 1, comprising:
    genetically engineering a fifth virus having a plurality of selective binding sites;
    forming a fifth viral biotemplate by immersing the fifth virus in a solution with light emitting nano materials coupleable to the binding sites of the viruses to form a display.

9. The method of claim 1, wherein the biotemplate corresponds to one of: a programmable logic array, a data storage array, a display, a light emitting array, a light sensor array, a processor, a memory array, a solar cell, an energy producing array, an energy storage array, a battery, an amplifier, an operational amplifier, a differential amplifier, a wireless power amplifier, a wireless low noise amplifier.

10. The method of claim 1, comprising designing circuits using computer-aided-design (CAD).

11. The method of claim 10, comprising generating an array of memory devices.

12. The method of claim 10, comprising generating one of: a resistor, a capacitor, an inductor, a diode, a triode.

13. The method of claim 10, comprising generating a programmable logic array.

14. The method of claim 10, comprising using a third party intellectual property cell design.

15. The method of claim 10, comprising modeling performance of electronic devices using the virus biotemplate.

16. The method of claim 1, comprising providing a personal area network linking a plurality of electronic devices on a person.

17. The method of claim 1, wherein the electronic device comprises a human organ compatible device.

18. The method of claim 1, wherein the electronic device comprises an insulin production system.

19. The method of claim 1, wherein the electronic device comprises a pacemaker.

20. A method to fabricate an electronic device on a substrate, comprising:
    genetically engineering first, second, third, fourth and fifth viruses each having a plurality of selective binding sites;
    forming first, second, third, fourth and fifth viral biotemplates by immersing the first, second, third, fourth and fifth viruses in one or more solutions with nano materials coupleable to the binding sites of the viruses;
    self-assemble a source with the first viral biotemplate having one site attachable to the substrate;
    self-assemble a channel with the second viral biotemplate having one site attachable to the substrate and one site attacheable to the first viral biotemplate;
    self-assemble a drain with the third viral biotemplate having one site attachable to the substrate and one site attacheable to the second viral biotemplate;
    self-assemble an isolation layer above the first, second and third viral biotemplates with the fourth viral biotemplate; and
    self-assemble a gate with the fifth viral biotemplate having one site attachable to the isolation layer.

* * * * *